US012772726B2

(12) United States Patent
Yoshiyasu et al.

(10) Patent No.: US 12,772,726 B2
(45) Date of Patent: Oct. 20, 2026

(54) ORGANOMETALLIC COMPLEX, LIGHT-EMITTING DEVICE, LIGHT-EMITTING APPARATUS, ELECTRONIC DEVICE, AND LIGHTING DEVICE

(71) Applicant: SEMICONDUCTOR ENERGY LABORATORY CO., LTD., Atsugi (JP)

(72) Inventors: Yui Yoshiyasu, Atsugi (JP); Masatoshi Takabatake, Atsugi (JP); Hideko Yoshizumi, Atsugi (JP); Yuta Kawano, Yokohama (JP); Takeyoshi Watabe, Atsugi (JP); Satoshi Seo, Sagamihara (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 711 days.

(21) Appl. No.: 18/025,112

(22) PCT Filed: Aug. 30, 2021

(86) PCT No.: PCT/IB2021/057893
§ 371 (c)(1),
(2) Date: Mar. 7, 2023

(87) PCT Pub. No.: WO2022/053905
PCT Pub. Date: Mar. 17, 2022

(65) Prior Publication Data

US 2023/0329083 A1 Oct. 12, 2023

(30) Foreign Application Priority Data

Sep. 11, 2020 (JP) ................................ 2020-153299

(51) Int. Cl.

| | |
|---|---|
| ***H10K 85/30*** | (2023.01) |
| ***C07F 15/00*** | (2006.01) |
| ***C09K 11/06*** | (2006.01) |
| ***H10K 50/11*** | (2023.01) |

(52) U.S. Cl.
CPC ....... *H10K 85/342* (2023.02); *C07F 15/0033* (2013.01); *C09K 11/06* (2013.01); *C09K 2211/1044* (2013.01); *C09K 2211/185* (2013.01); *H10K 50/11* (2023.02)

(58) Field of Classification Search
CPC ... H10K 85/342; H10K 50/11; C07F 15/0033; C09K 11/06; C09K 2211/1044; C09K 2211/185
See application file for complete search history.

(56) References Cited

U.S. PATENT DOCUMENTS

| | | | |
|---|---|---|---|
| 8,101,755 | B2 | 1/2012 | Inoue et al. |
| 8,329,903 | B2 | 12/2012 | Inoue et al. |
| 8,999,520 | B2 | 4/2015 | Inoue et al. |
| 9,127,032 | B2 | 9/2015 | Inoue et al. |
| 9,534,006 | B2 | 1/2017 | Inoue et al. |
| 9,843,003 | B2 | 12/2017 | Inoue et al. |
| 9,960,371 | B2 | 5/2018 | Yamaguchi et al. |
| 10,103,341 | B2 | 10/2018 | Inoue et al. |
| 10,283,722 | B2 | 5/2019 | Yamaguchi et al. |

(Continued)

FOREIGN PATENT DOCUMENTS

| | | | |
|---|---|---|---|
| CN | 101270133 | A | 9/2008 |
| CN | 105418686 | A | 3/2016 |

(Continued)

OTHER PUBLICATIONS

International Search Report (Application No. PCT/IB2021/057893) Dated Nov. 2, 2021.

(Continued)

*Primary Examiner* — Alicia L Otton
(74) *Attorney, Agent, or Firm* — NIXON PEABODY LLP; Jeffrey L. Costellia

(57) ABSTRACT

A novel organometallic complex with high heat resistance is provided. The organometallic complex includes a structure represented by General Formula (G1) below, in which iridium and a ligand are included, the ligand includes a pyrazine skeleton, iridium is bonded to nitrogen at the 1-position of the pyrazine skeleton, an aryl group including a cyano group as a substituent is bonded at the 5-position of the pyrazine skeleton, and each of the 3-position and the 6-position of the pyrazine skeleton is independently bonded to any one of hydrogen, an alkyl group, and an alkoxy group.

(G1)

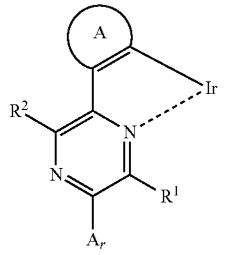

(In the formula, A represents a substituted or unsubstituted aromatic hydrocarbon group having 6 to 25 carbon atoms. In addition, $A_r$ represents an aryl group having 6 to 25 carbon atoms and at least one cyano group as a substituent. Each of $R^1$ and $R^2$ independently represents any one of hydrogen, an alkyl group having 1 to 6 carbon atoms, and an alkoxy group having 1 to 6 carbon atoms.)

17 Claims, 26 Drawing Sheets

(56) References Cited

U.S. PATENT DOCUMENTS

| | | | |
|---|---|---|---|
| 10,693,085 | B2 | 6/2020 | Inoue et al. |
| 10,998,509 | B2 | 5/2021 | Inoue et al. |
| 2007/0244320 | A1 | 10/2007 | Inoue et al. |
| 2010/0105902 | A1 | 4/2010 | Inoue et al. |
| 2013/0088144 | A1 | 4/2013 | Inoue et al. |
| 2013/0161598 | A1 | 6/2013 | Inoue et al. |
| 2014/0246656 | A1 | 9/2014 | Inoue et al. |
| 2016/0093817 | A1 | 3/2016 | Inoue et al. |
| 2016/0293863 | A1 | 10/2016 | Yamaguchi et al. |
| 2017/0092881 | A1 | 3/2017 | Yamaguchi et al. |
| 2017/0179409 | A1 | 6/2017 | Yamaguchi et al. |

FOREIGN PATENT DOCUMENTS

| | | | |
|---|---|---|---|
| CN | 106957338 | A | 7/2017 |
| CN | 108137632 | A | 6/2018 |
| EP | 1873163 | A | 1/2008 |
| EP | 2254173 | A | 11/2010 |
| JP | 2007-284432 | A | 11/2007 |
| JP | 2009-023938 | A | 2/2009 |
| JP | 2010-120931 | A | 6/2010 |
| JP | 2017-066135 | A | 4/2017 |
| JP | 2017-114853 | A | 6/2017 |
| KR | 2007-0095802 | A | 10/2007 |
| KR | 2018-0063152 | A | 6/2018 |
| TW | 200801025 | | 1/2008 |
| TW | 201726698 | | 8/2017 |
| WO | WO-2009/011447 | | 1/2009 |
| WO | WO-2017/055964 | | 4/2017 |

OTHER PUBLICATIONS

Written Opinion (Application No. PCT/IB2021/057893) Dated Nov. 2, 2021.

ORGANOMETALLIC COMPLEX, LIGHT-EMITTING DEVICE, LIGHT-EMITTING APPARATUS, ELECTRONIC DEVICE, AND LIGHTING DEVICE

TECHNICAL FIELD

One embodiment of the present invention relates to an organometallic complex. In particular, one embodiment of the present invention relates to an organometallic complex that can convert triplet excitation energy into light emission. Furthermore, one embodiment of the present invention relates to a light-emitting device, a light-emitting apparatus, an electronic device, and a lighting device each of which includes an organometallic complex. Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Thus, more specifically, examples of the technical field of one embodiment of the present invention disclosed in this specification include, in addition to the above, a semiconductor device, a display device, a liquid crystal display device, a power storage device, a memory device, a driving method thereof, and a manufacturing method thereof.

BACKGROUND ART

A light-emitting device including an organic compound that is a light-emitting substance between a pair of electrodes (also referred to as an organic EL element) has characteristics such as thinness, light weight, high-speed response, and low-voltage drive; thus, a display including such a light-emitting device has attracted attention as a next-generation flat panel display. When a voltage is applied to this light-emitting device, electrons and holes injected from the electrodes recombine to put the light-emitting substance into an excited state, and then light is emitted in returning from the excited state to the ground state. The excited state can be a singlet excited state (S*) and a triplet excited state (T*): light emission from a singlet excited state is referred to as fluorescence, and light emission from a triplet excited state is referred to as phosphorescence. The statistical generation ratio thereof in the light-emitting device is considered to be S*:T*=1:3.

Among the above light-emitting substances, a compound capable of converting singlet excitation energy into light emission is called a fluorescent compound (a fluorescent material), and a compound capable of converting triplet excitation energy into light emission is called a phosphorescent compound (a phosphorescent material).

Accordingly, on the basis of the above generation ratio, the theoretical limit of the internal quantum efficiency (the ratio of generated photons to injected carriers) of a light-emitting device using each of the above light-emitting substances is 25% in the case of using a fluorescent material and 100% in the case of using a phosphorescent material.

In other words, a light-emitting device using a phosphorescent material can obtain higher efficiency than a light-emitting device using a fluorescent material. Thus, various kinds of phosphorescent materials have been actively developed in recent years. An organometallic complex that contains iridium or the like as a central metal is particularly attracting attention because of its high phosphorescence quantum yield (e.g., Patent Document 1).

REFERENCE

Patent Document

[Patent Document 1] Japanese Published Patent Application No. 2009-23938

SUMMARY OF THE INVENTION

Problems to be Solved by the Invention

Although phosphorescent materials exhibiting excellent characteristics have been developed as disclosed in Patent Document 1, development of novel materials with better characteristics has been desired.

In view of the above, one embodiment of the present invention provides a novel organometallic complex. Another embodiment of the present invention provides a novel organometallic complex that exhibits excellent red light emission. Another embodiment of the present invention provides a novel organometallic complex having an emission spectrum with a narrow half width. Another embodiment of the present invention provides a novel light-emitting device having a long lifetime. Another embodiment of the present invention provides a novel organometallic complex that exhibits red light emission with a high quantum efficiency. Another embodiment of the present invention provides a novel organometallic complex that can be used in an EL layer of a light-emitting device. Another embodiment of the present invention provides a novel organometallic complex that can provide a light-emitting device with a high emission efficiency. Another embodiment of the present invention provides a novel organometallic complex that can provide a light-emitting device with high reliability. Another embodiment of the present invention provides a light-emitting device with a high emission efficiency. Another embodiment of the present invention provides a light-emitting device with high reliability. Another embodiment of the present invention provides a novel light-emitting apparatus, a novel electronic device, or a novel lighting device.

Means for Solving the Problems

One embodiment of the present invention is an organometallic complex including a structure represented by General Formula (G1) below, in which a ligand including a pyrazine skeleton is included; iridium is bonded to nitrogen at the 1-position of the pyrazine skeleton; each of the 3-position and the 6-position of the pyrazine skeleton independently includes any one of hydrogen, an alkyl group, and an alkoxy group; an aryl group including a cyano group as a substituent is bonded at the 5-position of the pyrazine skeleton; an aromatic hydrocarbon group is bonded at the 2-position of the pyrazine skeleton; and part of carbon included in the aromatic hydrocarbon group is bonded to iridium.

[Chemical Formula 1]

(G1)

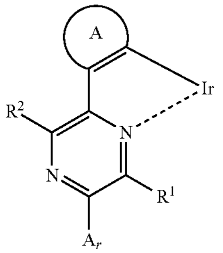

Note that in General Formula (G1), A represents a substituted or unsubstituted aromatic hydrocarbon group having 6 to 25 carbon atoms. In addition, $A_r$ represents an aryl group having 6 to 25 carbon atoms and at least one cyano group as a substituent. Each of $R^1$ and $R^2$ independently represents any one of hydrogen, an alkyl group having 1 to 6 carbon atoms, and an alkoxy group having 1 to 6 carbon atoms.

Another embodiment of the present invention is an organometallic complex including a structure represented by General Formula (G2) below.

[Chemical Formula 2]

(G2)

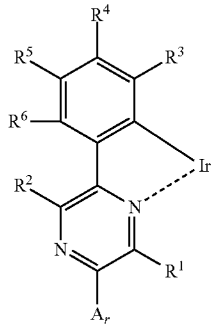

Note that in General Formula (G2), $A_r$ represents an aryl group having 6 to 25 carbon atoms and at least one cyano group as a substituent. Each of $R^1$ and $R^2$ independently represents any one of hydrogen, an alkyl group having 1 to 6 carbon atoms, and an alkoxy group having 1 to 6 carbon atoms. Each of $R^3$ to $R^6$ independently represents any one of hydrogen, an alkyl group having 1 to 6 carbon atoms, an alkoxy group having 1 to 6 carbon atoms, a substituted or unsubstituted aryl group having 6 to 12 carbon atoms, a halogen group, and a trifluoromethyl group.

Another embodiment of the present invention is an organometallic complex having a structure represented by General Formula (G3) below.

[Chemical Formula 3]

(G3)

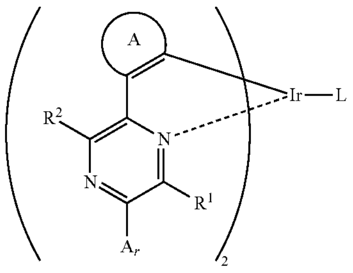

Note that in General Formula (G3), A represents a substituted or unsubstituted aromatic hydrocarbon group having 6 to 25 carbon atoms. In addition, $A_r$ represents an aryl group having 6 to 25 carbon atoms and at least one cyano group as a substituent. Each of $R^1$ and $R^2$ independently represents any one of hydrogen, an alkyl group having 1 to 6 carbon atoms, and an alkoxy group having 1 to 6 carbon atoms. Furthermore, L represents a monoanionic ligand.

Another embodiment of the present invention is an organometallic complex having a structure represented by General Formula (G4) below.

[Chemical Formula 4]

(G4)

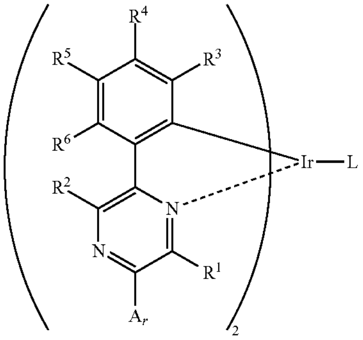

Note that in General Formula (G4), $A_r$ represents an aryl group having 6 to 25 carbon atoms and at least one cyano group as a substituent. Each of $R^1$ and $R^2$ independently represents any one of hydrogen, an alkyl group having 1 to 6 carbon atoms, and an alkoxy group having 1 to 6 carbon atoms. Each of $R^3$ to $R^6$ independently represents any one of hydrogen, an alkyl group having 1 to 6 carbon atoms, an alkoxy group having 1 to 6 carbon atoms, a substituted or unsubstituted aryl group having 6 to 12 carbon atoms, a halogen group, and a trifluoromethyl group. Furthermore, L represents a monoanionic ligand.

Note that in the organometallic complex having any of the above structures, the monoanionic ligand is preferably a monoanionic bidentate chelate ligand having a β-diketone structure, a monoanionic bidentate chelate ligand having a carboxyl group, a monoanionic bidentate chelate ligand having a phenolic hydroxyl group, a monoanionic bidentate chelate ligand in which two ligand elements are both nitrogen, or an aromatic heterocyclic bidentate ligand forming a metal-carbon bond with iridium by cyclometalation.

In each of the above structures, the monoanionic ligand is preferably any one of General Formulae (L1) to (L6) below.

[Chemical Formula 5]

(L1)

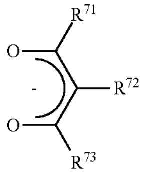

(L2)

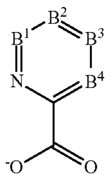

(L3)

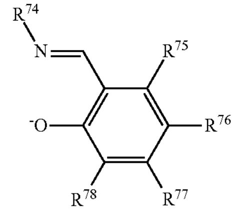

(L4)

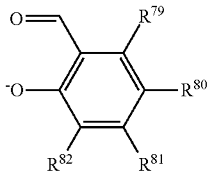

(L5)

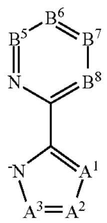

(L6)

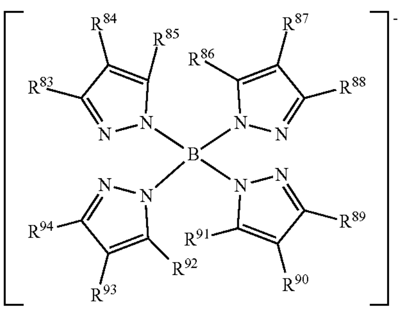

Note that in General Formulae (L1) to (L6) above, each of $R^{71}$ to $R^{94}$ independently represents any one of hydrogen, a substituted or unsubstituted alkyl group having 1 to 10 carbon atoms, a halogen group, a vinyl group, a substituted or unsubstituted haloalkyl group having 1 to 10 carbon atoms, a substituted or unsubstituted alkoxy group having 1 to 10 carbon atoms, and a substituted or unsubstituted alkylthio group having 1 to 10 carbon atoms. Each of $A^1$ to $A^3$ independently represents nitrogen, $sp^2$ hybridized carbon bonded to hydrogen, or $sp^2$ hybridized carbon having a substituent. The substituent is any one of an alkyl group having 1 to 10 carbon atoms, a halogen group, a haloalkyl group having 1 to 10 carbon atoms, and a phenyl group. Each of $B^1$ to $B^8$ independently represents nitrogen, $sp^2$ hybridized carbon bonded to hydrogen, or $sp^2$ hybridized carbon having a substituent. The substituent is any one of an alkyl group having 1 to 10 carbon atoms, a halogen group, a haloalkyl group having 1 to 10 carbon atoms, and a phenyl group.

Another embodiment of the present invention is an organometallic complex represented by General Formula (G5) below.

[Chemical Formula 6]

(G5)

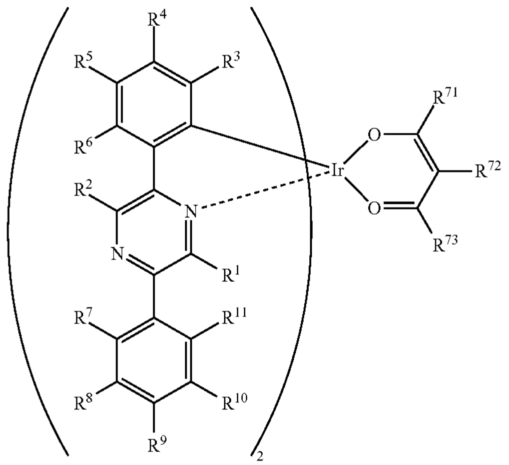

Note that in General Formula (G5), each of $R^1$ and $R^2$ independently represents any one of hydrogen, an alkyl group having 1 to 6 carbon atoms, and an alkoxy group having 1 to 6 carbon atoms. Each of $R^3$ to $R^6$ independently represents any one of hydrogen, an alkyl group having 1 to 6 carbon atoms, an alkoxy group having 1 to 6 carbon atoms, a substituted or unsubstituted aryl group having 6 to 12 carbon atoms, a halogen group, and a trifluoromethyl group. Each of $R^7$ to $R^{11}$ independently represents any of hydrogen, a substituted or unsubstituted alkyl group having 1 to 6 carbon atoms, a substituted or unsubstituted aryl group having 6 to 13 carbon atoms, a substituted or unsubstituted heteroaryl group having 3 to 12 carbon atoms, and a cyano group, and at least one of $R^7$ to $R^{11}$ represents a cyano group. Each of $R^{71}$ to $R^{73}$ independently represents any one of hydrogen, a substituted or unsubstituted alkyl group having 1 to 10 carbon atoms, a halogen group, a vinyl group, a substituted or unsubstituted haloalkyl group having 1 to 10 carbon atoms, a substituted or unsubstituted alkoxy group having 1 to 10 carbon atoms, and a substituted or unsubstituted alkylthio group having 1 to 10 carbon atoms.

Another embodiment of the present invention is an organometallic complex represented by General Formula (G6) below.

[Chemical Formula 7]

(G6)

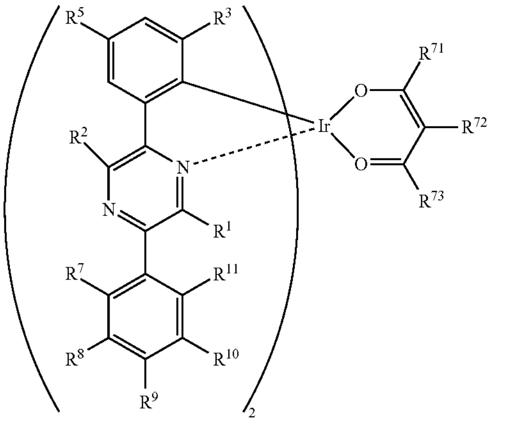

Note that in General Formula (G6), each of $R^1$ and $R^2$ independently represents any one of hydrogen, an alkyl group having 1 to 6 carbon atoms, and an alkoxy group having 1 to 6 carbon atoms. Each of $R^3$ and $R^5$ independently represents any one of hydrogen, an alkyl group having 1 to 6 carbon atoms, an alkoxy group having 1 to 6 carbon atoms, a substituted or unsubstituted aryl group having 6 to 12 carbon atoms, a halogen group, and a trifluoromethyl group. Each of $R^7$ to $R^{11}$ independently represents any of hydrogen, an alkyl group having 1 to 6 carbon atoms, a substituted or unsubstituted aryl group having 6 to 13 carbon atoms, a substituted or unsubstituted heteroaryl group having 3 to 12 carbon atoms, and a cyano group, and at least one of $R^7$ to $R^{11}$ represents a cyano group. Each of $R^{71}$ to $R^{73}$ independently represents any one of hydrogen, an alkyl group having 1 to 10 carbon atoms, a halogen group, a vinyl group, a haloalkyl group having 1 to 10 carbon atoms, an alkoxy group having 1 to 10 carbon atoms, and an alkylthio group having 1 to 10 carbon atoms.

Another embodiment of the present invention is an organometallic complex represented by General Formula (G7) below.

[Chemical Formula 8]

(G7)

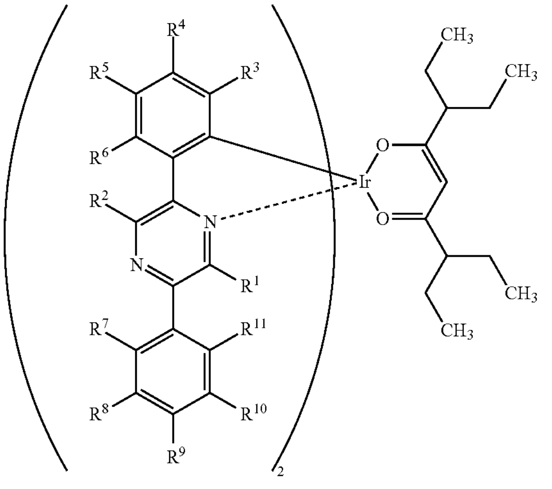

Note that in General Formula (G7), each of $R^1$ and $R^2$ independently represents any one of hydrogen, an alkyl group having 1 to 6 carbon atoms, and an alkoxy group having 1 to 6 carbon atoms. Each of $R^3$ to $R^6$ independently represents any one of hydrogen, an alkyl group having 1 to 6 carbon atoms, an alkoxy group having 1 to 6 carbon atoms, a substituted or unsubstituted aryl group having 6 to 12 carbon atoms, a halogen group, and a trifluoromethyl group. Each of $R^7$ to $R^{11}$ independently represents any of hydrogen, an alkyl group having 1 to 6 carbon atoms, a substituted or unsubstituted aryl group having 6 to 13 carbon atoms, a substituted or unsubstituted heteroaryl group having 3 to 12 carbon atoms, and a cyano group, and at least one of $R^7$ to $R^{11}$ represents a cyano group.

Another embodiment of the present invention is an organometallic complex represented by General Formula (G8) below.

[Chemical Formula 9]

(G8)

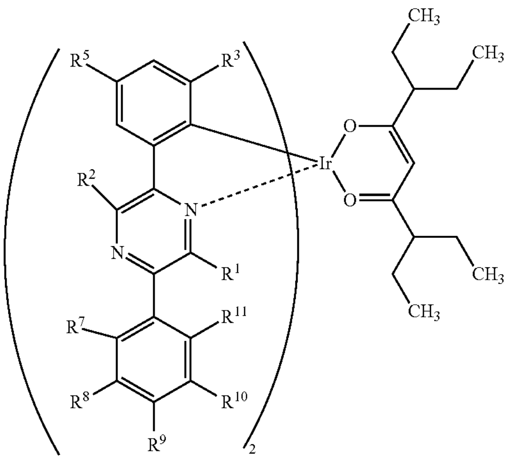

Note that in General Formula (G8), each of $R^1$ and $R^2$ independently represents any one of hydrogen, an alkyl group having 1 to 6 carbon atoms, and an alkoxy group having 1 to 6 carbon atoms. Each of $R^3$ and $R^5$ independently represents any one of hydrogen, an alkyl group having 1 to 6 carbon atoms, an alkoxy group having 1 to 6 carbon atoms, a substituted or unsubstituted aryl group having 6 to 12 carbon atoms, a halogen group, and a trifluoromethyl group. Each of $R^7$ to $R^{11}$ independently represents any of hydrogen, an alkyl group having 1 to 6 carbon atoms, a substituted or unsubstituted aryl group having 6 to 13 carbon atoms, a substituted or unsubstituted heteroaryl group having 3 to 12 carbon atoms, and a cyano group, and at least one of $R^7$ to $R^{11}$ represents a cyano group.

Another embodiment of the present invention is an organometallic complex represented by Structural Formula (100) or Structural Formula (101).

[Chemical Formula 10]

(100)

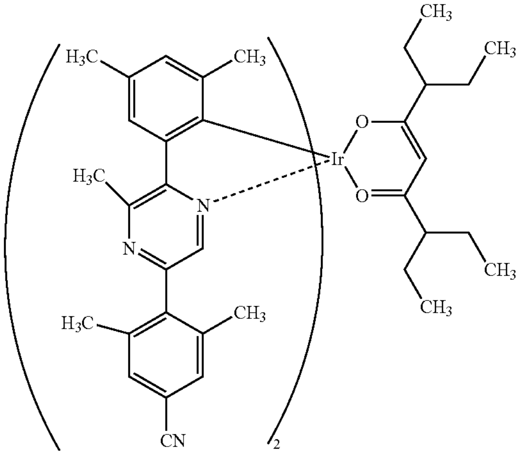

(101)

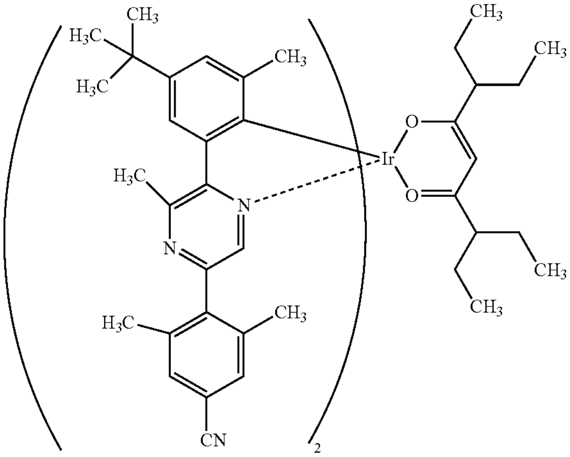

Another embodiment of the present invention is a light-emitting device using at least one of the above organometallic complexes. For example, the light-emitting device of one embodiment of the present invention includes an EL layer between a pair of electrodes, and the EL layer contains at least one of the above organometallic complexes. Moreover, the EL layer includes a light-emitting layer, and the light-emitting layer contains at least one of the above organometallic complexes, for example.

Another embodiment of the present invention is a light-emitting apparatus including the light-emitting device, and a transistor or a substrate.

Another embodiment of the present invention is an electronic device including the light-emitting apparatus, and a microphone, a camera, a button for operation, an external connection portion, or a speaker.

Another embodiment of the present invention is an electronic device including the light-emitting apparatus, and a housing or a touch sensor function.

Another embodiment of the present invention is a lighting device including the light-emitting apparatus, and a housing, a cover, or a support.

Effect of the Invention

One embodiment of the present invention can provide a novel organometallic complex. Another embodiment of the present invention can provide a novel organometallic complex that exhibits excellent red light emission. Another embodiment of the present invention can provide a novel organometallic complex having an emission spectrum with a narrow half width. Another embodiment of the present invention can provide a novel light-emitting device having a long lifetime. Another embodiment of the present invention can provide a novel organometallic complex that exhibits red light emission with a high quantum efficiency. Another embodiment of the present invention can provide a novel organometallic complex that can be used in an EL layer of a light-emitting device. Another embodiment of the present invention can provide a novel organometallic complex that can provide a light-emitting device with a high emission efficiency. Another embodiment of the present invention can provide a novel organometallic complex that can provide a light-emitting device with high reliability. Another embodiment of the present invention can provide a light-emitting device with a high emission efficiency. Another embodiment of the present invention can provide a light-emitting device with high reliability. Another embodiment of the present invention can provide a novel light-emitting apparatus, a novel electronic device, or a novel lighting device.

Note that the description of these effects does not preclude the existence of other effects. One embodiment of the present invention does not have to have all of these effects. Effects other than these will be apparent from the description of the specification, the drawings, the claims, and the like and effects other than these can be derived from the description of the specification, the drawings, the claims, and the like.

BRIEF DESCRIPTION OF THE DRAWINGS

FIG. 7A, FIG. 7B1, FIG. 7B2, and FIG. 7C are diagrams illustrating electronic devices.

MODE FOR CARRYING OUT THE INVENTION

Figure 1A:
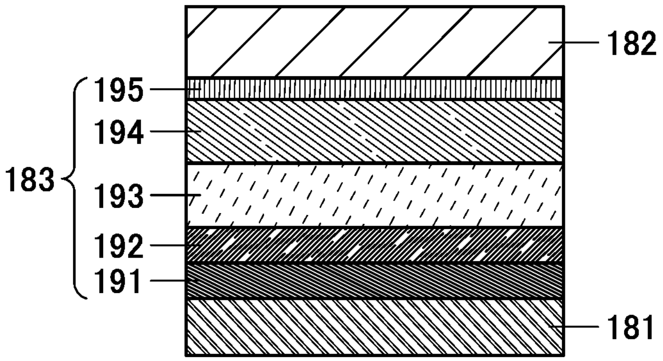
FIG. 1A, FIG. 1B, and FIG. 1C are schematic diagrams of light-emitting devices.

Embodiments of the present invention will be described in detail below with reference to the drawings. Note that the present invention is not limited to the following description, and the modes and details of the present invention can be modified in various ways without departing from the spirit and scope of the present invention. Therefore, the present invention should not be construed as being limited to the description in the following embodiments.

Note that the term “film” and the term “layer” can be interchanged with each other depending on the case or circumstances. For example, the term “conductive layer” can be changed into the term “conductive film” in some cases. As another example, the term “insulating film” can be changed into the term “insulating layer” in some cases.

Embodiment 1

In this embodiment, an organometallic complex of one embodiment of the present invention will be described.

An organometallic complex described in this embodiment is an organometallic complex in which iridium that is a central metal and a ligand including a pyrazine skeleton are included; iridium is bonded to nitrogen at the 1-position of the pyrazine skeleton; each of the 3-position and the 6-position of the pyrazine skeleton independently includes any one of hydrogen, an alkyl group, and an alkoxy group; an aryl group including a cyano group as a substituent is bonded at the 5-position of the pyrazine skeleton; an aromatic hydrocarbon group is bonded at the 2-position of the pyrazine skeleton; and part of carbon included in the aromatic hydrocarbon group is bonded to iridium.

Furthermore, an organometallic complex described in this embodiment is an organometallic complex in which a first ligand and a second ligand which are bonded to iridium that is a central metal are included; the first ligand includes a pyrazine skeleton; iridium is bonded to nitrogen at the 1-position of the pyrazine skeleton; each of the 3-position and the 6-position of the pyrazine skeleton independently includes any one of hydrogen, an alkyl group, and an alkoxy group; an aryl group including a cyano group as a substituent is bonded at the 5-position of the pyrazine skeleton; an aromatic hydrocarbon group is bonded at the 2-position of the pyrazine skeleton; part of carbon included in the aromatic hydrocarbon group is bonded to iridium; and the second ligand is a monoanionic ligand.

In particular, in the organometallic complex, the second ligand is a monoanionic bidentate chelate ligand having a β-diketone structure, a monoanionic bidentate chelate ligand having a carboxyl group, a monoanionic bidentate chelate ligand having a phenolic hydroxyl group, a monoanionic bidentate chelate ligand in which two ligand elements are both nitrogen, or an aromatic heterocyclic bidentate ligand that can form a metal-carbon bond with iridium by cyclometalation.

In the organometallic complex of one embodiment of the present invention, each of the 3-position and the 6-position of the pyrazine skeleton is independently bonded to any one of hydrogen, an alkyl group, and an alkoxy group, and an aryl group including a cyano group as a substituent is bonded at the 5-position of the pyrazine skeleton.

When a cyano group is included as the substituent of the aryl group bonded at the 5-position of the pyrazine skeleton, decomposition resistance at the time of sublimation is improved. On the other hand, the emission wavelength is likely to be shifted to the long-wavelength side when a cyano group is included, and in particular, when a pyrazine skeleton is included, the emission color is likely to be deep red. An emission color of deep red is likely to result in a low current efficiency. Thus, each of the 3-position and the 6-position of the pyrazine skeleton is independently provided with any one of hydrogen, an alkyl group, and an alkoxy group as a substituent.

When each of the 3-position and the 6-position of the pyrazine skeleton is independently provided with any one of hydrogen, an alkyl group, and an alkoxy group as a substituent, the emission wavelength is shifted to the short-wavelength side as compared to the case where at least one of the 3-position and the 6-position of the pyrazine skeleton is provided with an aryl group. Thus, light emission on the long-wavelength side with a poor luminosity factor is reduced, and the current efficiency can be increased. In addition, the sublimation temperature becomes low as compared to the case where at least one of the 3-position and the 6-position of the pyrazine skeleton includes an aryl group.

Accordingly, the organometallic complex of one embodiment of the present invention is characterized in that each of the 3-position and the 6-position of the pyrazine skeleton is independently bonded to any one of hydrogen, an alkyl group, and an alkoxy group, and the aryl group bonded at the 5-position of the pyrazine skeleton includes a cyano group as a substituent.

The organometallic complex described in this embodiment is an organometallic complex including a structure represented by General Formula (G1) below.

[Chemical Formula 11]

(G1)

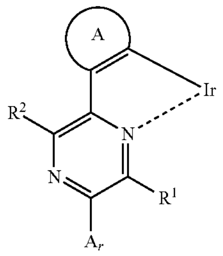

Note that in General Formula (G1), A represents a substituted or unsubstituted aromatic hydrocarbon group having 6 to 25 carbon atoms. In addition, $A_r$ represents an aryl group having 6 to 25 carbon atoms and at least one cyano group as a substituent. Each of $R^1$ and $R^2$ independently represents any one of hydrogen, an alkyl group having 1 to 6 carbon atoms, and an alkoxy group having 1 to 6 carbon atoms.

The organometallic complex described in this embodiment is an organometallic complex including a structure represented by General Formula (G2) below.

[Chemical Formula 12]

(G2)

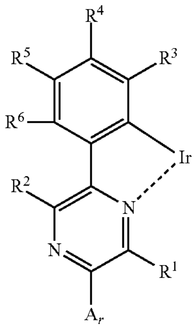

Note that in General Formula (G2), $A_r$ represents an aryl group having 6 to 25 carbon atoms and at least one cyano group as a substituent. Each of $R^1$ and $R^2$ independently represents any one of hydrogen, an alkyl group having 1 to 6 carbon atoms, and an alkoxy group having 1 to 6 carbon atoms. Each of $R^3$ to $R^6$ independently represents any one of hydrogen, an alkyl group having 1 to 6 carbon atoms, an alkoxy group having 1 to 6 carbon atoms, a substituted or unsubstituted aryl group having 6 to 12 carbon atoms, a halogen group, and a trifluoromethyl group.

The organometallic complex described in this embodiment is an organometallic complex having a structure represented by General Formula (G3) below.

[Chemical Formula 13]

(G3)

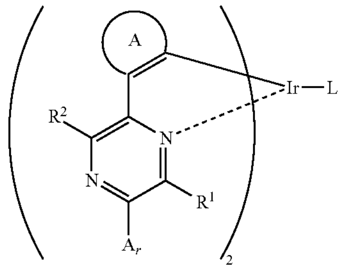

Note that in General Formula (G3), A represents a substituted or unsubstituted aromatic hydrocarbon group having 6 to 25 carbon atoms. In addition, $A_r$ represents an aryl group having 6 to 25 carbon atoms and at least one cyano group as a substituent. Each of $R^1$ and $R^2$ independently represents any one of hydrogen, an alkyl group having 1 to 6 carbon atoms, and an alkoxy group having 1 to 6 carbon atoms. Furthermore, L represents a monoanionic ligand.

The organometallic complex described in this embodiment is an organometallic complex having a structure represented by General Formula (G4) below.

[Chemical Formula 14]

(G4)

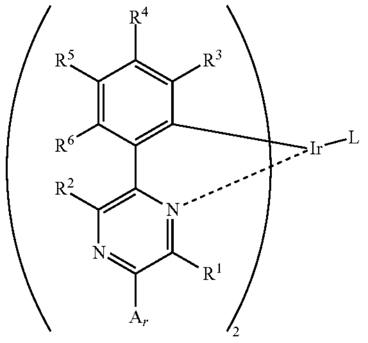

Note that in General Formula (G4), $A_r$ represents an aryl group having 6 to 25 carbon atoms and at least one cyano group as a substituent. Each of $R^1$ and $R^2$ independently represents any one of hydrogen, an alkyl group having 1 to 6 carbon atoms, and an alkoxy group having 1 to 6 carbon atoms. Each of $R^3$ to $R^6$ independently represents any one of hydrogen, an alkyl group having 1 to 6 carbon atoms, an alkoxy group having 1 to 6 carbon atoms, a substituted or unsubstituted aryl group having 6 to 12 carbon atoms, a halogen group, and a trifluoromethyl group. Furthermore, L represents a monoanionic ligand.

Note that examples of the monoanionic ligand in any of the above structures include a monoanionic bidentate chelate ligand having a β-diketone structure, a monoanionic bidentate chelate ligand having a carboxyl group, a monoanionic bidentate chelate ligand having a phenolic hydroxyl group, a monoanionic bidentate chelate ligand in which two ligand elements are both nitrogen, and an aromatic heterocyclic bidentate ligand forming a metal-carbon bond with iridium by cyclometalation.

The monoanionic ligand is represented by any one of General Formulae (L1) to (L6) below.

[Chemical Formula 15]

(L1)

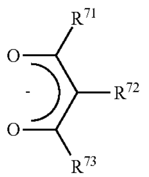

(L2)

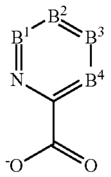

(L3)

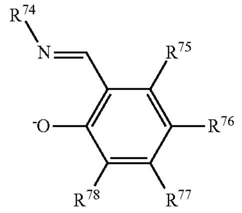

(L4)

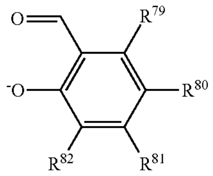

(L5)

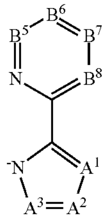

(L6)

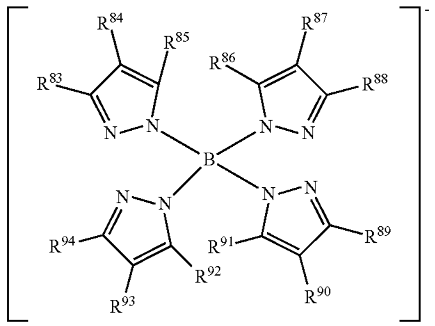

Note that in General Formulae (L 1) to (L6), each of $R^{71}$ to $R^{94}$ independently represents hydrogen, a substituted or unsubstituted alkyl group having 1 to 10 carbon atoms, a halogen group, a vinyl group, a substituted or unsubstituted haloalkyl group having 1 to 10 carbon atoms, a substituted or unsubstituted alkoxy group having 1 to 10 carbon atoms, or a substituted or unsubstituted alkylthio group having 1 to 10 carbon atoms. Each of $A^1$ to $A^3$ independently represents nitrogen, $sp^2$ hybridized carbon bonded to hydrogen, or $sp^2$ hybridized carbon having a substituent. The substituent is an alkyl group having 1 to 6 carbon atoms, a halogen group, a haloalkyl group having 1 to 6 carbon atoms, or a phenyl group. Each of $B^1$ to $B^8$ independently represents nitrogen, $sp^2$ hybridized carbon bonded to hydrogen, or $sp^2$ hybridized carbon having a substituent. The substituent is any one of an alkyl group having 1 to 6 carbon atoms, a halogen group, a haloalkyl group having 1 to 6 carbon atoms, and a phenyl group.

The organometallic complex described in this embodiment is an organometallic complex represented by General Formula (G5) below.

[Chemical Formula 16]

(G5)

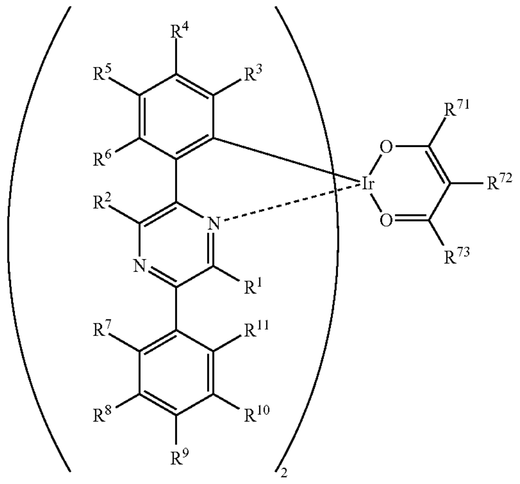

Note that in General Formula (G5), each of $R^1$ and $R^2$ independently represents any one of hydrogen, an alkyl group having 1 to 6 carbon atoms, and an alkoxy group having 1 to 6 carbon atoms. Each of $R^3$ to $R^6$ independently represents any one of hydrogen, an alkyl group having 1 to 6 carbon atoms, an alkoxy group having 1 to 6 carbon atoms, a substituted or unsubstituted aryl group having 6 to 12 carbon atoms, a halogen group, and a trifluoromethyl group. Each of $R^7$ to $R^{11}$ independently represents any of hydrogen, an alkyl group having 1 to 6 carbon atoms, a substituted or unsubstituted aryl group having 6 to 13 carbon atoms, a substituted or unsubstituted heteroaryl group having 3 to 12 carbon atoms, and a cyano group, and at least one of $R^7$ to $R^{11}$ represents a cyano group. Each of $R^{71}$ to $R^{73}$ independently represents any one of hydrogen, an alkyl group having 1 to 10 carbon atoms, a halogen group, a vinyl group, a haloalkyl group having 1 to 10 carbon atoms, an alkoxy group having 1 to 10 carbon atoms, and an alkylthio group having 1 to 10 carbon atoms.

The organometallic complex described in this embodiment is an organometallic complex represented by General Formula (G6) below.

[Chemical Formula 17]

(G6)

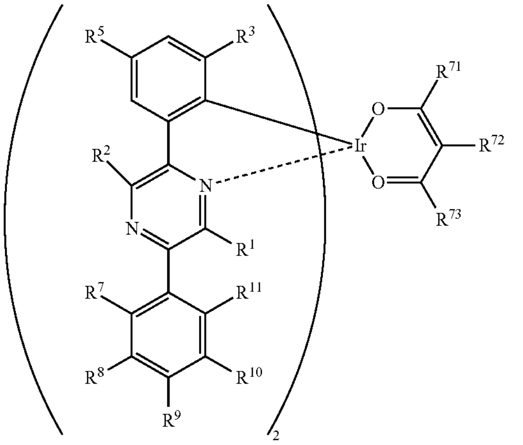

Note that in General Formula (G6), each of $R^1$ and $R^2$ independently represents any one of hydrogen, an alkyl group having 1 to 6 carbon atoms, and an alkoxy group having 1 to 6 carbon atoms. Each of $R^3$ and $R^5$ independently represents any one of hydrogen, an alkyl group having 1 to 6 carbon atoms, an alkoxy group having 1 to 6 carbon atoms, a substituted or unsubstituted aryl group having 6 to 12 carbon atoms, a halogen group, and a trifluoromethyl group. Each of $R^7$ to $R^{11}$ independently represents any of hydrogen, an alkyl group having 1 to 6 carbon atoms, a substituted or unsubstituted aryl group having 6 to 13 carbon atoms, a substituted or unsubstituted heteroaryl group having 3 to 12 carbon atoms, and a cyano group, and at least one of $R^7$ to $R^{11}$ represents a cyano group. Each of $R^{71}$ to $R^{73}$ independently represents any one of hydrogen, an alkyl group having 1 to 10 carbon atoms, a halogen group, a vinyl group, a haloalkyl group having 1 to 10 carbon atoms, an alkoxy group having 1 to 10 carbon atoms, and an alkylthio group having 1 to 10 carbon atoms.

The organometallic complex described in this embodiment is an organometallic complex represented by General Formula (G7) below.

[Chemical Formula 18]

(G7)

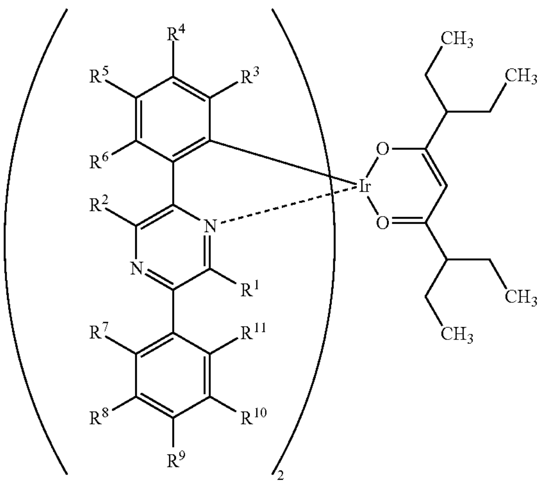

Note that in General Formula (G7), each of $R^1$ and $R^2$ independently represents any one of hydrogen, an alkyl group having 1 to 6 carbon atoms, and an alkoxy group having 1 to 6 carbon atoms. Each of $R^3$ to $R^6$ independently represents any one of hydrogen, an alkyl group having 1 to 6 carbon atoms, an alkoxy group having 1 to 6 carbon atoms, a substituted or unsubstituted aryl group having 6 to 12 carbon atoms, a halogen group, and a trifluoromethyl group. Each of $R^7$ to $R^{11}$ independently represents any of hydrogen, a substituted or unsubstituted alkyl group having 1 to 6 carbon atoms, a substituted or unsubstituted aryl group having 6 to 13 carbon atoms, a substituted or unsubstituted heteroaryl group having 3 to 12 carbon atoms, and a cyano group, and at least one of $R^7$ to $R^{11}$ represents a cyano group.

The organometallic complex described in this embodiment is an organometallic complex represented by General Formula (G8) below.

[Chemical Formula 19]

(G8)

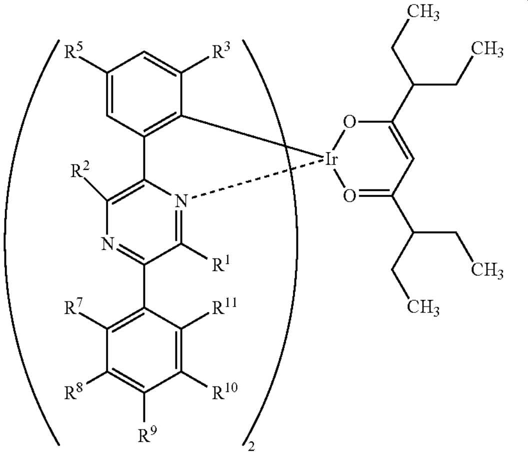

Note that in General Formula (G8), each of $R^1$ and $R^2$ independently represents any one of hydrogen, an alkyl group having 1 to 6 carbon atoms, and an alkoxy group having 1 to 6 carbon atoms. Each of $R^3$ and $R^5$ independently represents any one of hydrogen, an alkyl group having 1 to 6 carbon atoms, an alkoxy group having 1 to 6 carbon atoms, a substituted or unsubstituted aryl group having 6 to 12 carbon atoms, a halogen group, and a trifluoromethyl group. Each of $R^7$ to $R^{11}$ independently represents any of hydrogen, a substituted or unsubstituted alkyl group having 1 to 6 carbon atoms, a substituted or unsubstituted aryl group having 6 to 13 carbon atoms, a substituted or unsubstituted heteroaryl group having 3 to 12 carbon atoms, and a cyano group, and at least one of $R^7$ to $R^{11}$ represents a cyano group.

In any of General Formulae (G1) to (G8) above, in the case where the substituted or unsubstituted aryl group having 6 to 13 carbon atoms or the substituted or unsubstituted heteroaryl group having 3 to 12 carbon atoms includes a substituent, examples of the substituent include an alkyl group having 1 to 6 carbon atoms, such as a methyl group, an ethyl group, a propyl group, an isopropyl group, a butyl group, an isobutyl group, a sec-butyl group, a tert-butyl group, a pentyl group, or a hexyl group; a cycloalkyl group having 5 to 7 carbon atoms, such as a cyclopentyl group, a cyclohexyl group, a cycloheptyl group, a 1-norbornyl group, or a 2-norbornyl group; and an aryl group having 6 to 12 carbon atoms, such as a phenyl group or a biphenyl group.

Specific examples of the alkyl group having 1 to 6 carbon atoms as any of $R^1$ to $R^{11}$ in General Formulae (G1) to (G8) above include a methyl group, an ethyl group, a propyl group, an isopropyl group, a butyl group, a sec-butyl group, an isobutyl group, a tert-butyl group, a pentyl group, an isopentyl group, a sec-pentyl group, a tert-pentyl group, a neopentyl group, a hexyl group, an isohexyl group, a sec-hexyl group, a tert-hexyl group, a neohexyl group, a 3-methylpentyl group, a 2-methylpentyl group, a 2-ethylbutyl group, a 1,2-dimethylbutyl group, a 2,3-dimethylbutyl group, and a trifluoromethyl group.

Specific examples of the alkyl group having 1 to 10 carbon atoms as any of $R^{71}$ to $R^{73}$ in General Formulae (G5) and (G6) above include a methyl group, an ethyl group, a propyl group, an isopropyl group, a butyl group, a sec-butyl group, an isobutyl group, a tert-butyl group, a pentyl group, an isopentyl group, a sec-pentyl group, a tert-pentyl group, a neopentyl group, a hexyl group, an isohexyl group, a sec-hexyl group, a tert-hexyl group, a neohexyl group, a 3-methylpentyl group, a 2-methylpentyl group, a 2-ethylbutyl group, a 1,2-dimethylbutyl group, a 2,3-dimethylbutyl group, a 1-propylbutyl group, a 1-propylpentyl group, a 1-butylpentyl group, and a trifluoromethyl group.

Specific examples of the aryl group having 6 to 13 carbon atoms as any of $R^3$ to $R^{11}$ in General Formulae (G2), (G4), and (G5) to (G8) above include a phenyl group, a tolyl group (an o-tolyl group, an m-tolyl group, and a p-tolyl group), a naphthyl group (a 1-naphthyl group and a 2-naphthyl group), a biphenyl group (a biphenyl-2-yl group, a biphenyl-3-yl group, and a biphenyl-4-yl group), a xylyl group, a pentalenyl group, an indenyl group, a fluorenyl group, and a phenanthryl group. Note that the above substituents may be bonded to each other to form a ring. Examples of such a case include the case where carbon at the 9-position in a fluorenyl group has two phenyl groups as substituents and the phenyl groups are bonded to each other to form a spirofluorene skeleton.

Specific examples of the heteroaryl group having 3 to 12 carbon atoms as any of $R^7$ to $R^{11}$ in General Formulae (G5) to (G8) above include an imidazolyl group, a pyrazolyl group, a pyridyl group, a pyridazyl group, a triazyl group, a benzimidazolyl group, and a quinolyl group.

Specific examples of the halogen group, the vinyl group, the haloalkyl group having 1 to 10 carbon atoms, the alkoxy group having 1 to 10 carbon atoms, and the alkylthio group having 1 to 10 carbon atoms as any of $R^{71}$ to $R^{73}$ in General Formulae (L1), (G5), and (G6) above include a methoxy group, an ethoxy group, an n-propoxy group, an isopropoxy group, an n-butoxy group, a sec-butoxy group, an isobutoxy group, a tert-butoxy group, an n-pentyloxy group, an isopentyloxy group, a sec-pentyloxy group, a tert-pentyloxy group, a neo-pentyloxy group, an n-hexyloxy group, an isohexyloxy group, a sec-hexyloxy group, a tert-hexyloxy group, a neo-hexyloxy group, a cyclohexyloxy group, a 3-methylpentyloxy group, a 2-methylpentyloxy group, a 2-ethylbutoxy group, a 1,2-dimethylbutoxy group, a 2,3-dimethylbutoxy group, a 1-propylbutyl group, a 1-propylpentyl group, a 1-butylpentyl group, a cyano group, fluorine, chlorine, bromine, iodine, and a trifluoromethyl group.

It is preferable that a cyano group be included as at least one substituent of the aryl group bonded at the 5-position of the pyrazine skeleton. For example, in the organometallic complexes represented by General Formulae (G5) to (G8), a cyano group is preferably included as at least one of $R^7$ to $R^{11}$.

When the cyano group is included as at least one substituent of the aryl group bonded at the 5-position of the pyrazine skeleton, decomposition resistance at the time of sublimation is improved. On the other hand, the emission wavelength is likely to be shifted to the long-wavelength side when a cyano group is included, and in particular, when a pyrazine skeleton is included, the emission color is likely to be deep red. An emission color of deep red is likely to result in a low current efficiency. Thus, each of the 3-position and the 6-position of the pyrazine skeleton is independently provided with any one of hydrogen, an alkyl group, and an alkoxy group as a substituent.

When each of the 3-position and the 6-position of the pyrazine skeleton is independently provided with any one of hydrogen, an alkyl group, and an alkoxy group as a substituent, the emission wavelength is shifted to the short-wavelength side as compared to the case where at least one of the 3-position and the 6-position of the pyrazine skeleton is provided with an aryl group. Thus, light emission on the long-wavelength side with a poor luminosity factor is reduced, and the current efficiency can be increased. In addition, the sublimation temperature becomes low as compared to the case where at least one of the 3-position and the 6-position of the pyrazine skeleton includes an aryl group.

Accordingly, the organometallic complex of one embodiment of the present invention is characterized in that each of the 3-position and the 6-position of the pyrazine skeleton in General Formulae (G1) to (G8) independently includes any one of hydrogen, an alkyl group, and an alkoxy group as a substituent, and at least one substituent of the aryl group bonded at the 5-position of the pyrazine skeleton is a cyano group.

Note that in General Formulae (G1) to (G8) above, the aryl group bonded at the 5-position of the pyrazine skeleton may include an alkyl group in addition to a cyano group. Therefore, in General Formulae (G5) to (G8) above, at least one of $R^7$ to $R^{11}$ may be an alkyl group having 1 to 6 carbon atoms. Especially when at least one of $R^7$ and $R^{11}$ is an alkyl group having 1 to 6 carbon atoms, a peak of an emission spectrum can be prevented from being shifted to the long-wavelength side and a luminosity factor can be maintained. That is, the organometallic complex of one embodiment of the present invention can achieve high-color-purity and high-efficiency deep red emission.

Next, specific structural formulae of the above organometallic complexes of the embodiments of the present invention are shown below. Note that the present invention is not limited to these formulae.

[Chemical Formula 20]

(100)

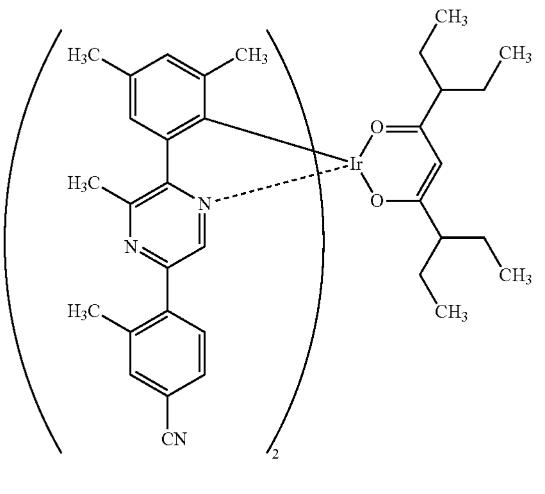

-continued
(101)
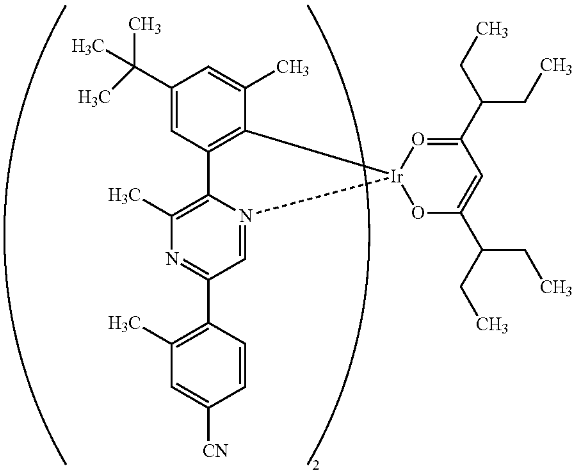
(102)
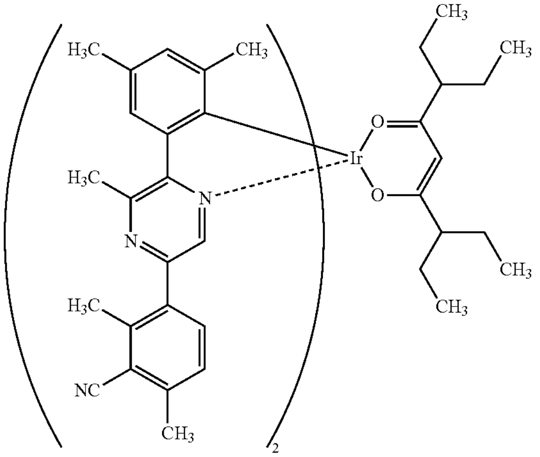
(103)
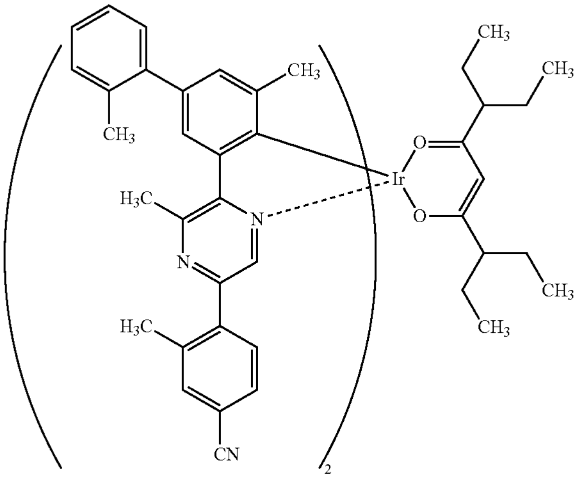
-continued
(104)
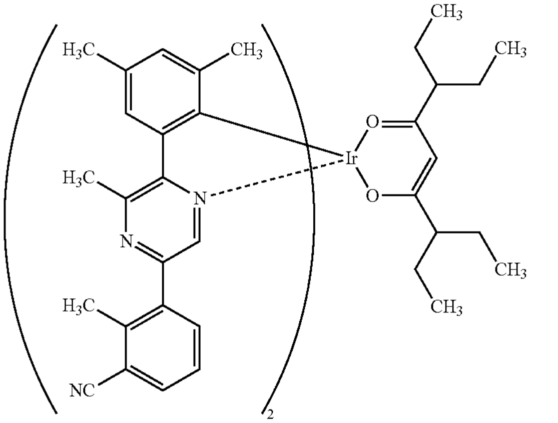
(105)
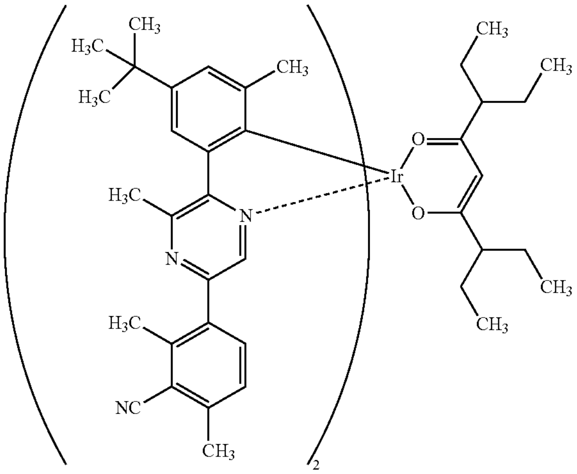
(106)
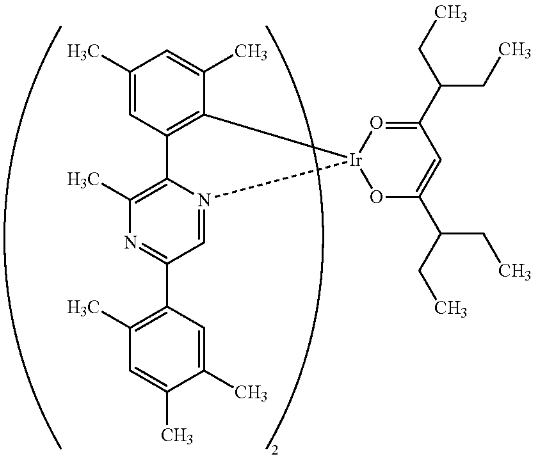

-continued
(107)
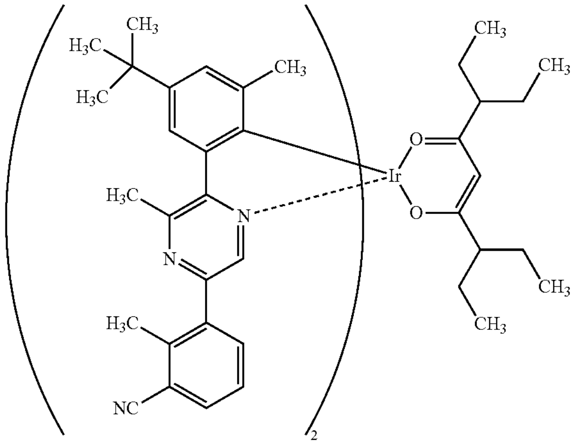
[Chemical Formula 21]
(108)
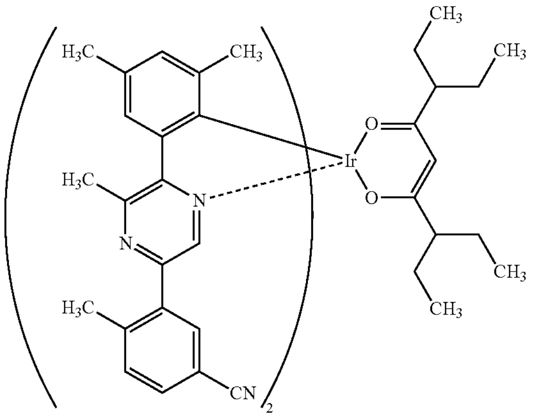
(109)
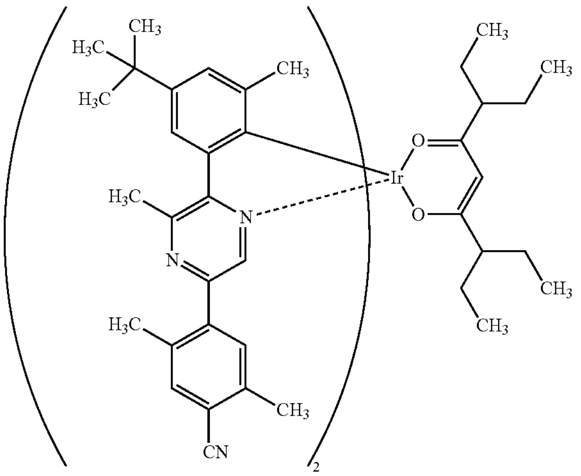
-continued
(110)
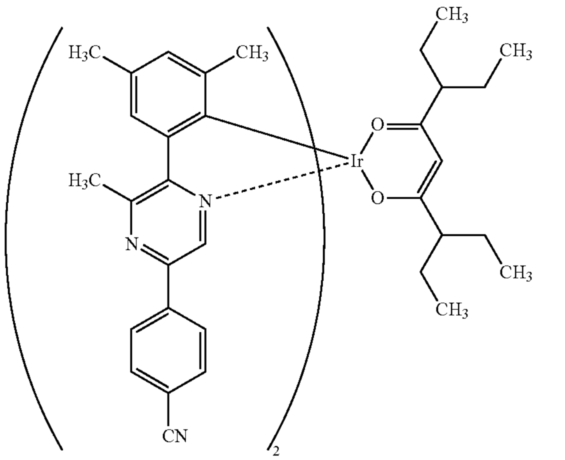
(111)
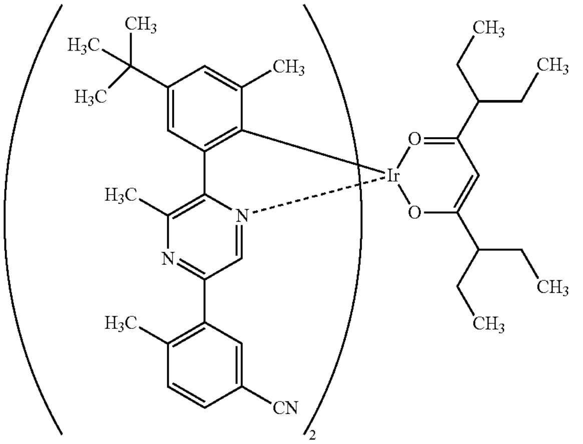
(112)
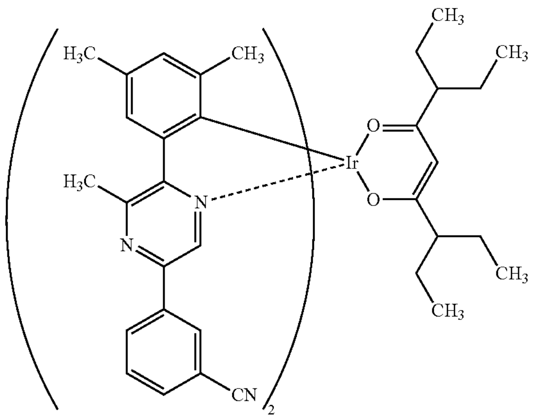

-continued
(113)
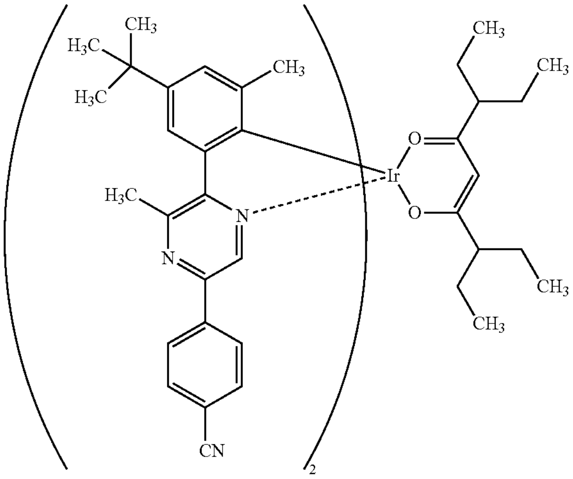
(114)
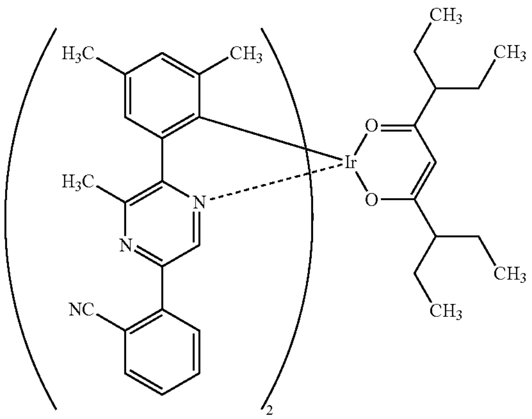
(115)
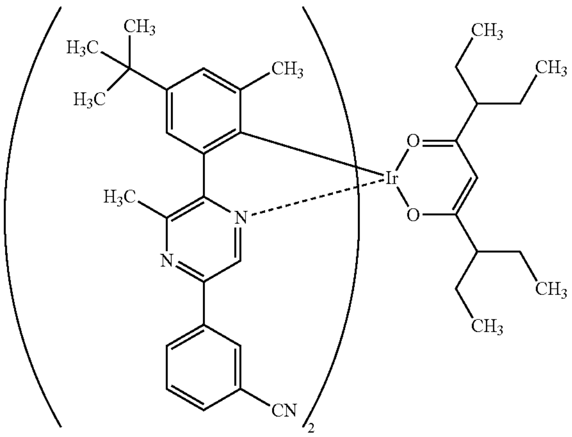
-continued
[Chemical Formula 22]
(116)
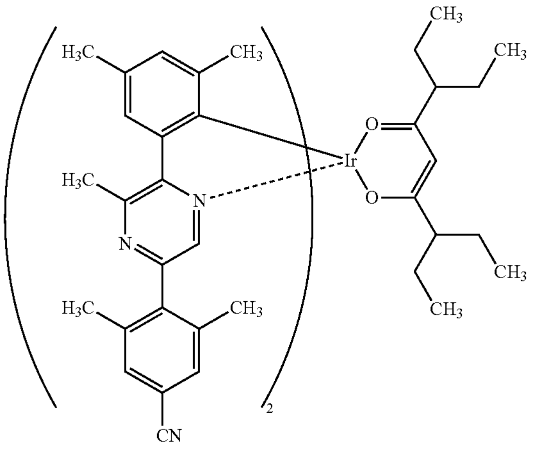
(117)
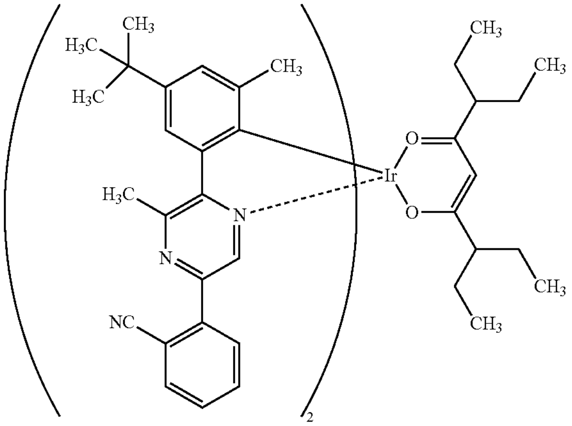
(118)
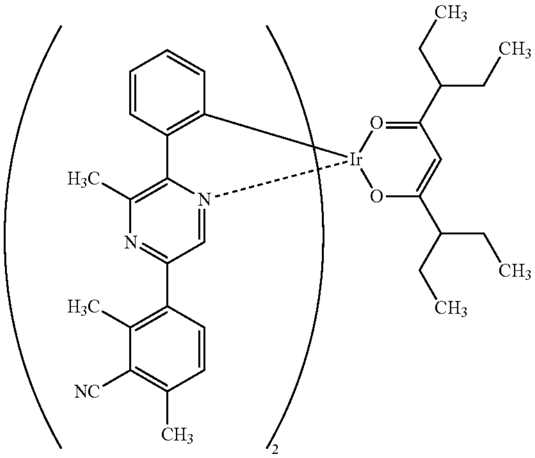

-continued
(119)
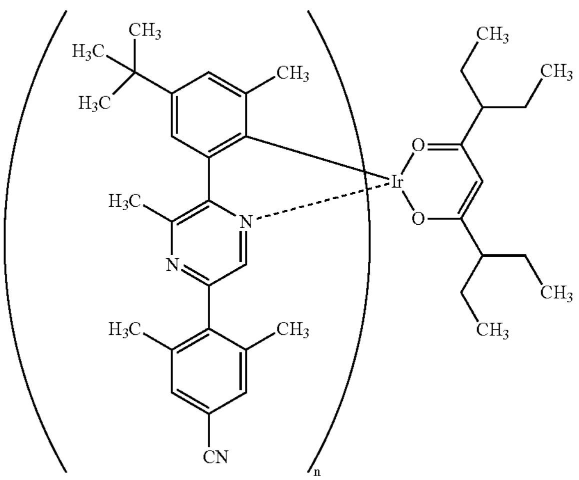
(120)
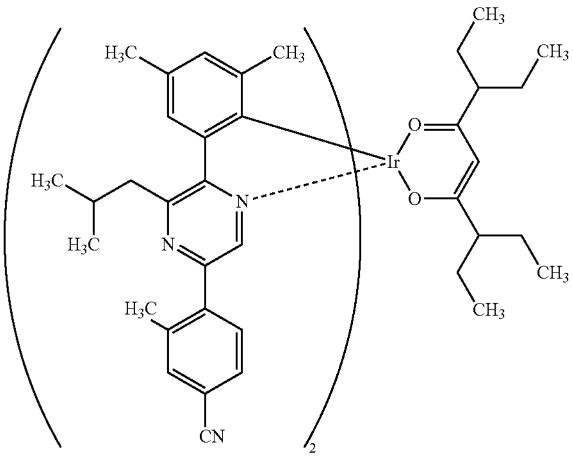
(121)
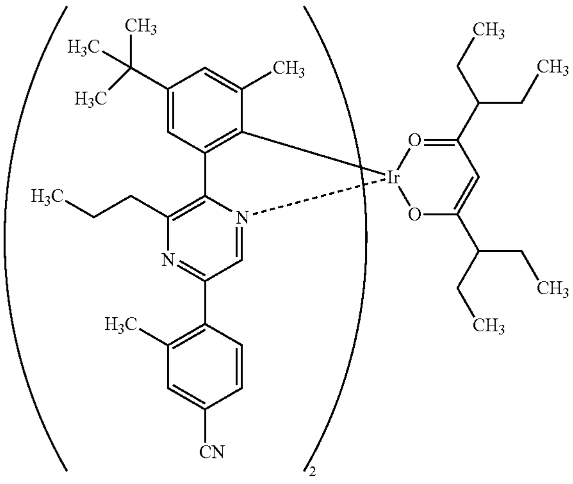
-continued
(122)
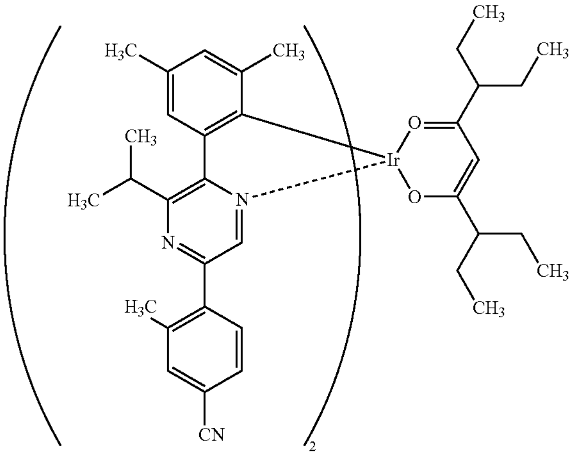
(123)
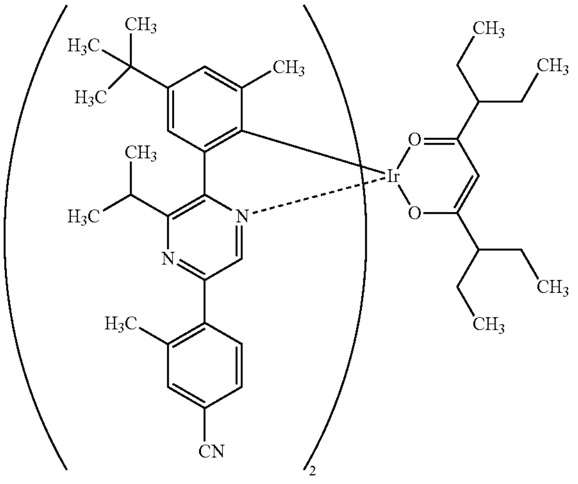
[Chemical Formula 23]
(124)
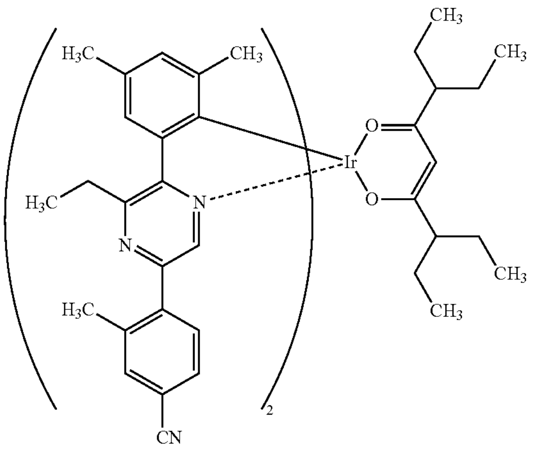

-continued
(125)
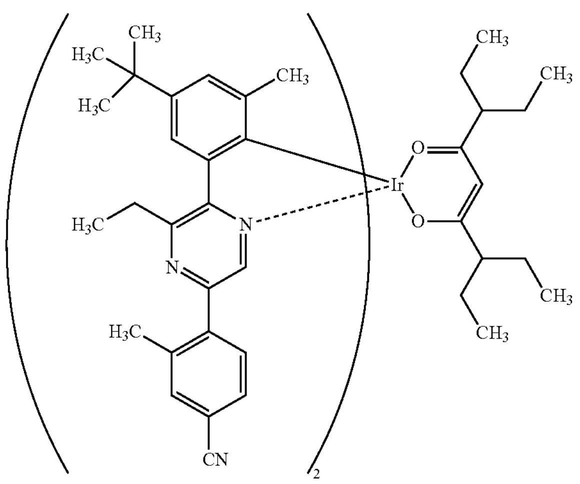
(126)
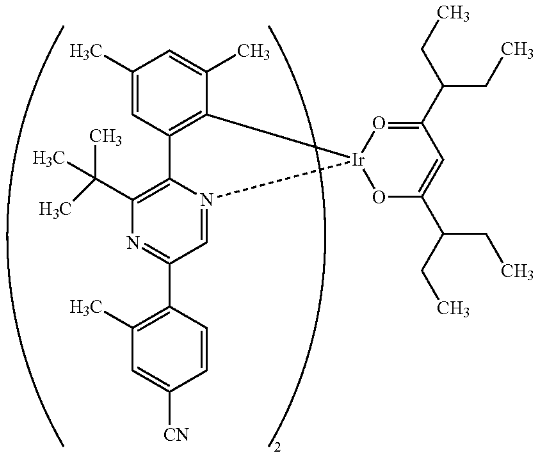
(127)
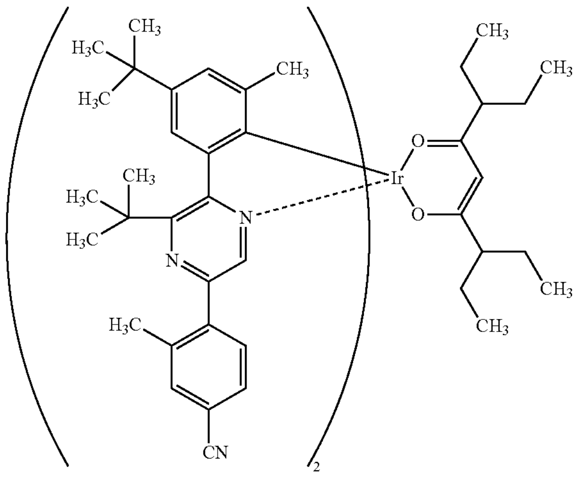
-continued
(128)
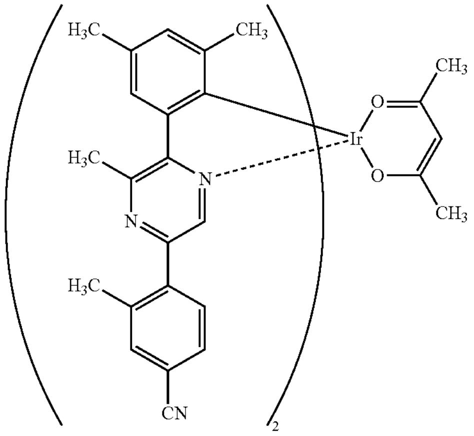
(129)
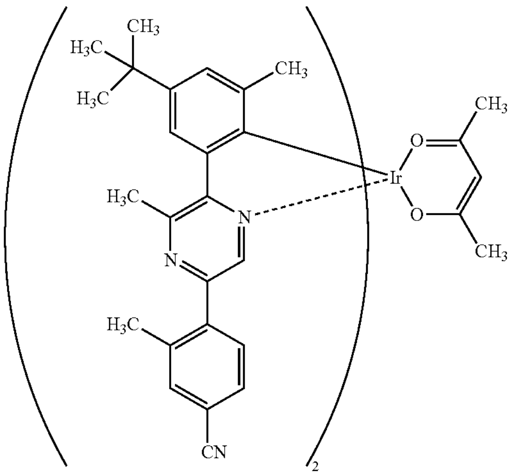
(130)
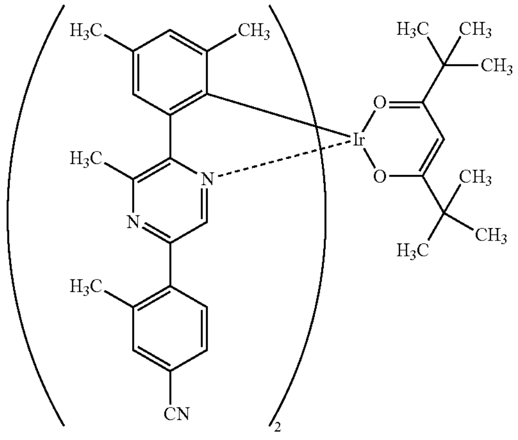

-continued
(131)
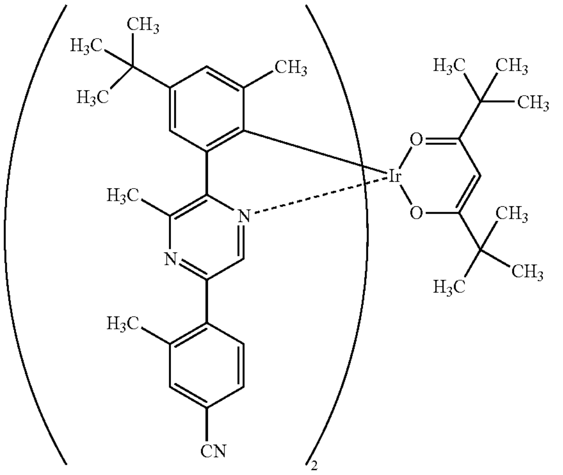
[Chemical Formula 24]
(132)
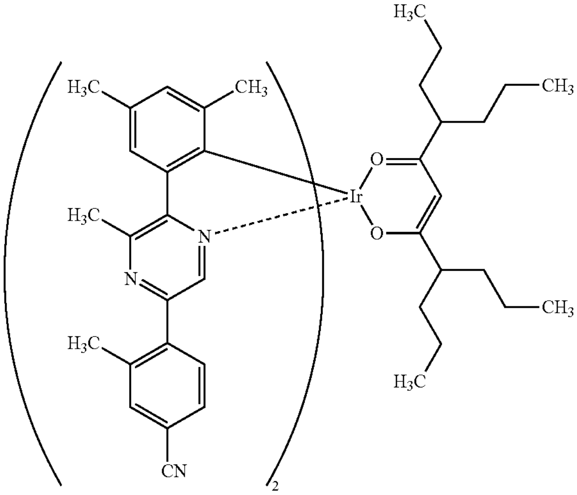
(133)
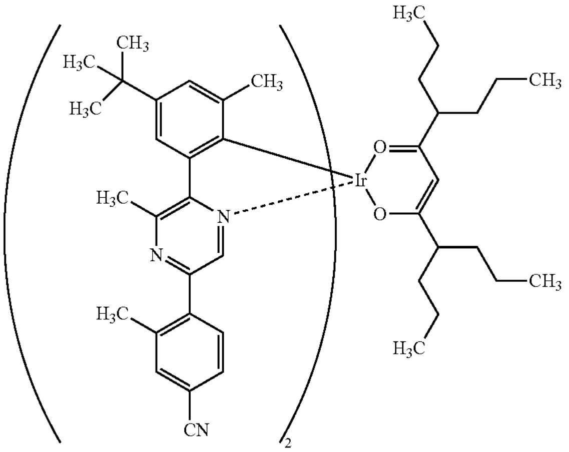
-continued
(134)
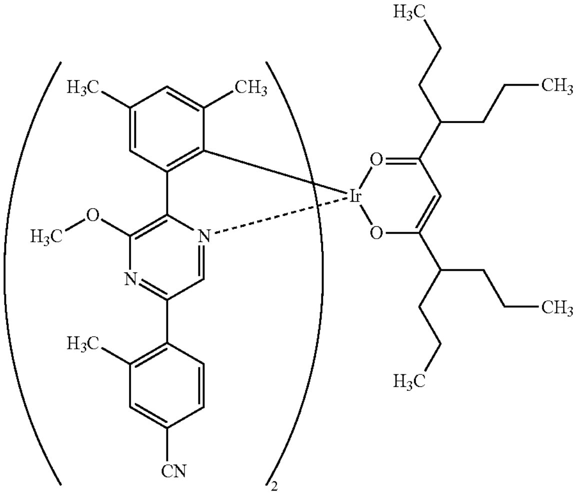
(135)
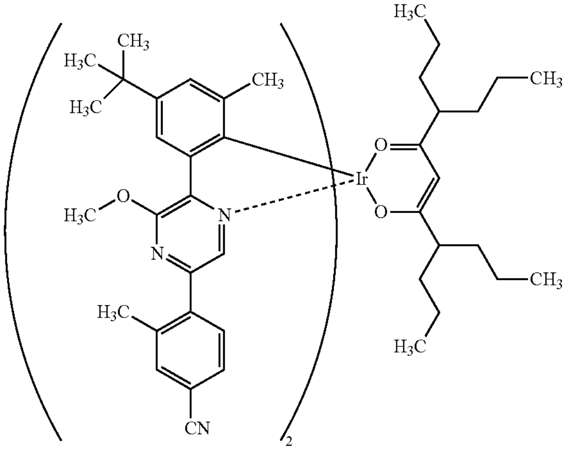
(136)
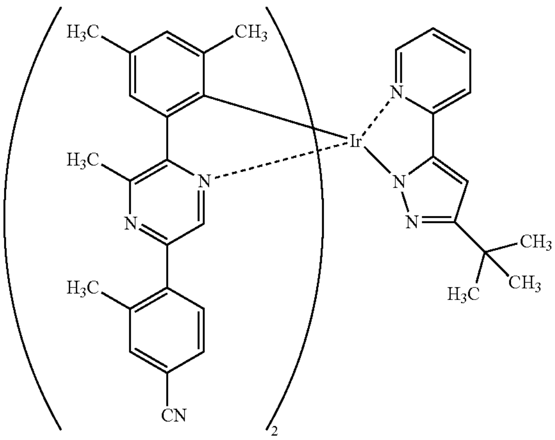

-continued (137)

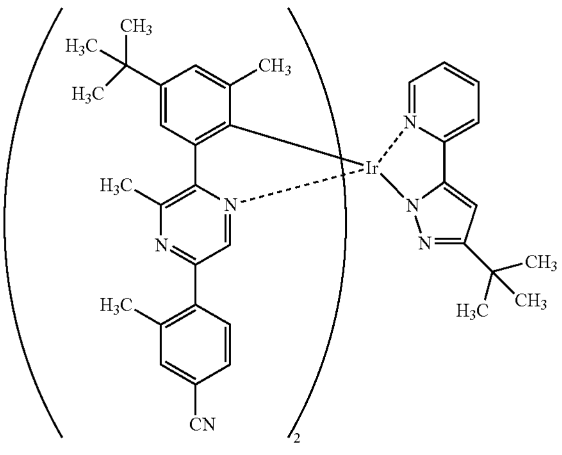

The organometallic complexes represented by Structural Formulae (100) to (137) above are novel substances capable of exhibiting phosphorescence. There can be geometrical isomers and stereoisomers of these substances depending on the type of the ligand. Each of the isomers is also an organometallic complex of one embodiment of the present invention.

Next, an example of a method for synthesizing the organometallic complex which is one embodiment of the present invention and has a structure represented by General Formula (G3) is described.

<<Method for Synthesizing Pyrazine Derivative Represented by General Formula (G0)>>

A pyrazine derivative represented by General Formula (G0) below and used for synthesis of the organometallic complex represented by General Formula (G3) can be synthesized by a synthesis method shown in Synthesis Scheme (A) below.

[Chemical Formula 25]

(G0)

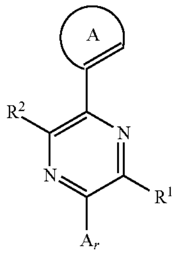

In General Formula (G0), A represents a substituted or unsubstituted aromatic hydrocarbon group having 6 to 25 carbon atoms. In addition, $A_r$ represents an aryl group having 6 to 25 carbon atoms and at least one cyano group as a substituent. Each of $R^1$ and $R^2$ independently represents any one of hydrogen, an alkyl group having 1 to 6 carbon atoms, and an alkoxy group having 1 to 6 carbon atoms.

For example, as shown in Synthesis Scheme (A), the pyrazine derivative represented by General Formula (G0) can be obtained in such a manner that a pyrazine compound (A-1) is coupled with a boronic acid (A-2) to give an intermediate (A-3). Then, the intermediate (A-3) is coupled with an boronic acid (A-4), whereby the derivative (G0) can be obtained. Note that a boronic ester, a cyclic-triolborate salt, or the like may be used as the boronic acid.

[Chemical Formula 26]

(A)

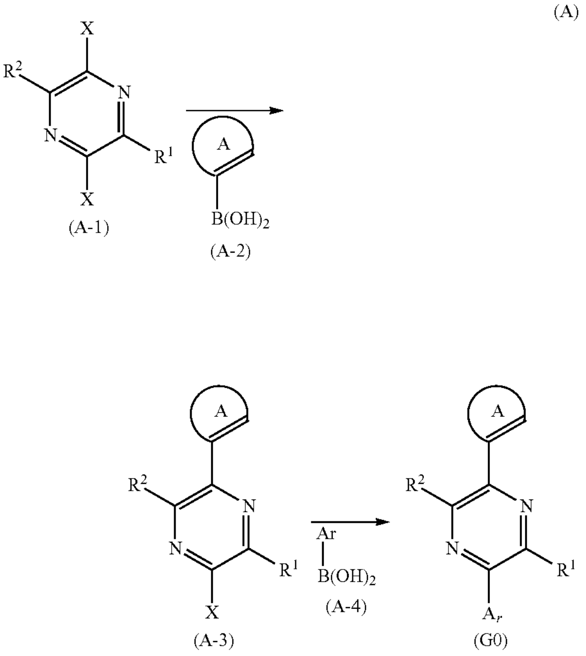

In Synthesis Scheme (A) above, X represents halogen or triflate, and A represents a substituted or unsubstituted aromatic hydrocarbon group having 6 to 25 carbon atoms. In addition, $A_r$ represents an aryl group having 6 to 25 carbon atoms and at least one cyano group as a substituent. Each of $R^1$ and $R^2$ independently represents any one of hydrogen, an alkyl group having 1 to 6 carbon atoms, and an alkoxy group having 1 to 6 carbon atoms.

Various types of the above compounds (A-1), (A-2), (A-3), and (A-4) are commercially available or can be synthesized, and thus, a large number of types of the pyrazine derivative represented by General Formula (G0) can be synthesized. Thus, the organometallic complex of one embodiment of the present invention is characterized by having numerous variations of ligands.

<<Method for Synthesizing Organometallic Complex of One Embodiment of the Present Invention Represented by General Formula (G3)>>

The organometallic complex of one embodiment of the present invention represented by General Formula (G3) is synthesized as follows. As shown in Synthesis Scheme (B-1) below, the pyrazine derivative represented by General Formula (G0) and an iridium compound containing a halogen (e.g., iridium chloride, iridium bromide, or iridium iodide) are heated in an inert gas atmosphere using no solvent, an alcohol-based solvent (e.g., glycerol, ethylene glycol, 2-methoxyethanol, or 2-ethoxyethanol) alone, or a mixed solvent of water and one or more of the alcohol-based solvents, so that a dinuclear complex (B) which is a kind of organometallic complex including a halogen-bridged structure and is a novel substance can be obtained. There is no particular limitation on a heating means, and an oil bath, a sand bath, or an aluminum block may be used. Alternatively, microwaves can be used as the heating means.

[Chemical Formula 27]

(B-1)

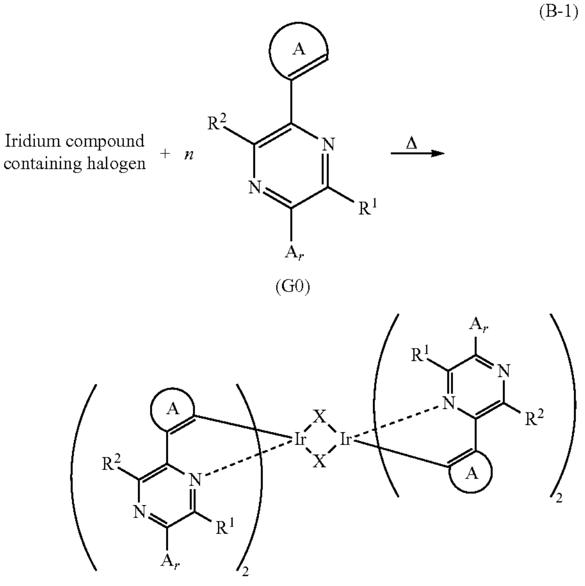

(G0)

(B)

In Synthesis Scheme (B-1), X represents halogen, and A represents a substituted or unsubstituted aromatic hydrocarbon group having 6 to 25 carbon atoms. In addition, $A_r$ represents an aryl group having 6 to 25 carbon atoms and at least one cyano group as a substituent. Each of $R^1$ and $R^2$ independently represents any one of hydrogen, an alkyl group having 1 to 6 carbon atoms, and an alkoxy group having 1 to 6 carbon atoms.

As shown in Synthesis Scheme (B-2) below, the dinuclear complex (B) obtained in Synthesis Scheme (B-1) above is reacted with HL which is a material of a monoanionic ligand in an inert gas atmosphere, whereby a proton of HL is separated and L coordinates to the central metal, iridium. Thus, the organometallic complex of one embodiment of the present invention represented by General Formula (G3) can be obtained. There is no particular limitation on a heating means, and an oil bath, a sand bath, or an aluminum block may be used. Alternatively, microwaves can be used as the heating means.

[Chemical Formula 28]

(B-2)

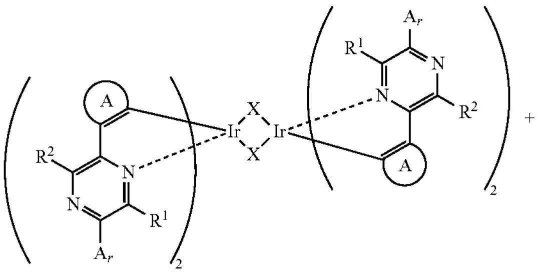

(B)

-continued

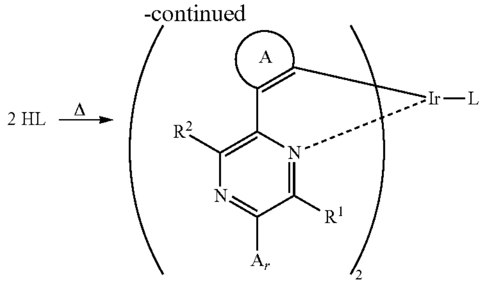

(G3)

In Synthesis Scheme (B-2), L represents a monoanionic ligand, and A represents a substituted or unsubstituted aromatic hydrocarbon group having 6 to 25 carbon atoms. In addition, $A_r$ represents an aryl group having 6 to 25 carbon atoms and at least one cyano group as a substituent. Each of $R^1$ and $R^2$ independently represents any one of hydrogen, an alkyl group having 1 to 6 carbon atoms, and an alkoxy group having 1 to 6 carbon atoms.

An example of the synthesis method of the organometallic complex of one embodiment of the present invention is described above; however, the present invention is not limited thereto and the organometallic complex may be synthesized by any other synthesis method.

The above-described organometallic complex can exhibit phosphorescence and thus can be used as a light-emitting material or a light-emitting substance of a light-emitting device.

With the use of the organometallic complex of one embodiment of the present invention, a light-emitting device, a light-emitting apparatus, an electronic device, or a lighting device with a high emission efficiency can be achieved. In addition, a light-emitting device, a light-emitting apparatus, an electronic device, or a lighting device with low power consumption can be achieved.

Note that, in this embodiment, one embodiment of the present invention has been described. Other embodiments of the present invention are described in the other embodiments. However, one embodiment of the present invention is not limited thereto. In other words, since various embodiments of the invention are described in this embodiment and the other embodiments, embodiments of the present invention are not limited to particular embodiments. Although the example in which one embodiment of the present invention is used in a light-emitting device is described as an example, one embodiment of the present invention is not limited thereto. Depending on circumstances, one embodiment of the present invention may be applied to objects other than a light-emitting device.

The structures described in this embodiment can be used in an appropriate combination with the structures described in the other embodiments and the like.

Embodiment 2

In this embodiment, a light-emitting device of one embodiment of the present invention is described.

FIG. 1A is a diagram illustrating a light-emitting device of one embodiment of the present invention. The light-emitting device of one embodiment of the present invention includes a first electrode 181, a second electrode 182, and an EL layer 183. The EL layer 183 contains the organic compound described in Embodiment 1.

The EL layer 183 includes a light-emitting layer 193, and the light-emitting layer 193 contains a light-emitting material. A hole-injection layer 191 and a hole-transport layer 192 are provided between the light-emitting layer 193 and the first electrode 181. The organometallic complex described in Embodiment 1 efficiently emits red phosphorescent light, and thus is preferably used as the light-emitting material.

The light-emitting layer 193 may contain a host material in addition to the light-emitting material. The host material is an organic compound having a carrier-transport property. The host material is not limited to one kind of material, and a plurality of kinds of materials may be included. In such a structure, the plurality of kinds of organic compounds are preferably an organic compound having an electron-transport property and an organic compound having a hole-transport property, in which case the carrier balance in the light-emitting layer 193 can be adjusted. The plurality of organic compounds may be organic compounds each having an electron-transport property, and when the electron-transport properties thereof are different from each other, the electron-transport property of the light-emitting layer 193 can also be adjusted. Proper adjustment of the carrier balance can provide a long-life light-emitting device. The plurality of organic compounds that are host materials may form an exciplex, or the host material and the light-emitting material may form an exciplex. Formation of the exciplex having an appropriate emission wavelength allows efficient energy transfer to the light-emitting material, achieving a light-emitting device with favorable efficiency and a long lifetime.

Note that although FIG. 1A illustrates an electron-transport layer 194 and an electron-transport layer 195 in the EL layer 183 in addition to the light-emitting layer 193, the hole-injection layer 191, and the hole-transport layer 192, the structure of the light-emitting device is not limited thereto. Any of these layers may be omitted or a layer having another function may be included.

Next, examples of specific structures and materials of the aforementioned light-emitting device will be described. As described above, the light-emitting device of one embodiment of the present invention includes, between the pair of electrodes of the first electrode 181 and the second electrode 182, the EL layer 183 including a plurality of layers; the EL layer 183 includes the organic compound disclosed in Embodiment 1 in any of the layers.

The first electrode 181 is preferably formed using a metal, an alloy, or a conductive compound having a high work function (specifically, 4.0 eV or more), a mixture thereof, or the like. Specifically, for example, indium oxide-tin oxide (ITO: Indium Tin Oxide), indium oxide-tin oxide containing silicon or silicon oxide, indium oxide-zinc oxide, indium oxide containing tungsten oxide and zinc oxide (IWZO), and the like can be given. These conductive metal oxide films are usually formed by a sputtering method but may also be formed by application of a sol-gel method or the like. An example of the formation method is a method in which indium oxide-zinc oxide is formed by a sputtering method using a target in which 1 to 20 wt % zinc oxide is added to indium oxide. Indium oxide containing tungsten oxide and zinc oxide (IWZO) can also be formed by a sputtering method using a target containing 0.5 to 5 wt % tungsten oxide and 0.1 to 1 wt % zinc oxide with respect to indium oxide. Alternatively, gold (Au), platinum (Pt), nickel (Ni), tungsten (W), chromium (Cr), molybdenum (Mo), iron (Fe), cobalt (Co), copper (Cu), palladium (Pd), a nitride of a metal material (such as titanium nitride), and the like can be given. Graphene can also be used. Note that when a composite material described later is used for a layer that is in contact with the first electrode 181 in the EL layer 183, an electrode material can be selected regardless of its work function.

Figure 1B:
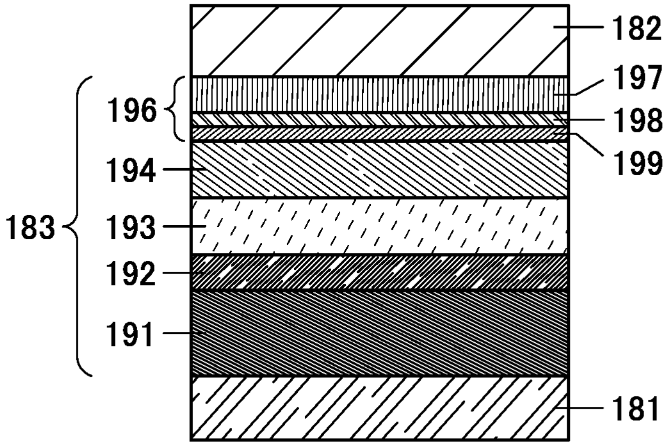

Although the EL layer 183 preferably has a stacked-layer structure, there is no particular limitation on the stacked-layer structure, and various layer structures such as a hole-injection layer, a hole-transport layer, a light-emitting layer, an electron-transport layer, an electron-injection layer, a carrier-blocking layer, an exciton-blocking layer, and a charge-generation layer can be employed. In this embodiment, two kinds of structures are described as examples: the structure including the electron-transport layer 194 and the electron-transport layer 195 in addition to the hole-injection layer 191, the hole-transport layer 192, and the light-emitting layer 193 as illustrated in FIG. 1A; and the structure including the electron-transport layer 194 and a charge-generation layer 196 in addition to the hole-injection layer 191, the hole-transport layer 192, and the light-emitting layer 193 as illustrated in FIG. 1B. Materials forming the layers are specifically described below.

The hole-injection layer 191 contains a substance having an acceptor property. Either an organic compound or an inorganic compound can be used as the substance having an acceptor property.

As the substance having an acceptor property, it is possible to use a compound having an electron-withdrawing group (a halogen group or a cyano group); for example, 7,7,8,8-tetracyano-2,3,5,6-tetrafluoroquinodimethane (abbreviation: F4-TCNQ), chloranil, 2,3,6,7,10,11-hexacyano-1,4,5,8,9,12-hexaazatriphenylene (abbreviation: HAT-CN), 1,3,4,5,7,8-hexafluorotetracyano-naphthoquinodimethane (abbreviation: F6-TCNNQ), or 2-(7-dicyanomethylene-1,3,4,5,6,8,9,10-octafluoro-7H-pyren-2-ylidene)malononitrile can be used. A compound in which electron-withdrawing groups are bonded to a condensed aromatic ring having a plurality of heteroatoms, such as HAT-CN, is particularly preferable because it is thermally stable. A [3]radialene derivative having an electron-withdrawing group (in particular, a cyano group or a halogen group such as a fluoro group) has a very high electron-accepting property and thus is preferable. Specific examples include α,α',α''-1,2,3-cyclopropanetriylidenetris[4-cyano-2,3,5,6-tetrafluorobenzeneacetonitrile], α,α',α''-1,2,3-cyclopropanetriylidenetris[2,6-dichloro-3,5-difluoro-4-(trifluoromethyl)benzeneacetonitrile], and α,α',α''-1,2,3-cyclopropanetriylidenetris[2,3,4,5,6-pentafluorobenzeneacetonitrile]. As the substance having an acceptor property, molybdenum oxide, vanadium oxide, ruthenium oxide, tungsten oxide, manganese oxide, or the like can be used, other than the above-described organic compounds. Alternatively, the hole-injection layer 191 can be formed using a phthalocyanine-based complex compound such as phthalocyanine (abbreviation: H2Pc) or copper phthalocyanine (CuPc), an aromatic amine compound such as 4,4'-bis[N-(4-diphenylaminophenyl)-N-phenylamino]biphenyl (abbreviation: DPAB) or N,N'-bis{4-[bis(3-methylphenyl)amino]phenyl}-N,N'-diphenyl-(1,1'-biphenyl)-4,4'-diamine (abbreviation: DNTPD), or a high molecular such as poly(3,4-ethylenedioxythiophene)/poly(styrenesulfonic acid) (PEDOT/PSS). The substance having an acceptor property can extract electrons from an adjacent hole-transport layer (or hole-transport material) by the application of an electric field.

Alternatively, a composite material in which a material having a hole-transport property contains the above-described substance having an acceptor property can be used for the hole-injection layer 191. By using a composite material in which a material having a hole-transport property contains a substance having an acceptor property, a material used to form an electrode can be selected regardless of its work function. In other words, besides a material having a high work function, a material having a low work function can also be used for the first electrode 181.

As the material having a hole-transport property used for the composite material, any of a variety of organic compounds such as aromatic amine compounds, carbazole derivatives, aromatic hydrocarbons, and high molecular compounds (e.g., oligomers, dendrimers, or polymers) can be used. Note that the material having a hole-transport property used for the composite material preferably has a hole mobility of $1\times10^{-6}$ $cm^2/Vs$ or higher. Organic compounds which can be used as the material having a hole-transport property in the composite material are specifically given below.

Examples of the aromatic amine compounds that can be used for the composite material include N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis{4-[bis(3-methylphenyl)amino]phenyl}-N,N'-diphenyl-(1,1'-biphenyl)-4,4'-diamine (abbreviation: DNTPD), and 1,3,5-tris[N-(4-diphenylaminophenyl)-N-phenylamino]benzene (abbreviation: DPA3B). Specific examples of the carbazole derivative include 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthracenyl)phenyl]-9H-carbazole (abbreviation: CzPA), and 1,4-bis[4-(N-carbazolyl)phenyl]-2,3,5,6-tetraphenylbenzene. Examples of the aromatic hydrocarbon include 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, and 2,5,8,11-tetra(tert-butyl)perylene. Other examples include pentacene and coronene. The aromatic hydrocarbon may have a vinyl skeleton. Examples of the aromatic hydrocarbon having a vinyl group include 4,4'-bis(2,2-diphenylvinyl)biphenyl (abbreviation: DPVBi) and 9,10-bis[4-(2,2-diphenylvinyl)phenyl]anthracene (abbreviation: DPVPA).

Other examples include high molecular compounds such as poly(N-vinylcarbazole) (abbreviation: PVK), poly(4-vinyltriphenylamine) (abbreviation: PVTPA), poly[N-(4-{N-[4-(4-diphenylamino)phenyl]phenyl-N-phenylamino}phenyl)methacrylamide](abbreviation: PTPDMA), and poly[N,N'-bis(4-butylphenyl)-N,N'-bis(phenyl)benzidine](abbreviation: Poly-TPD).

The material having a hole-transport property used for the composite material further preferably has any of a carbazole skeleton, a dibenzofuran skeleton, a dibenzothiophene skeleton, and an anthracene skeleton. In particular, an aromatic amine having a substituent that includes a dibenzofuran ring or a dibenzothiophene ring, an aromatic monoamine that has a naphthalene ring, or an aromatic monoamine in which a 9-fluorenyl group is bonded to nitrogen of the amine through an arylene group may be used. Note that these second organic compounds are preferably substances having an N,N-bis(4-biphenyl)amino group because a light-emitting device with a long lifetime can be manufactured. Specific examples of the above second organic compound include N-(4-biphenyl)-6,N-diphenylbenzo[b]naphtho[1,2-d]furan-8-amine (abbreviation: BnfABP), N,N-bis(4-biphenyl)-6-phenylbenzo[b]naphtho[1,2-d]furan-8-amine (abbreviation: BBABnf), 4,4'-bis(6-phenylbenzo[b]naphtho[1,2-d]furan-8-yl)-4"-phenyltriphenylamine (abbreviation: BnfBB1BP), N,N-bis(4-biphenyl)benzo[b]naphtho[1,2-d]furan-6-amine (abbreviation: BBABnf(6)), N,N-bis(4-biphenyl)benzo[b]naphtho[1,2-d]furan-8-amine (abbreviation: BBABnf(8)), N,N-bis(4-biphenyl)benzo[b]naphtho[2,3-d]furan-4-amine (abbreviation: BBABnf(II)(4)), N,N-bis[4-(dibenzofuran-4-yl)phenyl]-4-amino-p-terphenyl (abbreviation: DBfBB1TP), N-[4-(dibenzothiophen-4-yl)phenyl]-N-phenyl-4-biphenylamine (abbreviation: ThBA1BP), 4-(2-naphthyl)-4',4"-diphenyltriphenylamine (abbreviation: BBAβNB), 4-[4-(2-naphthyl)phenyl]-4',4"-diphenyltriphenylamine (abbreviation: BBAβNBi), 4,4'-diphenyl-4"-(6;1'-binaphthyl-2-yl)triphenylamine (abbreviation: BBAαNβNB), 4,4'-diphenyl-4"-(7;1'-binaphthyl-2-yl)triphenylamine (abbreviation: BBAαNβNB-03), 4,4'-diphenyl-4"-(7-phenyl)naphthyl-2-yltriphenylamine (abbreviation: BBAPβNB-03), 4,4'-diphenyl-4"-(6;2'-binaphthyl-2-yl)triphenylamine (abbreviation: BBA(βN2)B), 4,4'-diphenyl-4"-(7;2'-binaphthyl-2-yl)triphenylamine (abbreviation: BBA(βN2)B-03), 4,4'-diphenyl-4"-(4;2'-binaphthyl-1-yl)triphenylamine (abbreviation: BBAβNαNB), 4,4'-diphenyl-4"-(5;2'-binaphthyl-1-yl)triphenylamine (abbreviation: BBAβNαNB-02), 4-(4-biphenylyl)-4'-(2-naphthyl)-4"-phenyltriphenylamine (abbreviation: TPBiAβNB), 4-(3-biphenylyl)-4'-[4-(2-naphthyl)phenyl]-4"-phenyltriphenylamine (abbreviation: mTPBiAβNBi), 4-(4-biphenylyl)-4'-[4-(2-naphthyl)phenyl]-4"-phenyltriphenylamine (abbreviation: TPBiAβNBi), 4-phenyl-4'-(1-naphthyl)triphenylamine (abbreviation: αNBA1BP), 4,4'-bis(1-naphthyl)triphenylamine (abbreviation: αNBB1BP), 4,4'-diphenyl-4"-[4'-(carbazol-9-yl)biphenyl-4-yl]triphenylamine (abbreviation: YGTBi1BP), 4'-[4-(3-phenyl-9H-carbazol-9-yl)phenyl]tris(1,1'-biphenyl-4-yl)amine (abbreviation: YGTBi1BP-02), 4-diphenyl-4'-(2-naphthyl)-4"-{9-(4-biphenylyl)carbazole}triphenylamine (abbreviation: YGTBiβNB), N-[4-(9-phenyl-9H-carbazol-3-yl)phenyl]-N-[4-(1-naphthyl)phenyl]-9,9'-spirobi[9H-fluoren]-2-amine (abbreviation: PCBNBSF), N,N-bis(4-biphenylyl)-9,9'-spirobi[9H-fluoren]-2-amine (abbreviation: BBASF), N,N-bis(1,1'-biphenyl-4-yl)-9,9'-spirobi[9H-fluoren]-4-amine (abbreviation: BBASF(4)), N-(1,1'-biphenyl-2-yl)-N-(9,9-dimethyl-9H-fluoren-2-yl)-9,9'-spiro-bi[9H-fluoren]-4-amine (abbreviation: oFBiSF), N-(4-biphenyl)-N-(dibenzofuran-4-yl)-9,9-dimethyl-9H-fluoren-2-amine (abbreviation: FrBiF), N-[4-(1-naphthyl)phenyl]-N-[3-(6-phenyldibenzofuran-4-yl)phenyl]-1-naphthylamine (abbreviation: mPDBfBNBN), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-[4-(9-phenylfluoren-9-yl)phenyl]triphenylamine (abbreviation:

BPAFLBi), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), N-phenyl-N-[4-(9-phenyl-9H-carbazol-3-yl)phenyl]spiro-9,9'-bifluoren-2-amine (abbreviation: PCBASF), N-(1,1'-biphenyl-4-yl)-N-[4-(9-phenyl-9H-carbazol-3-yl)phenyl]-9,9-dimethyl-9H-fluoren-2-amine (abbreviation: PCBBiF), N,N-bis(9,9-dimethyl-9H-fluoren-2-yl)-9,9'-spirobi[9H-fluoren]-4-amine, N,N-bis(9,9-dimethyl-9H-fluoren-2-yl)-9,9'-spirobi[9H-fluoren]-3-amine, N,N-bis(9,9-dimethyl-9H-fluoren-2-yl)-9,9'-spirobi[9H-fluoren]-2-amine, and N,N-bis(9,9-dimethyl-9H-fluoren-2-yl)-9,9'-spirobi[9H-fluoren]-1-amine.

Note that it is further preferable that the material having a hole-transport property used for the composite material have a relatively deep HOMO level greater than or equal to −5.7 eV and less than or equal to −5.4 eV. The relatively deep HOMO level of the material having a hole-transport property used for the composite material makes it easy to inject holes into the hole-transport layer 192 and to obtain a light-emitting device with a long lifetime.

Note that mixing the above composite material with a fluoride of an alkali metal or an alkaline earth metal (the proportion of fluorine atoms in the layer is preferably greater than or equal to 20%) can lower the refractive index of the layer. This also enables a layer with a low refractive index to be formed in the EL layer 183, leading to higher external quantum efficiency of the light-emitting device.

The formation of the hole-injection layer 191 can improve the hole-injection property, whereby a light-emitting device having a low driving voltage can be obtained. The organic compound having an acceptor property is an easy-to-use material because evaporation is easy and its film can be easily formed.

The hole-transport layer 192 contains a material having a hole-transport property. The material having a hole-transport property preferably has a hole mobility higher than or equal to $1\times10^{-6}$ $cm^2/Vs$. Examples of the material having a hole-transport property include a compound having an aromatic amine skeleton, such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), or N-phenyl-N-[4-(9-phenyl-9H-carbazol-3-yl)phenyl]spiro-9,9'-bifluoren-2-amine (abbreviation: PCBASF), a compound having a carbazole skeleton, such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), or 3,3'-bis(9-phenyl-9H-carbazole) (abbreviation: PCCP), a compound having a thiophene skeleton, such as 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), or 4-[4-(9-phenyl-9H-fluoren-9-yl)phenyl]-6-phenyldibenzothiophene (abbreviation: DBTFLP-IV), and a compound having a furan skeleton, such as 4,4',4"-(benzene-1,3,5-triyl)tri(dibenzofuran) (abbreviation: DBF3P-II) or 4-{3-[3-(9-phenyl-9H-fluoren-9-yl)phenyl]phenyl}dibenzofuran (abbreviation: mmDBFFLBi-II). Among the above, the compound having an aromatic amine skeleton and the compound having a carbazole skeleton are preferable because these have favorable reliability, have high hole-transport properties, and contribute to a reduction in driving voltage. Note that any of the substances given as examples of the material having a hole-transport property that is used for the composite material for the hole-injection layer 191 can also be suitably used as the material included in the hole-transport layer 192.

The light-emitting layer 193 contains a light-emitting substance and a host material. The light-emitting layer 193 may additionally contain other materials. Furthermore, the light-emitting layer 193 may be a stack of two layers with different compositions.

The light-emitting substance may be a fluorescent substance, a phosphorescent substance, a substance exhibiting thermally activated delayed fluorescence (TADF), or another light-emitting substance.

Examples of a material that can be used as a fluorescent substance in the light-emitting layer 193 include 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N'-diphenyl-N,N'-bis[4-(9-phenyl-9H-fluoren-9-yl)phenyl]pyrene-1,6-diamine (abbreviation: 1,6FLPAPrn), N,N'-bis(3-methylphenyl)-N,N'-bis[3-(9-phenyl-9H-fluoren-9-yl)phenyl]pyrene-1,6-diamine (abbreviation: 1,6mMemFLPAPrn), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra(tert-butyl)perylene (abbreviation: TBP), 4-(10-phenyl-9-anthryl)-4'-(9-phenyl-9H-carbazol-3-yl)triphenylamine (abbreviation: PCBAPA), N,N'-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N",N",N"',N"'-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylide ne}propanedinitrile (abbreviation: DCM2), N,N,N',N'-tetrakis(4-methylphenyl) tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinolizin-9-yl) ethenyl]-4H-pyran-4-ylidene}propanedinitrile (abbreviation: BisDCJTM), N,N'-(pyrene-1,6-diyl)bis[(6,N-diphenylbenzo[b]naphtho[1,2-d] furan)-8-amine](abbreviation:1,6BnfAPrn-03), 3,10-bis[N-(9-phenyl-9H-carbazol-2-yl)-N-phenylamino]naphtho[2,3-b;6,7-b']bisbenzofuran (abbreviation: 3,10PCA2Nbf(IV)-02), and 3,10-bis[N-(dibenzofuran-3-yl)-N-phenylamino] naphtho[2,3-b;6,7-b']bisbenzofuran (abbreviation: 3,10FrA2Nbf(IV)-02). In particular, a condensed aromatic diamine compound typified by a pyrenediamine compound such as 1,6FLPAPrn, 1,6mMemFLPAPrn, and 1,6BnfAPrn-03 is preferable because of its high hole-trapping property, high emission efficiency, and high reliability. Fluorescent substances other than those can also be used.

In the case where a phosphorescent substance is used as the light-emitting substance in the light-emitting layer 193, examples of a material that can be used include an organometallic iridium complex having a 4H-triazole skeleton, such as tris{2-[5-(2-methylphenyl)-4-(2,6-dimethylphenyl)-4H-1,2,4-triazol-3-yl-κN2]phenyl-κC}iridium(III) (abbreviation: [Ir(mpptz-dmp)$_3$]), tris(5-methyl-3,4-diphenyl-4H-1,2,4-triazolato)iridium(III) (abbreviation: [Ir(Mptz)$_3$]), or tris[4-(3-biphenyl)-5-isopropyl-3-phenyl-4H-1,2,4-triazolato]iridium(III) (abbreviation: [Ir(iPrptz-3b)$_3$]); an organometallic iridium complex having a 1H-triazole skeleton, such as tris[3-methyl-1-(2-methylphenyl)-5-phenyl-1H-1,2,4-triazolato]iridium(III) (abbreviation: [Ir(Mptz1-mp)$_3$]) or tris(1-methyl-5-phenyl-3-propyl-1H-1,2,4-triazolato) iridium(III) (abbreviation: [Ir(Prptz1-Me)$_3$]); an organometallic iridium complex having an imidazole skeleton, such as fac-tris[1-(2,6-diisopropylphenyl)-2-phenyl-1H-imidazole] iridium(III) (abbreviation: [Ir(iPrpmi)$_3$]) or tris[3-(2,6-dimethylphenyl)-7-methylimidazo[1,2-f]phenanthridinato] iridium(III) (abbreviation: [Ir(dmpimpt-Me)$_3$]); and an organometallic iridium complex in which a phenylpyridine derivative having an electron-withdrawing group is a ligand, such as bis[2-(4',6'-difluorophenyl)pyridinato-N,$C^{2'}$]iridium (III) tetrakis(1-pyrazolyl)borate (abbreviation: FIr6), bis[2-(4',6'-difluorophenyl)pyridinato-N,$C^{2'}$]iridium(III) picolinate (abbreviation: FIrpic), bis{2-[3',5'-bis(trifluoromethyl) phenyl]pyridinato-N,$C^{2'}$}iridium(III) picolinate (abbreviation: [Ir($CF_3$ppy)$_2$(pic)]), or bis[2-(4',6'-difluorophenyl)pyridinato-N,$C^{2'}$]iridium(III) acetylacetonate (abbreviation: FIracac). These are compounds exhibiting blue phosphorescent light, and are compounds having an emission wavelength peak at 440 nm to 520 nm.

Examples also include an organometallic iridium complex having a pyrimidine skeleton, such as tris(4-methyl-6-phenylpyrimidinato)iridium(III) (abbreviation: [Ir(mppm)$_3$]), tris(4-t-butyl-6-phenylpyrimidinato)iridium(III) (abbreviation: [Ir(tBuppm)$_3$]), (acetylacetonato)bis(6-methyl-4-phenylpyrimidinato)iridium(III) (abbreviation: [Ir(mppm)$_2$(acac)]), (acetylacetonato)bis(6-tert-butyl-4-phenylpyrimidinato)iridium(III) (abbreviation: [Ir(tBuppm)$_2$(acac)]), (acetylacetonato)bis[6-(2-norbornyl)-4-phenylpyrimidinato]iridium(III) (abbreviation: [Ir(nbppm)$_2$(acac)]), (acetylacetonato)bis[5-methyl-6-(2-methylphenyl)-4-phenylpyrimidinato]iridium(III) (abbreviation: [Ir(mpmppm)$_2$(acac)]), or (acetylacetonato) bis(4,6-diphenylpyrimidinato)iridium(III) (abbreviation: [Ir(dppm)$_2$(acac)]), an organometallic iridium complex having a pyrazine skeleton, such as (acetylacetonato)bis(3,5-dimethyl-2-phenylpyrazinato)iridium(III) (abbreviation: [Ir(mppr-Me)$_2$(acac)]) or (acetylacetonato)bis(5-isopropyl-3-methyl-2-phenylpyrazinato)iridium(III) (abbreviation: [Ir(mppr-iPr)$_2$(acac)]), an organometallic iridium complex having a pyridine skeleton, such as tris(2-phenylpyridinato-N,$C^{2'}$)iridium(III) (abbreviation: [Ir(ppy)$_3$]), bis(2-phenylpyridinato-N,$C^{2'}$)iridium(III) acetylacetonate (abbreviation: [Ir(ppy)$_2$(acac)]), bis(benzo[h]quinolinato)iridium(III) acetylacetonate (abbreviation: [Ir(bzq)$_2$(acac)]), tris(benzo[h]quinolinato)iridium(III) (abbreviation: [Ir(bzq)$_3$]), tris(2-phenylquinolinato-N,$C^{2'}$)iridium(III) (abbreviation: [Ir(pq)$_3$]), bis(2-phenylquinolinato-N,$C^{2'}$)iridium(III) acetylacetonate (abbreviation: [Ir(pq)$_2$(acac)]), [2-d3-methyl-(2-pyridinyl-κN)benzofuro[2,3-b]pyridine-κC]bis[2-(5-d3-methyl-2-pyridyl-κN2)phenyl-κ]iridium(III) (abbreviation: [Ir(5mppy-d3)$_2$(mbfpypy-d3)]), or [2-d3-methyl-(2-pyridinyl-κN)benzofuro[2,3-b]pyridine-κC]bis[2-(2-pyridinyl-κN)phenyl-κC]iridium(III) (abbreviation: [Ir(ppy)$_2$(mbfpypy-d3)]), and a rare earth metal complex such as tris(acetylacetonato)(monophenanthroline)terbium (III) (abbreviation: [Tb(acac)$_3$(Phen)]). These are compounds that mainly exhibit green phosphorescent light, and have an emission wavelength peak at 500 nm to 600 nm. Note that an organometallic iridium complex having a pyrimidine skeleton is particularly preferable because of its distinctively high reliability and emission efficiency.

Examples also include an organometallic iridium complex having a pyrimidine skeleton, such as (diisobutyrylmethanato)bis[4,6-bis(3-methylphenyl)pyrimidinato] iridium(III) (abbreviation: [Ir(5mdppm)$_2$(dibm)]), bis[4,6-bis(3-methylphenyl)pyrimidinato](dipivaloylmethanato) iridium(III) (abbreviation: [Ir(5mdppm)$_2$(dpm)]), or bis[4,6-di(naphthalen-1-yl)pyrimidinato](dipivaloylmethanato) iridium(III) (abbreviation: [Ir(d1npm)$_2$(dpm)]), an organometallic iridium complex having a pyrazine skeleton, such as (acetylacetonato)bis(2,3,5-triphenylpyrazinato) iridium(III) (abbreviation: [Ir(tppr)$_2$(acac)]), bis(2,3,5-triphenylpyrazinato)(dipivaloylmethanato)iridium(III) (abbreviation: [Ir(tppr)$_2$(dpm)]), or (acetylacetonato)bis[2,3-bis(4-fluorophenyl)quinoxalinato]iridium(III) (abbreviation: [Ir(Fdpq)$_2$(acac)]), an organometallic iridium complex having a pyridine skeleton, such as tris(1-phenylisoquinolinato-N,$C^{2'}$)iridium(III) (abbreviation: [Ir(piq)$_3$]) or bis(1-phenylisoquinolinato-N,$C^{2'}$)iridium(III) acetylacetonate (abbreviation: [Ir(piq)$_2$(acac)]), a platinum complex such as 2,3,7,8,12,13,17,18-octaethyl-21H,23H-porphyrin platinum(II) (abbreviation: PtOEP), and a rare earth metal complex such as tris(1,3-diphenyl-1,3-propanedionato)(monophenanthroline)europium(III) (abbreviation: [Eu(DBM)$_3$(Phen)]) or tris[1-(2-thenoyl)-3,3,3-trifluoroacetonato](monophenanthroline)europium(III) (abbreviation: [Eu(TTA)$_3$(Phen)]). These are compounds exhibiting red phosphorescent light, and have an emission peak at 600 nm to 700 nm. Furthermore, from the organometallic iridium complex having a pyrazine skeleton, red light emission with favorable chromaticity can be obtained. Note that the organometallic complex that is one embodiment of the present invention and described in Embodiment 1 also has favorable chromaticity and provide red light emission at high efficiency.

The organometallic complex described in Embodiment 1 can also be used as the phosphorescent substance. The light-emitting device of one embodiment of the present invention preferably employs the metal complex described in Embodiment 1. With the use of the organometallic complex described in Embodiment 1, a light-emitting device with favorable current efficiency and color purity can be provided.

Besides the above-described phosphorescent light-emitting substances, other known phosphorescent substances may be selected and used.

As a TADF material, a fullerene, a derivative thereof, an acridine, a derivative thereof, an eosin derivative, or the like can be used. Other examples include a metal-containing porphyrin containing magnesium (Mg), zinc (Zn), cadmium (Cd), tin (Sn), platinum (Pt), indium (In), palladium (Pd), or the like. Examples of the metal-containing porphyrin include a protoporphyrin-tin fluoride complex ($SnF_2$(Proto IX)), a mesoporphyrin-tin fluoride complex ($SnF_2$(Meso IX)), a hematoporphyrin-tin fluoride complex ($SnF_2$(Hemato IX)), a coproporphyrin tetramethyl ester-tin fluoride complex ($SnF_2$(Copro III-4Me)), an octaethylporphyrin-tin fluoride complex ($SnF_2$(OEP)), an etioporphyrin-tin fluoride complex ($SnF_2$(Etio I)), and an octaethylporphyrin-platinum chloride complex ($PtCl_2OEP$), which are represented by the following structural formulae.

[Chemical Formula 29]

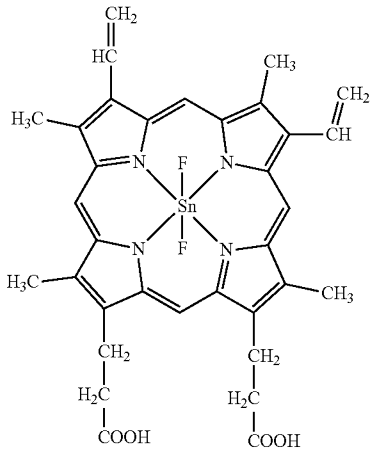

$SnF_2$(Proto IX)

-continued

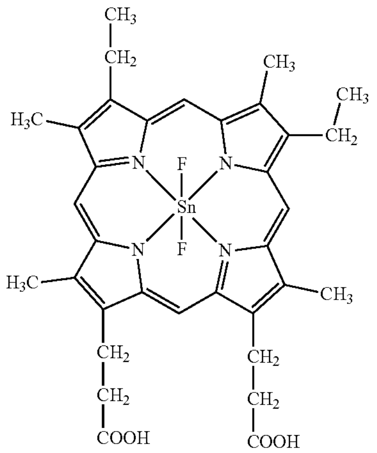

$SnF_2$(Meso IX)

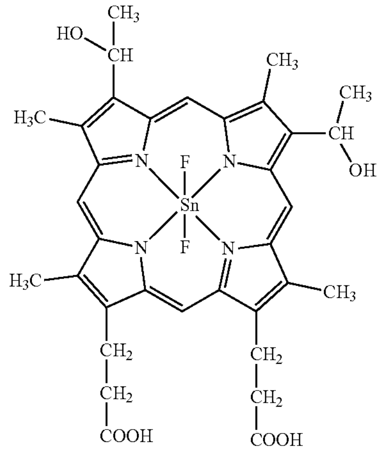

$SnF_2$(Hemato IX)

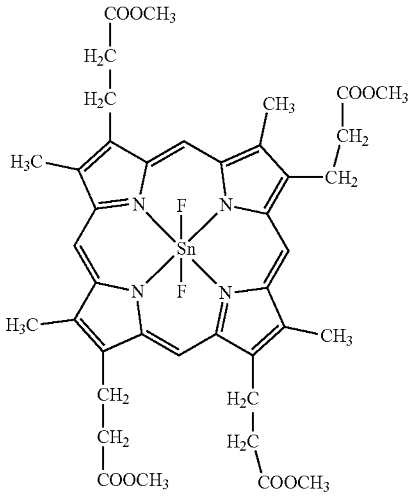

$SnF_2$(Copro III-4Me)

-continued

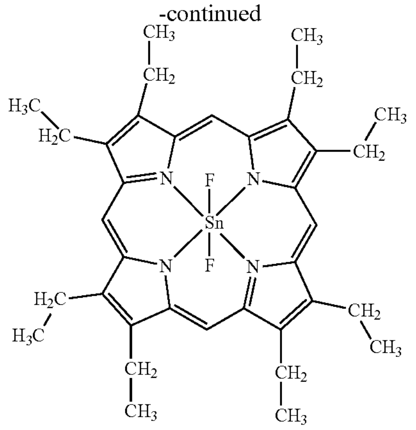

$SnF_2(OEP)$

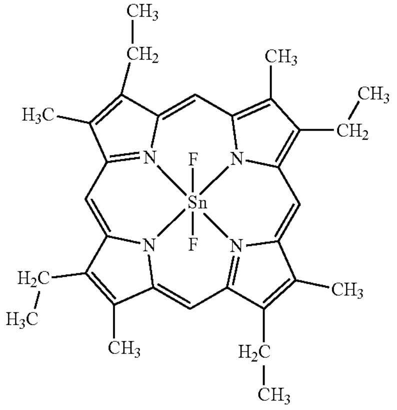

$SnF_2$(Etio I)

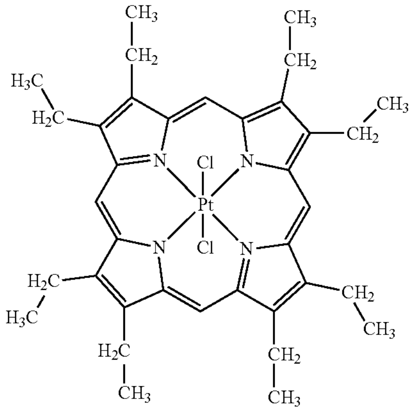

$PtCl_2OEP$

Alternatively, a heterocyclic compound having one or both of a π-electron rich heteroaromatic ring and a π-electron deficient heteroaromatic ring that is represented by the following structural formulae, such as 2-(biphenyl-4-yl)-4,6-bis(12-phenylindolo[2,3-a]carbazol-11-yl)-1,3,5-triazine (abbreviation: PIC-TRZ), 9-(4,6-diphenyl-1,3,5-triazin-2-yl)-9'-phenyl-9H,9'H-3,3'-bicarbazole (abbreviation: PCCzTzn), 2-{4-[3-(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazine-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), or 10-phenyl-10H,10'H-spiro[acridin-9,9'-anthracen]-10'-one (abbreviation: ACRSA) can be used. These heterocyclic compounds are preferable because of having both a high electron-transport property and a high hole-transport property owing to the π-electron rich heteroaromatic ring and the π-electron deficient heteroaromatic ring. Among skeletons having a π-electron deficient heteroaromatic ring, a pyridine skeleton, a diazine skeleton (a pyrimidine skeleton, a pyrazine skeleton, and a pyridazine skeleton), and a triazine skeleton are particularly preferable because of their stability and favorable reliability. In particular, a benzofuropyrimidine skeleton, a benzothienopyrimidine skeleton, a benzofuropyrazine skeleton, and a benzothienopyrazine skeleton are preferable because of their high acceptor property and favorable reliability. Among skeletons having a π-electron rich heteroaromatic ring, an acridine skeleton, a phenoxazine skeleton, a phenothiazine skeleton, a furan skeleton, a thiophene skeleton, and a pyrrole skeleton have stability and favorable reliability; therefore, at least one of these skeletons is preferably included. Note that a dibenzofuran skeleton and a dibenzothiophene skeleton are preferable as the furan skeleton and the thiophene skeleton, respectively. As the pyrrole skeleton, an indole skeleton, a carbazole skeleton, an indolocarbazole skeleton, a bicarbazole skeleton, and a 3-(9-phenyl-9H-carbazol-3-yl)-9H-carbazole skeleton are particularly preferable. Note that a substance in which a π-electron rich heteroaromatic ring and a π-electron deficient heteroaromatic ring are directly bonded to each other is particularly preferable because the electron-donating property of the π-electron rich heteroaromatic ring and the electron-accepting property of the π-electron deficient heteroaromatic ring are both increased and the energy difference between the S1 level and the T1 level becomes small, and thus thermally activated delayed fluorescence can be obtained efficiently. Note that an aromatic ring to which an electron-withdrawing group such as a cyano group is bonded may be used instead of the π-electron deficient heteroaromatic ring. As a π-electron rich skeleton, an aromatic amine skeleton, a phenazine skeleton, or the like can be used. As a π-electron deficient skeleton, a xanthene skeleton, a thioxanthene dioxide skeleton, an oxadiazole skeleton, a triazole skeleton, an imidazole skeleton, an anthraquinone skeleton, a boron-containing skeleton such as phenylborane or boranthrene, an aromatic ring or a heteroaromatic ring having a nitrile group or a cyano group, such as benzonitrile or cyanobenzene, a carbonyl skeleton such as benzophenone, a phosphine oxide skeleton, a sulfone skeleton, or the like can be used. As described above, a π-electron deficient skeleton and a π-electron rich skeleton can be used instead of at least one of the π-electron deficient heteroaromatic ring and the π-electron rich heteroaromatic ring.

[Chemical Formula 30]
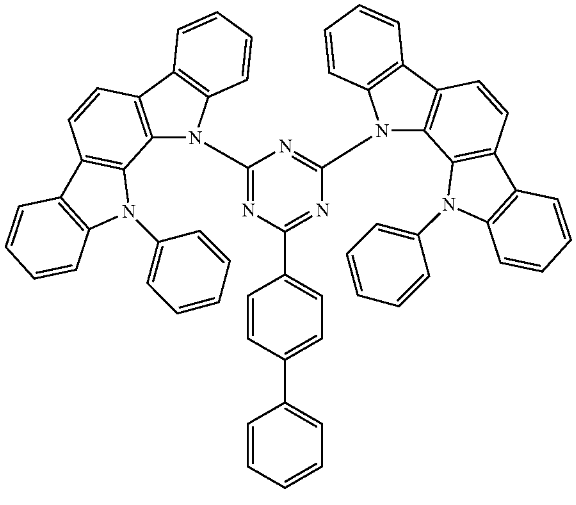
PIC-TRZ
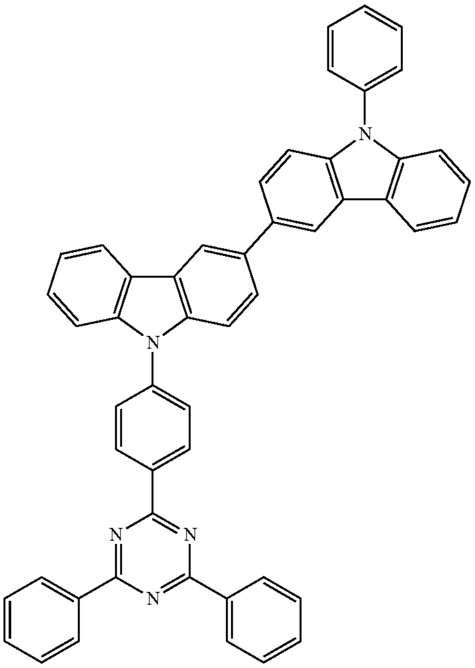
PCCzPTzn
-continued
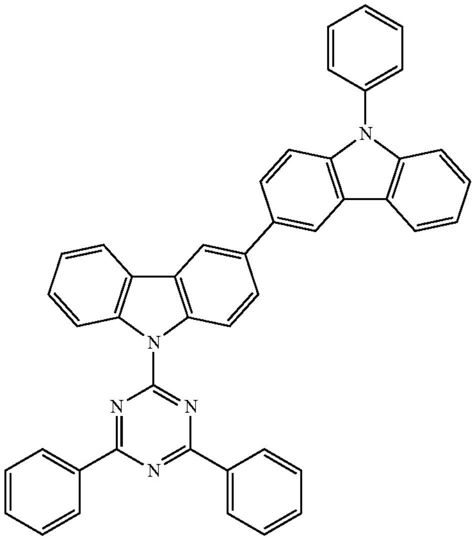
PCCzTzn
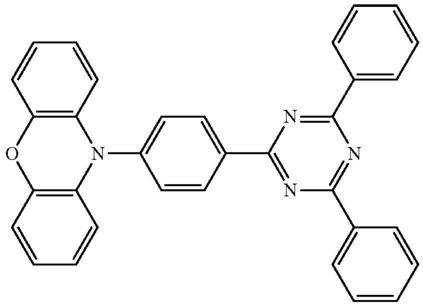
PXZ-TRZ
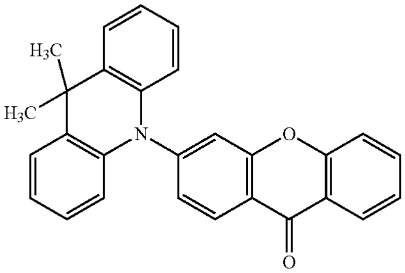
ACRXTN
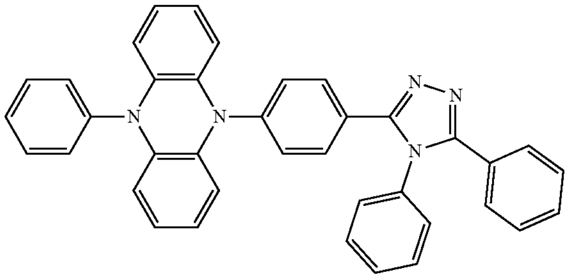
PPZ-3TPT -continued

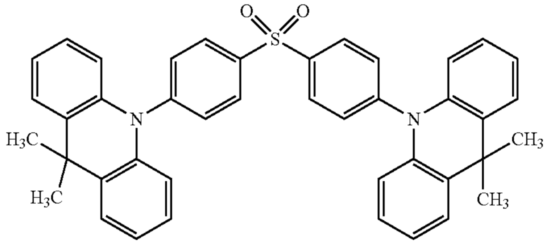

DMAC-DPS

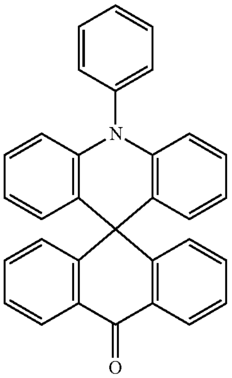

ACRSA

Note that the TADF material is a material that has a small difference between the S1 level and the T1 level and has a function of converting triplet excitation energy into singlet excitation energy by reverse intersystem crossing. Thus, it is possible to upconvert triplet excitation energy into singlet excitation energy (reverse intersystem crossing) using a little thermal energy and to efficiently generate a singlet excited state. In addition, the triplet excitation energy can be converted into light emission.

An exciplex whose excited state is formed of two kinds of substances has an extremely small difference between the S1 level and the T1 level and functions as a TADF material capable of converting triplet excitation energy into singlet excitation energy.

Note that a phosphorescent spectrum observed at low temperatures (e.g., 77 K to 10 K) is used for an index of the T1 level. When the level of energy with a wavelength of the line obtained by extrapolating a tangent to the fluorescent spectrum at a tail on the short wavelength side is the S1 level and the level of energy with a wavelength of the line obtained by extrapolating a tangent to the phosphorescent spectrum at a tail on the short wavelength side is the T1 level, the difference between S1 and T1 of the TADF material is preferably less than or equal to 0.3 eV, further preferably less than or equal to 0.2 eV.

When the TADF material is used as the light-emitting substance, the S1 level of the host material is preferably higher than the S1 level of the TADF material. In addition, the T1 level of the host material is preferably higher than the T1 level of the TADF material.

As the host material in the light-emitting layer, various carrier-transport materials such as a material having an electron-transport property, a material having a hole-transport property, and the TADF material can be used.

The material having a hole-transport property is preferably an organic compound having an amine skeleton or a π-electron rich heteroaromatic ring skeleton. Examples include a compound having an aromatic amine skeleton, such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4''-(9-phenyl-9H-carbazol-3-yl)triphenylamine (abbreviation: PCBBi1BP), 4-(1-naphthyl)-4'-(9-phenyl-9H-carbazol-3-yl)-triphenylamine (abbreviation: PCBANB), 4,4'-di(1-naphthyl)-4''-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), or N-phenyl-N-[4-(9-phenyl-9H-carbazol-3-yl)phenyl]spiro-9,9'-bifluoren-2-amine (abbreviation: PCBASF), a compound having a carbazole skeleton, such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), or 3,3'-bis(9-phenyl-9H-carbazole) (abbreviation: PCCP), a compound having a thiophene skeleton, such as 4,4',4''-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), or 4-[4-(9-phenyl-9H-fluoren-9-yl)phenyl]-6-phenyldibenzothiophene (abbreviation: DBTFLP-IV), and a compound having a furan skeleton, such as 4,4',4''-(benzene-1,3,5-triyl)tri(dibenzofuran) (abbreviation: DBF3P-II) or 4-{3-[3-(9-phenyl-9H-fluoren-9-yl)phenyl]phenyl}dibenzofuran (abbreviation: mmDBFFLBi-II). Among the above, the compound having an aromatic amine skeleton and the compound having a carbazole skeleton are preferable because these have favorable reliability, have high hole-transport properties, and contribute to a reduction in driving voltage.

As the material having an electron-transport property, for example, a metal complex such as bis(10-hydroxybenzo[h]quinolinato)beryllium(II) (abbreviation: $BeBq_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), or bis[2-(2-benzothiazolyl)phenolato]zinc(II) (abbreviation: ZnBTZ), or an organic compound having a π-electron deficient heteroaromatic ring skeleton is preferable. Examples of the organic compound having a π-electron deficient heteroaromatic ring skeleton include a heterocyclic compound having a polyazole skeleton, such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2''-(1,3,5-benzenetriyl)tris(1-phenyl-1H-benzimidazole) (abbreviation: TPBI), or 2-[3-(dibenzothiophen-4-yl)phenyl]-1-phenyl-1H-benzimidazole (abbreviation: mDBTBIm-II); a heterocyclic compound having a diazine skeleton, such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), or 4,8-bis[3-(dibenzothiophen-4-yl)phenyl]benzo[h]quinazoline (abbreviation: 4,8mDBtP2Bqn); a heterocyclic compound having a triazine skeleton, such as 2-[3'-(9,9-dimethyl-9H-fluoren-2-yl)-1,1'-biphenyl-3-yl]-4,6-diphenyl-1,3,5-triazine (abbreviation: mFBPTzn), 2-[(1,1'-biphenyl)-4-yl]-4-phenyl-6-[9,9'-spirobi(9H-fluoren)-2-yl]-1,3,5-triazine (abbreviation: BP-SFTzn), 2-{3-[3-(benzo[b]naphtho[1,2-d]furan-8-yl)phenyl]phenyl}-4,6-diphenyl-1,3,5-triazine (abbreviation: mBnfBPTzn), or 2-{3-[3-(benzo[b]naphtho[1,2-d]furan-6-yl)phenyl]phenyl}-4,6-diphenyl-1,3,5-triazine (abbreviation: mBnfBPTzn-02); and a heterocyclic compound having a pyridine skeleton, such as 3,5-bis[3-(9H-carbazol-9-yl)phenyl]pyridine (abbreviation: 35DCzPPy) or 1,3,5-tri[3-(3-pyridyl)phenyl]benzene (abbreviation: TmPyPB). Among the above materials, the heterocyclic compound having a diazine skeleton, the heterocyclic compound having a triazine skeleton, and the heterocyclic compound having a pyridine skeleton have high reliability and thus are preferable. In particular, the heterocyclic compound having a diazine (pyrimidine or pyrazine) skeleton has a high electron-transport property and contributes to a reduction in driving voltage.

As the TADF material that can be used as the host material, the above-mentioned materials given as TADF materials can also be used. When the TADF material is used as the host material, triplet excitation energy generated in the TADF material is converted into singlet excitation energy by reverse intersystem crossing and transferred to the light-emitting substance, whereby the emission efficiency of the light-emitting device can be increased. At this time, the TADF material functions as an energy donor, and the light-emitting substance functions as an energy acceptor.

This is very effective in the case where the light-emitting substance is a fluorescent substance. In this case, the S1 level of the TADF material is preferably higher than the S1 level of the fluorescent substance in order to achieve a high emission efficiency. Furthermore, the T1 level of the TADF material is preferably higher than the S1 level of the fluorescent substance. Therefore, the T1 level of the TADF material is preferably higher than the T1 level of the fluorescent substance.

It is also preferable to use a TADF material that exhibits light emission overlapping with the wavelength of a lowest-energy-side absorption band of the fluorescent substance. This enables smooth transfer of excitation energy from the TADF material to the fluorescent substance and accordingly enables efficient light emission, which is preferable.

In order that singlet excitation energy is efficiently generated from the triplet excitation energy by reverse intersystem crossing, carrier recombination preferably occurs in the TADF material. It is also preferable that the triplet excitation energy generated in the TADF material not be transferred to the triplet excitation energy of the fluorescent substance. For that reason, the fluorescent substance preferably has a protective group around a luminophore (a skeleton that causes light emission) of the fluorescent substance. As the protective group, a substituent having no π bond and saturated hydrocarbon are preferably used. Specific examples include an alkyl group having 3 to 10 carbon atoms, a substituted or unsubstituted cycloalkyl group having 3 to 10 carbon atoms, and a trialkylsilyl group having 3 to 10 carbon atoms. It is further preferable that the fluorescent substance have a plurality of protective groups. The substituent having no π bond has a poor carrier-transport property; thus, the TADF material and the luminophore of the fluorescent substance can be made away from each other with little influence on carrier transportation or carrier recombination. Here, the luminophore refers to an atomic group (skeleton) that causes light emission in a fluorescent substance. The luminophore is preferably a skeleton having a π bond, further preferably includes an aromatic ring, and still further preferably includes a condensed aromatic ring or a condensed heteroaromatic ring. Examples of the condensed aromatic ring and the condensed heteroaromatic ring include a phenanthrene skeleton, a stilbene skeleton, an acridone skeleton, a phenoxazine skeleton, and a phenothiazine skeleton. Specifically, a fluorescent substance having any of a naphthalene skeleton, an anthracene skeleton, a fluorene skeleton, a chrysene skeleton, a triphenylene skeleton, a tetracene skeleton, a pyrene skeleton, a perylene skeleton, a coumarin skeleton, a quinacridone skeleton, and a naphthobisbenzofuran skeleton is preferable because of its high fluorescence quantum yield.

In the case where a fluorescent substance is used as the light-emitting substance, a material having an anthracene skeleton is suitable for the host material. The use of a substance having an anthracene skeleton as a host material for a fluorescent substance makes it possible to achieve a light-emitting layer with a favorable emission efficiency and durability. As the substance having an anthracene skeleton that is used as the host material, a substance having a diphenylanthracene skeleton, in particular, a substance having a 9,10-diphenylanthracene skeleton, is preferable because of its chemical stability. The host material preferably has a carbazole skeleton because the hole-injection and hole-transport properties are improved; further preferably, the host material has a benzocarbazole skeleton in which a benzene ring is further condensed to carbazole because the HOMO level thereof is shallower than that of carbazole by approximately 0.1 eV and thus holes enter the host material easily. In particular, the host material having a dibenzocarbazole skeleton is preferable because its HOMO level is shallower than that of carbazole by approximately 0.1 eV so that holes enter the host material easily, the hole-transport property is improved, and the heat resistance is increased. Accordingly, a substance that has both a 9,10-diphenylanthracene skeleton and a carbazole skeleton (or a benzocarbazole skeleton or a dibenzocarbazole skeleton) is further preferable as the host material. Note that in terms of the hole-injection and hole-transport properties described above, instead of a carbazole skeleton, a benzofluorene skeleton or a dibenzofluorene skeleton may be used. Examples of such a substance include 9-phenyl-3-[4-(10-phenyl-9-anthryl)phenyl]-9H-carbazole (abbreviation: PCzPA), 3-[4-(1-naphthyl)-phenyl]-9-phenyl-9H-carbazole (abbreviation: PCPN), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), 9-phenyl-10-{4-(9-phenyl-9H-fluoren-9-yl)biphenyl-4'-yl}anthracene (abbreviation: FLPPA), and 9-(1-naphthyl)-10-[4-(2-naphthyl)phenyl]anthracene (abbreviation: αN-βNPAnth). In particular, CzPA, cgDBCzPA, 2mBnfPPA, and PCzPA are preferably selected because they exhibit highly favorable characteristics.

Note that a host material may be a material of a mixture of a plurality of kinds of substances; in the case of using a mixed host material, it is preferable to mix a material having an electron-transport property with a material having a hole-transport property. When the material having an electron-transport property is mixed with the material having a hole-transport property, the transport property of the light-emitting layer 193 can be easily adjusted and a recombination region can be easily controlled. The weight ratio of the content of the material having a hole-transport property to the content of the material having an electron-transport property may be 1:19 to 19:1.

Note that a phosphorescent substance can be used as part of the mixed material. When a fluorescent substance is used as the light-emitting substance, a phosphorescent substance can be used as an energy donor for supplying excitation energy to the fluorescent substance. Note that the organometallic complex described in Embodiment 1 can also be used as the phosphorescent substance.

An exciplex may be formed by these mixed materials. A combination is preferably selected so as to form an exciplex that exhibits light emission overlapping with the wavelength of a lowest-energy-side absorption band of a light-emitting substance, because energy can be transferred smoothly and light emission can be efficiently obtained. The use of the structure is preferable because the driving voltage is also reduced.

Note that at least one of the materials forming an exciplex may be a phosphorescent substance. In this case, triplet excitation energy can be efficiently converted into singlet excitation energy by reverse intersystem crossing.

A combination of a material having an electron-transport property and a material having a hole-transport property whose HOMO level is higher than or equal to the HOMO level of the material having an electron-transport property is preferable for forming an exciplex efficiently. In addition, the LUMO level of the material having a hole-transport property is preferably higher than or equal to the LUMO level of the material having an electron-transport property. Note that the LUMO levels and the HOMO levels of the materials can be derived from the electrochemical characteristics (the reduction potentials and the oxidation potentials) of the materials that are measured by cyclic voltammetry (CV).

Note that the formation of an exciplex can be confirmed by a phenomenon in which the emission spectrum of the mixed film in which the material having a hole-transport property and the material having an electron-transport property are mixed is shifted to the longer wavelength side than the emission spectrum of each of the materials (or has another peak on the longer wavelength side), observed by comparison of the emission spectrum of the material having a hole-transport property, the emission spectrum of the material having an electron-transport property, and the emission spectrum of the mixed film of these materials, for example. Alternatively, the formation of an exciplex can be confirmed by a difference in transient response, such as a phenomenon in which the transient photoluminescence (PL) lifetime of the mixed film has longer lifetime components or has a larger proportion of delayed components than that of each of the materials, observed by comparison of the transient PL of the material having a hole-transport property, the transient PL of the material having an electron-transport property, and the transient PL of the mixed film of these materials. The transient PL can be rephrased as transient electroluminescence (EL). That is, the formation of an exciplex can also be confirmed by a difference in transient response observed by comparison of the transient EL of the material having a hole-transport property, the transient EL of the material having an electron-transport property, and the transient EL of the mixed film of these materials.

The electron-transport layer 194 is a layer containing a substance having an electron-transport property. As the substance having an electron-transport property, it is possible to use any of the above-listed substances having electron-transport properties that can be used as the host material.

The electron mobility of the electron-transport layer 194 in the case where the square root of the electric field strength [V/cm] is 600 is preferably higher than or equal to $1\times10^{-7}$ $cm^2/Vs$ and lower than or equal to $5\times10^{-5}$ $cm^2/Vs$. Lowering the electron-transport property of the electron-transport layer 194 enables control of the amount of electrons injected into the light-emitting layer and can prevent the light-emitting layer from having excess electrons. The electron-transport layer preferably contains a material having an electron-transport property and an alkali metal, an alkali metal itself, a compound thereof, or a complex thereof. It is particularly preferable that this structure be employed when the hole-injection layer is formed using a composite material that includes a material having a hole-transport property with a relatively deep HOMO level of −5.7 eV or higher and −5.4 eV or lower, in which case a long lifetime can be achieved. Here, the material having an electron-transport property preferably has a HOMO level of higher than or equal to −6.0 eV. The material having an electron-transport property is preferably an organic compound having an anthracene skeleton and is further preferably an organic compound having both an anthracene skeleton and a heterocyclic skeleton. The heterocyclic skeleton is preferably a nitrogen-containing five-membered ring skeleton or a nitrogen-containing six-membered ring skeleton, and particularly preferably a nitrogen-containing five-membered ring skeleton or a nitrogen-containing six-membered ring skeleton including two heteroatoms in the ring, such as a pyrazole ring, an imidazole ring, an oxazole ring, a thiazole ring, a pyrazine ring, a pyrimidine ring, or a pyridazine ring. In addition, it is preferable that the alkali metal, the alkali metal itself, the compound thereof, and the complex thereof have an 8-hydroxyquinolinato structure. Specific examples include 8-hydroxyquinolinato-lithium (abbreviation: Liq) and 8-hydroxyquinolinato-sodium (abbreviation: Naq). In particular, a complex of a monovalent metal ion, especially a complex of lithium is preferable, and Liq is further preferable. Note that in the case where the 8-hydroxyquinolinato structure is included, a methyl-substituted product (e.g., a 2-methyl-substituted product or a 5-methyl-substituted product) thereof or the like can also be used. There is preferably a difference in the concentration (including 0) of the alkali metal, the alkali metal itself, the compound thereof, or the complex thereof in the electron-transport layer in the thickness direction.

As the electron-transport layer 195, a layer containing an alkali metal, an alkaline earth metal, or a compound thereof, such as lithium fluoride (LiF), cesium fluoride (CsF), calcium fluoride ($CaF_2$), or 8-hydroxyquinolinato-lithium (abbreviation: Liq), may be provided between the electron-transport layer 194 and the second electrode 182. An electride or a layer that is formed using a substance having an electron-transport property and that includes an alkali metal, an alkaline earth metal, or a compound thereof can be used as the electron-transport layer 195. Examples of the electride include a substance in which electrons are added at high concentration to a mixed oxide of calcium and aluminum.

Note that as the electron-transport layer 195, it is possible to use a layer that contains a substance having an electron-transport property (preferably an organic compound having a bipyridine skeleton) and contains a fluoride of the alkali metal or the alkaline earth metal at a concentration higher than or equal to that at which the electron-transport layer 195 becomes in a microcrystalline state (50 wt % or higher). Since the layer has a low refractive index, a light-emitting device having more favorable external quantum efficiency can be provided.

Instead of the electron-transport layer 195, the charge-generation layer 196 may be provided (FIG. 1B). The charge-generation layer 196 refers to a layer capable of injecting holes into a layer in contact therewith on the cathode side and injecting electrons into a layer in contact therewith on the anode side when supplied with a potential. The charge-generation layer 196 includes at least a P-type layer 197. The P-type layer 197 is preferably formed using the composite materials given above as the material that can form the hole-injection layer 191. The P-type layer 197 may be formed by stacking a film containing the above acceptor material as a material included in the composite material and a film containing the above hole-transport material. When a potential is applied to the P-type layer 197, electrons are injected into the electron-transport layer 194 and holes are injected into the second electrode 182 that is a cathode; thus, the light-emitting device operates. Since the organic compound of one embodiment of the present invention has a low refractive index, using the organic compound for the P-type layer 197 enables the light-emitting device to have high external quantum efficiency.

Note that one or both of an electron-relay layer 198 and an electron-injection buffer layer 199 are preferably provided in the charge-generation layer 196 in addition to the P-type layer 197.

The electron-relay layer 198 contains at least a substance having an electron-transport property and has a function of preventing an interaction between the electron-injection buffer layer 199 and the P-type layer 197 to transfer electrons smoothly. The LUMO level of the substance having an electron-transport property contained in the electron-relay layer 198 is preferably between the LUMO level of an acceptor substance in the P-type layer 197 and the LUMO level of a substance contained in a layer of the electron-transport layer 194 in contact with the charge-generation layer 196. A specific energy level of the LUMO level of the substance having an electron-transport property used for the electron-relay layer 198 may be higher than or equal to −5.0 eV, preferably higher than or equal to −5.0 eV and lower than or equal to −3.0 eV Note that as the substance having an electron-transport property used for the electron-relay layer 198, a phthalocyanine-based material or a metal complex having a metal-oxygen bond and an aromatic ligand is preferably used.

For the electron-injection buffer layer 199, a substance having a high electron-injection property, such as an alkali metal, an alkaline earth metal, a rare earth metal, or a compound thereof (an alkali metal compound (including an oxide such as lithium oxide, a halide, and a carbonate such as lithium carbonate or cesium carbonate), an alkaline earth metal compound (including an oxide, a halide, and a carbonate), or a rare earth metal compound (including an oxide, a halide, and a carbonate)), can be used.

In the case where the electron-injection buffer layer 199 is formed so as to contain the substance having an electron-transport property and a donor substance, an organic compound such as tetrathianaphthacene (abbreviation: TTN), nickelocene, or decamethylnickelocene can be used as the donor substance, as well as an alkali metal, an alkaline earth metal, a rare earth metal, a compound thereof (an alkali metal compound (including an oxide such as lithium oxide, a halide, and a carbonate such as lithium carbonate or cesium carbonate), an alkaline earth metal compound (including an oxide, a halide, and a carbonate), or a rare earth metal compound (including an oxide, a halide, and a carbonate)). Note that as the substance having an electron-transport property, a material similar to the above-described material forming the electron-transport layer 194 can be used for the formation.

As a substance forming the second electrode 182, a metal, an alloy, an electrically conductive compound, or a mixture thereof having a low work function (specifically, 3.8 eV or less) or the like can be used. As specific examples of such a cathode material, elements belonging to Group 1 or Group 2 of the periodic table, such as alkali metals, e.g., lithium (Li) and cesium (Cs), magnesium (Mg), calcium (Ca), and strontium (Sr), alloys containing these (MgAg and AlLi), rare earth metals such as europium (Eu) and ytterbium (Yb), alloys containing these rare earth metals, and the like can be given. However, when the electron-injection layer is provided between the second electrode 182 and the electron-transport layer, for the second electrode 182, a variety of conductive materials such as Al, Ag, ITO, and indium oxide-tin oxide containing silicon or silicon oxide can be used regardless of their work functions. Films of these conductive materials can be formed by a dry process such as a vacuum evaporation method or a sputtering method, an ink-jet method, a spin coating method, or the like. Alternatively, the films may be formed by a wet process using a sol-gel method or a wet process using a paste of a metal material.

Various methods can be used as a method for forming the EL layer 183 regardless of whether it is a dry process or a wet process. For example, a vacuum evaporation method, a gravure printing method, an offset printing method, a screen printing method, an ink-jet method, a spin coating method, or the like may be used.

Different deposition methods may be used to form the electrodes or the layers described above.

The structure of the layers provided between the first electrode 181 and the second electrode 182 is not limited to the above structure. However, a structure is preferable in which a light-emitting region where holes and electrons recombine is provided at a position away from the first electrode 181 and the second electrode 182 so as to prevent quenching caused by the proximity of the light-emitting region and a metal used for electrodes and carrier-injection layers.

Furthermore, in order to inhibit energy transfer from an exciton generated in the light-emitting layer, it is preferable to form the hole-transport layer and the electron-transport layer that are in contact with the light-emitting layer 193, particularly a carrier-transport layer closer to the recombination region in the light-emitting layer 193, using the light-emitting material of the light-emitting layer or a substance having a wider band gap than the light-emitting material included in the light-emitting layer.

Next, an embodiment of a light-emitting device with a structure where a plurality of light-emitting units are stacked (also referred to as a stacked-type element or a tandem element) will be described with reference to FIG. 1C. This light-emitting device is a light-emitting device including a plurality of light-emitting units between an anode and a cathode. One light-emitting unit has substantially the same structure as the EL layer 183, which is illustrated in FIG. 1A. In other words, the light-emitting device illustrated in FIG. 1C can be called a light-emitting device including a plurality of light-emitting units, and the light-emitting device illustrated in FIG. 1A or FIG. 1B can be called a light-emitting device including one light-emitting unit.

Figure 1C:
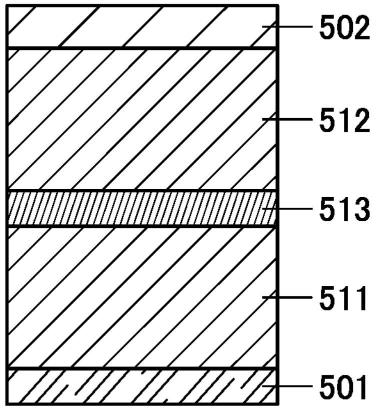

In FIG. 1C, a first light-emitting unit 511 and a second light-emitting unit 512 are stacked between an anode 501 and a cathode 502, and a charge-generation layer 513 is provided between the first light-emitting unit 511 and the second light-emitting unit 512. The anode 501 and the cathode 502 correspond, respectively, to the first electrode 181 and the second electrode 182 in FIG. 1A, and the same substance as what is given in the description for FIG. 1A can be used. Furthermore, the first light-emitting unit 511 and the second light-emitting unit 512 may have the same structure or different structures.

The charge-generation layer 513 has a function of injecting electrons into one of the light-emitting units and injecting holes into the other of the light-emitting units when a voltage is applied to the anode 501 and the cathode 502. That is, in FIG. 1C, any layer can be used as the charge-generation layer 513 as long as the layer injects electrons into the first light-emitting unit 511 and injects holes into the second light-emitting unit 512 in the case where a voltage is applied such that the potential of the anode is higher than the potential of the cathode.

The charge-generation layer 513 is preferably formed with a structure similar to that of the charge-generation layer 196 described with reference to FIG. 1B. A composite material of an organic compound and a metal oxide has an excellent carrier-injection property and an excellent carrier-transport property; thus, low-voltage driving and low-current driving can be achieved. Note that in the case where the anode-side surface of a light-emitting unit is in contact with the charge-generation layer 513, the charge-generation layer 513 can also serve as a hole-injection layer of the light-emitting unit; therefore, a hole-injection layer is not necessarily provided in the light-emitting unit.

In the case where the electron-injection buffer layer 199 is provided in the charge-generation layer 513, the electron-injection buffer layer 199 serves as an electron-injection layer in the light-emitting unit on the anode side; therefore, an electron-injection layer is not necessarily formed in the light-emitting unit on the anode side.

The light-emitting device having two light-emitting units is described with reference to FIG. 1C; however, the same can also be applied to a light-emitting device in which three or more light-emitting units are stacked. With a plurality of light-emitting units partitioned by the charge-generation layer 513 between a pair of electrodes as in the light-emitting device of this embodiment, it is possible to provide a long-life element that can emit light with high luminance at a low current density. Moreover, a light-emitting apparatus that can be driven at a low voltage and has low power consumption can be achieved.

Furthermore, when emission colors of the light-emitting units are different, light emission of a desired color can be obtained from the light-emitting device as a whole. For example, in a light-emitting device having two light-emitting units, emission colors of red and green are obtained in the first light-emitting unit and an emission color of blue is obtained in the second light-emitting unit, whereby a light-emitting device that emits white light as the whole light-emitting device can be obtained.

The above-described layers and electrodes such as the EL layer 183, the first light-emitting unit 511, the second light-emitting unit 512, and the charge-generation layer can be formed by a method such as an evaporation method (including a vacuum evaporation method), a droplet discharge method (also referred to as an ink-jet method), a coating method, or a gravure printing method. Those may include a low molecular material, a middle molecular material (including an oligomer and a dendrimer), or a high molecular material.

The structures described in this embodiment can be used in an appropriate combination with the structures described in the other embodiments and the like.

Embodiment 3

In this embodiment, a light-emitting apparatus using the light-emitting device described in Embodiment 2 will be described.

Figures 2A, 2B:
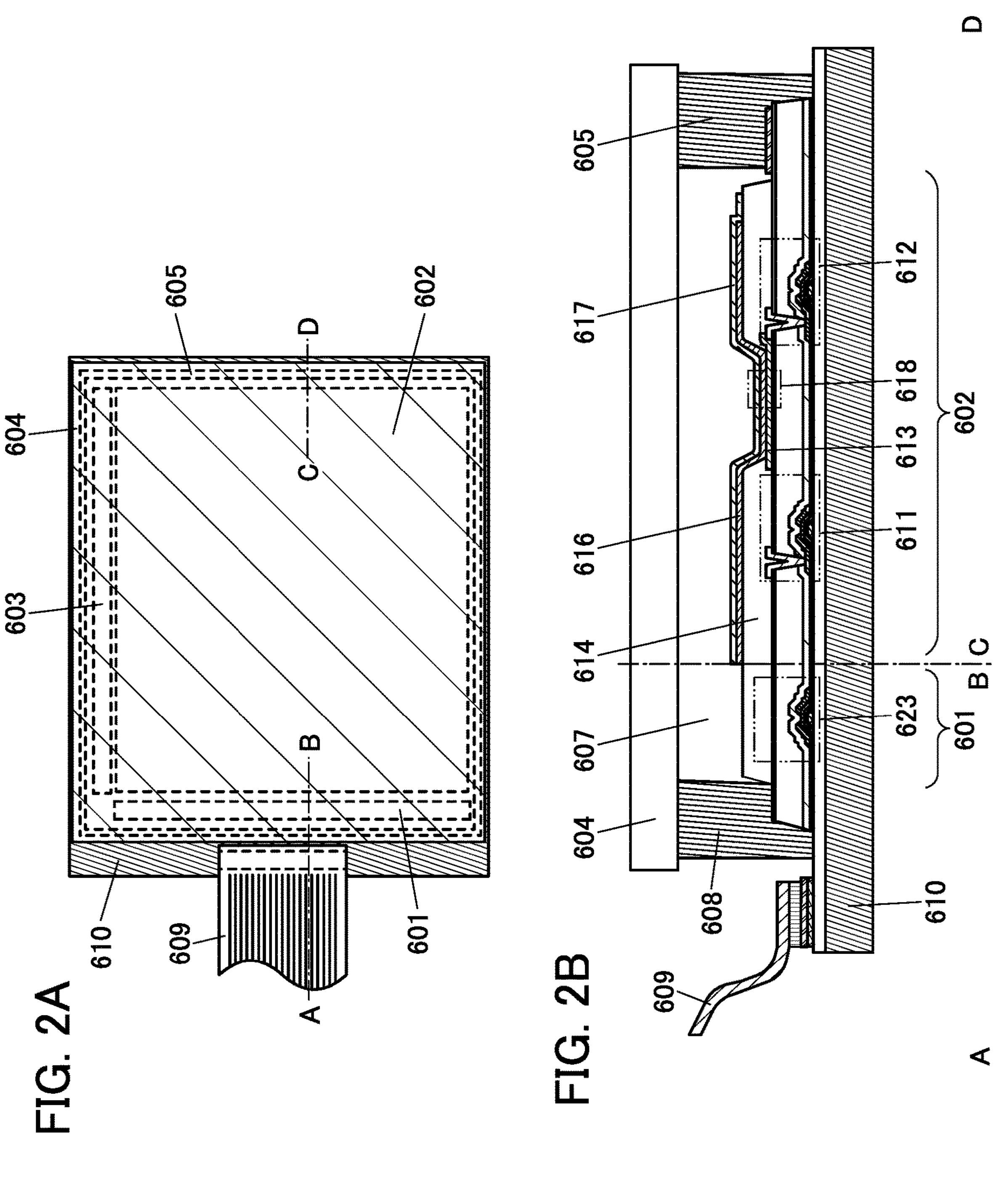
FIG. 2A and FIG. 2B are conceptual diagrams of an active matrix light-emitting apparatus.

In this embodiment, a light-emitting apparatus fabricated using the light-emitting device described in Embodiment 2 will be described with reference to FIG. 2. Note that FIG. 2A is a top view illustrating the light-emitting apparatus, and FIG. 2B is a cross-sectional view taken along A-B and C-D in FIG. 2A. This light-emitting apparatus includes a driver circuit portion (source line driver circuit) 601, a pixel portion 602, and a driver circuit portion (gate line driver circuit) 603, which are for controlling light emission of a light-emitting device and are illustrated with dotted lines. Furthermore, 604 denotes a sealing substrate, 605 denotes a sealant, and the inside surrounded by the sealant 605 is a space 607.

Note that a lead wiring 608 is a wiring for transmitting signals to be input to the source line driver circuit 601 and the gate line driver circuit 603 and receives a video signal, a clock signal, a start signal, a reset signal, and the like from an FPC (flexible printed circuit) 609 serving as an external input terminal. Although only the FPC is illustrated here, a printed wiring board (PWB) may be attached to this FPC. The light-emitting apparatus in this specification includes not only the light-emitting apparatus itself but also the apparatus provided with the FPC or the PWB.

Next, a cross-sectional structure will be described with reference to FIG. 2B. The driver circuit portion and the pixel portion are formed over an element substrate 610. Here, the source line driver circuit 601, which is the driver circuit portion, and one pixel of the pixel portion 602 are illustrated.

The element substrate 610 may be fabricated using a substrate containing glass, quartz, an organic resin, a metal, an alloy, a semiconductor, or the like, or a plastic substrate formed of FRP (Fiber Reinforced Plastic), PVF (polyvinyl fluoride), polyester, an acrylic resin, or the like.

There is no particular limitation on the structure of transistors used in pixels and driver circuits. For example, inverted staggered transistors may be used, or staggered transistors may be used. Furthermore, top-gate transistors or bottom-gate transistors may be used. There is no particular limitation on a semiconductor material used for the transistors, and for example, silicon, germanium, silicon carbide, gallium nitride, or the like can be used. Alternatively, an oxide semiconductor containing at least one of indium, gallium, and zinc, such as In—Ga—Zn-based metal oxide, may be used.

There is no particular limitation on the crystallinity of a semiconductor material used for the transistors, and either an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used, in which case deterioration of the transistor characteristics can be suppressed.

Here, an oxide semiconductor is preferably used for semiconductor devices such as the transistors provided in the pixels and driver circuits and transistors used for touch sensors described later, and the like. In particular, an oxide semiconductor having a wider band gap than silicon is preferably used. The use of an oxide semiconductor having a wider band gap than silicon can reduce the off-state current of the transistors.

The oxide semiconductor preferably contains at least indium (In) or zinc (Zn). Further preferably, the oxide semiconductor contains an oxide represented by an In-M-Zn-based oxide (M represents a metal such as Al, Ti, Ga, Ge, Y, Zr, Sn, La, Ce, or Hf).

As a semiconductor layer, it is particularly preferable to use an oxide semiconductor film including a plurality of crystal parts whose c-axes are aligned perpendicular to a surface on which the semiconductor layer is formed or the top surface of the semiconductor layer and in which the adjacent crystal parts have no grain boundary.

The use of such a material for the semiconductor layer makes it possible to achieve a highly reliable transistor in which a change in the electrical characteristics is reduced.

Charge accumulated in a capacitor through a transistor including the above-described semiconductor layer can be retained for a long time because of the low off-state current of the transistor. The use of such a transistor in a pixel allows a driver circuit to stop while the gray level of an image displayed on each display region is maintained. As a result, an electronic device with significantly reduced power consumption can be achieved.

For stable characteristics or the like of the transistor, a base film is preferably provided. The base film can be formed to be a single layer or a stacked layer using an inorganic insulating film such as a silicon oxide film, a silicon nitride film, a silicon oxynitride film, or a silicon nitride oxide film. The base film can be formed by a sputtering method, a CVD (Chemical Vapor Deposition) method (e.g., a plasma CVD method, a thermal CVD method, or an MOCVD (Metal Organic CVD) method), an ALD (Atomic Layer Deposition) method, a coating method, a printing method, or the like. Note that the base film is not necessarily provided when not needed.

Note that an FET 623 is illustrated as a transistor formed in the source line driver circuit 601. The driver circuit can be formed using various circuits such as a CMOS circuit, a PMOS circuit, and an NMOS circuit. Although a driver-integrated type in which the driver circuit is formed over the substrate is described in this embodiment, the driver circuit is not necessarily formed over the substrate and can be formed outside.

The pixel portion 602 is formed with a plurality of pixels each including a switching FET 611, a current control FET 612, and a first electrode 613 electrically connected to a drain of the current control FET 612; however, without being limited thereto, a pixel portion in which three or more FETs and a capacitor are combined may be employed.

Note that an insulator 614 is formed to cover an end portion of the first electrode 613. The insulator 614 can be formed using a positive photosensitive acrylic resin film here.

In order to improve the coverage with an EL layer or the like to be formed later, the insulator 614 is formed so as to have a curved surface with curvature at its upper end portion or lower end portion. For example, in the case where a positive photosensitive acrylic resin is used as a material for the insulator 614, only the upper end portion of the insulator 614 preferably has a curved surface with a curvature radius (0.2 μm to 3 μm). As the insulator 614, either a negative photosensitive resin or a positive photosensitive resin can be used.

An EL layer 616 and a second electrode 617 are formed over the first electrode 613. Here, as a material used for the first electrode 613 functioning as an anode, a material with a high work function is desirably used. For example, a single-layer film of an ITO film, an indium tin oxide film containing silicon, an indium oxide film containing zinc oxide at 2 wt % to 20 wt %, a titanium nitride film, a chromium film, a tungsten film, a Zn film, a Pt film, or the like, a stacked layer of a titanium nitride film and a film containing aluminum as its main component, a three-layer structure of a titanium nitride film, a film containing aluminum as its main component, and a titanium nitride film, or the like can be used. Note that the stacked-layer structure achieves low wiring resistance, a favorable ohmic contact, and a function as an anode.

The EL layer 616 is formed by any of a variety of methods such as an evaporation method using an evaporation mask, an ink-jet method, and a spin coating method. The EL layer 616 has the structure described in Embodiment 2. As another material included in the EL layer 616, a low molecular compound or a high molecular compound (including an oligomer or a dendrimer) may be used.

As a material used for the second electrode 617, which is formed over the EL layer 616 and functions as a cathode, a material with a low work function (e.g., Al, Mg, Li, Ca, or an alloy or a compound thereof (e.g., MgAg, MgIn, or AlLi)) is preferably used. Note that in the case where light generated in the EL layer 616 passes through the second electrode 617, it is preferable to use, for the second electrode 617, a stacked layer of a thin metal film and a transparent conductive film (e.g., ITO, indium oxide containing zinc oxide at 2 wt % to 20 wt %, indium tin oxide containing silicon, or zinc oxide (ZnO)).

Note that the light-emitting device is formed with the first electrode 613, the EL layer 616, and the second electrode 617. The light-emitting device is the light-emitting device described in Embodiment 2. A plurality of light-emitting devices are formed in the pixel portion, and the light-emitting apparatus of this embodiment may include both the light-emitting device described in Embodiment 2 and a light-emitting device having a different structure.

The sealing substrate 604 and the element substrate 610 are attached to each other using the sealant 605, so that a light-emitting device 618 is provided in the space 607 surrounded by the element substrate 610, the sealing substrate 604, and the sealant 605. The space 607 is filled with a filler, and may be filled with an inert gas (e.g., nitrogen or argon) or the sealant. It is preferable that the sealing substrate be provided with a recessed portion and a drying agent be provided in the recessed portion, in which case deterioration due to influence of moisture can be inhibited.

Note that an epoxy-based resin, glass frit, or the like is preferably used for the sealant 605. Furthermore, these materials are preferably materials that transmit moisture and oxygen as little as possible. As the material used for the sealing substrate 604, in addition to a glass substrate and a quartz substrate, a plastic substrate formed of FRP (Fiber Reinforced Plastics), PVF (polyvinyl fluoride), polyester, an acrylic resin, or the like can be used.

Although not illustrated in FIG. 2, a protective film may be provided over the second electrode. The protective film may be formed using an organic resin film or an inorganic insulating film. The protective film may be formed so as to cover an exposed portion of the sealant 605. The protective film can be provided to cover surfaces and side surfaces of the pair of substrates and exposed side surfaces of a sealing layer, an insulating layer, and the like.

For the protective film, a material that is less likely to transmit an impurity such as water can be used. Thus, diffusion of an impurity such as water from the outside into the inside can be effectively inhibited.

As a material included in the protective film, an oxide, a nitride, a fluoride, a sulfide, a ternary compound, a metal, a polymer, or the like can be used; for example, it is possible to use a material containing aluminum oxide, hafnium oxide, hafnium silicate, lanthanum oxide, silicon oxide, strontium titanate, tantalum oxide, titanium oxide, zinc oxide, niobium oxide, zirconium oxide, tin oxide, yttrium oxide, cerium oxide, scandium oxide, erbium oxide, vanadium oxide, indium oxide, or the like; a material containing aluminum nitride, hafnium nitride, silicon nitride, tantalum nitride, titanium nitride, niobium nitride, molybdenum nitride, zirconium nitride, gallium nitride, or the like; or a material containing a nitride containing titanium and aluminum, an oxide containing titanium and aluminum, an oxide containing aluminum and zinc, a sulfide containing manganese and zinc, a sulfide containing cerium and strontium, an oxide containing erbium and aluminum, an oxide containing yttrium and zirconium, or the like.

The protective film is preferably formed using a deposition method that enables favorable step coverage. One such method is an atomic layer deposition (ALD) method. A material that can be formed by an ALD method is preferably used for the protective film. With the use of an ALD method, a dense protective film with reduced defects such as cracks and pinholes or with a uniform thickness can be formed. Furthermore, damage caused to a process member in forming the protective film can be reduced.

By an ALD method, a uniform protective film with few defects can be formed even on a surface with a complex uneven shape or upper, side, and lower surfaces of a touch panel.

As described above, the light-emitting apparatus fabricated using the light-emitting device described in Embodiment 2 can be obtained.

For the light-emitting apparatus in this embodiment, the light-emitting device described in Embodiment 2 is used and thus a light-emitting apparatus having favorable characteristics can be obtained. Specifically, since the light-emitting device described in Embodiment 2 has a high emission efficiency, the light-emitting apparatus with low power consumption can be obtained.

Figure 3A:
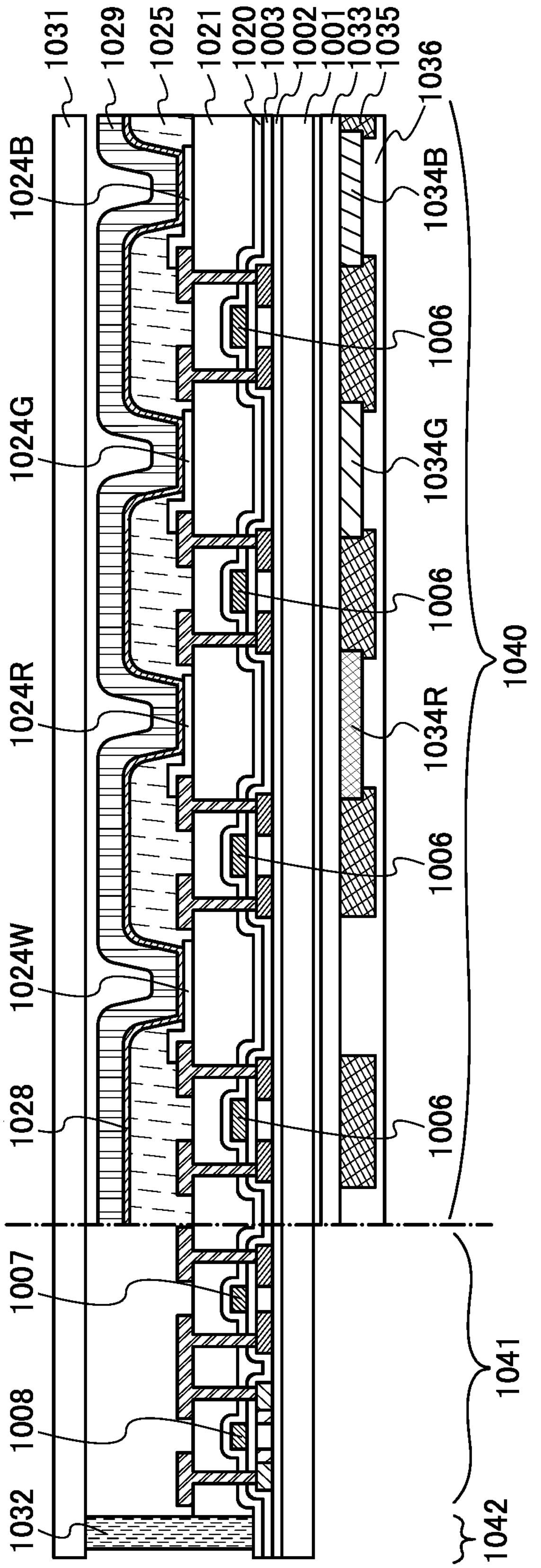
FIG. 3A and FIG. 3B are conceptual diagrams of active matrix light-emitting apparatuses.

FIG. 3 illustrates examples of a light-emitting apparatus in which full color display is achieved by formation of light-emitting devices exhibiting white light emission and provision of coloring layers (color filters) and the like. FIG. 3A illustrates a substrate 1001, a base insulating film 1002, a gate insulating film 1003, gate electrodes 1006, 1007, and 1008, a first interlayer insulating film 1020, a second interlayer insulating film 1021, a peripheral portion 1042, a pixel portion 1040, a driver circuit portion 1041, first electrodes 1024W, 1024R, 1024G, and 1024B of the light-emitting devices, a partition 1025, an EL layer 1028, a second electrode 1029 of the light-emitting devices, a sealing substrate 1031, a sealant 1032, and the like.

In FIG. 3A, coloring layers (a red coloring layer 1034R, a green coloring layer 1034G, and a blue coloring layer 1034B) are provided on a transparent base material 1033. A black matrix 1035 may be additionally provided. The transparent base material 1033 provided with the coloring layers and the black matrix is positioned and fixed to the substrate 1001. Note that the coloring layers and the black matrix 1035 are covered with an overcoat layer 1036. In FIG. 3A, a light-emitting layer from which light is emitted to the outside without passing through a coloring layer and light-emitting layers from which light is emitted to the outside, passing through the coloring layers of the respective colors are shown. Since light that does not pass through a coloring layer is white and light that passes through the coloring layer is red, green, or blue, an image can be expressed using pixels of the four colors.

Figure 3B:
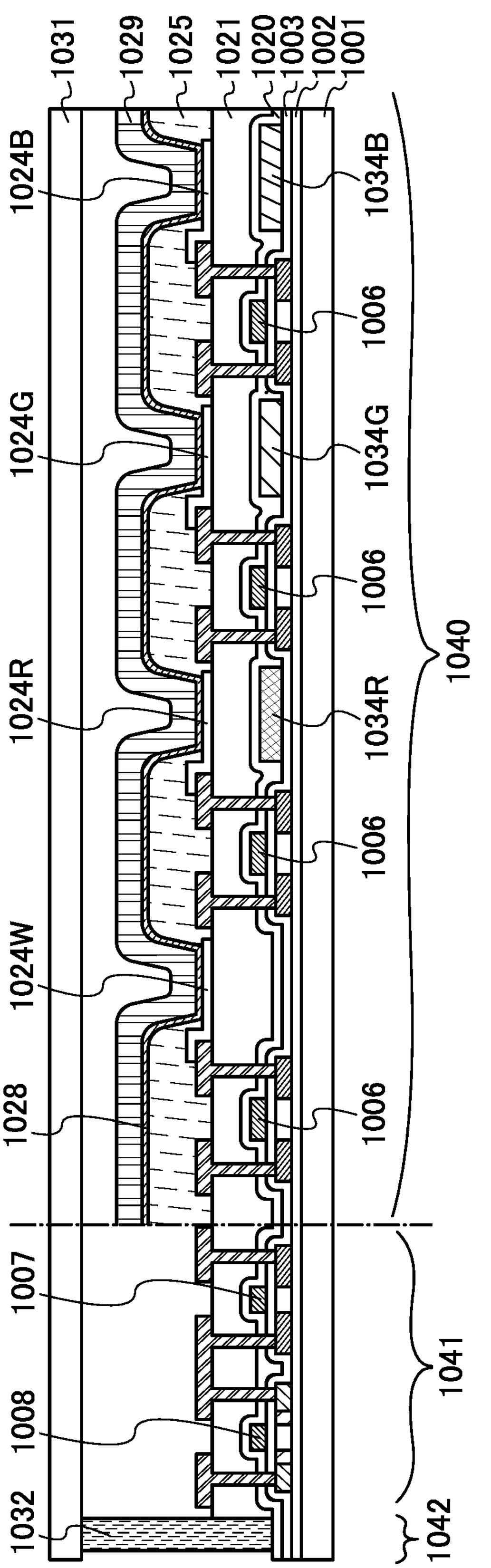

FIG. 3B shows an example in which the coloring layers (the red coloring layer 1034R, the green coloring layer 1034G, and the blue coloring layer 1034B) are formed between the gate insulating film 1003 and the first interlayer insulating film 1020. The coloring layers may be provided between the substrate 1001 and the sealing substrate 1031 in this manner.

Figure 4:
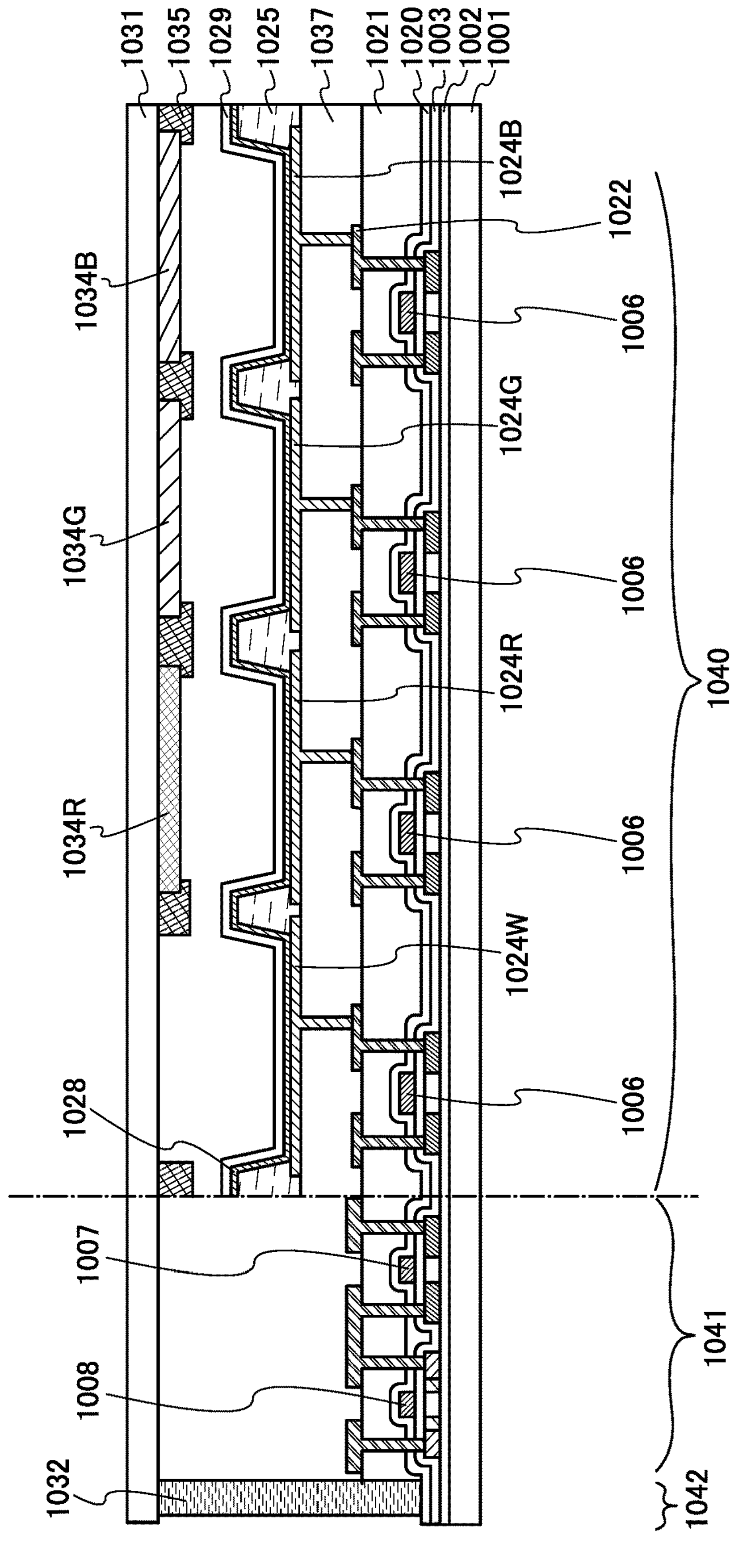
FIG. 4 is a conceptual diagram of an active matrix light-emitting apparatus.

The above-described light-emitting apparatus is a light-emitting apparatus having a structure in which light is extracted to the substrate 1001 side where the FETs are formed (a bottom-emission type), but may be a light-emitting apparatus having a structure in which light emission is extracted to the sealing substrate 1031 side (a top-emission type). FIG. 4 is a cross-sectional view of a top-emission light-emitting apparatus. In this case, a substrate that does not transmit light can be used as the substrate 1001. The top-emission light-emitting apparatus is formed in a manner similar to that of the bottom-emission light-emitting apparatus until a connection electrode which connects the FET and the anode of the light-emitting device is formed. Then, a third interlayer insulating film 1037 is formed to cover an electrode 1022. This insulating film may have a planarization function. The third interlayer insulating film 1037 can be formed using a material similar to that for the second interlayer insulating film or using any other known materials.

The first electrodes 1024W, 1024R, 1024G, and 1024B of the light-emitting devices are each an anode here, but may each be a cathode. Furthermore, in the case of the top-emission light-emitting apparatus illustrated in FIG. 4, the first electrodes are preferably reflective electrodes. The EL layer 1028 is formed to have a structure similar to the structure of the EL layer 183 described in Embodiment 2, with which white light emission can be obtained.

In the case of such a top-emission structure as in FIG. 4, sealing can be performed with the sealing substrate 1031 on which the coloring layers (the red coloring layer 1034R, the green coloring layer 1034G, and the blue coloring layer 1034B) are provided. The sealing substrate 1031 may be provided with the black matrix 1035 which is positioned between pixels. The coloring layers (the red coloring layer 1034R, the green coloring layer 1034G, and the blue coloring layer 1034B) and the black matrix may be covered with the overcoat layer 1036. Note that a light-transmitting substrate is used as the sealing substrate 1031. Although an example in which full color display is performed using four colors of red, green, blue, and white is shown here, there is no particular limitation and full color display may be performed using four colors of red, yellow, green, and blue or three colors of red, green, and blue.

In the top-emission light-emitting apparatus, a microcavity structure can be favorably employed. A light-emitting device with a microcavity structure can be obtained with the use of a reflective electrode as the first electrode and a semi-transmissive and semi-reflective electrode as the second electrode. The light-emitting device with a microcavity structure includes at least an EL layer between the reflective electrode and the semi-transmissive and semi-reflective electrode, which includes at least a light-emitting layer serving as a light-emitting region.

Note that the reflective electrode is a film having a visible light reflectivity of 40% to 100%, preferably 70% to 100%, and a resistivity of $1\times10^{-2}$ Ωcm or lower. In addition, the semi-transmissive and semi-reflective electrode is a film having a visible light reflectivity of 20% to 80%, preferably 40% to 70%, and a resistivity of $1\times10^{-2}$ Ωcm or lower.

Light emitted from the light-emitting layer included in the EL layer is reflected and resonated by the reflective electrode and the semi-transmissive and semi-reflective electrode.

In the light-emitting device, by changing thicknesses of the transparent conductive film, the above-described composite material, the carrier-transport material, or the like, the optical path length between the reflective electrode and the semi-transmissive and semi-reflective electrode can be changed. Thus, light with a wavelength that is resonated between the reflective electrode and the semi-transmissive and semi-reflective electrode can be intensified while light with a wavelength that is not resonated therebetween can be attenuated.

Note that light that is reflected back by the reflective electrode (first reflected light) considerably interferes with light that directly enters the semi-transmissive and semi-reflective electrode from the light-emitting layer (first incident light); therefore, the optical path length between the reflective electrode and the light-emitting layer is preferably adjusted to $(2n-1)\lambda/4$ (n is a natural number of 1 or larger and λ is a wavelength of light emission to be amplified). By adjusting the optical path length, the phases of the first reflected light and the first incident light can be aligned with each other and the light emitted from the light-emitting layer can be further amplified.

Note that in the above structure, the EL layer may include a plurality of light-emitting layers or may include a single light-emitting layer; for example, in combination with the structure of the above-described tandem light-emitting device, a plurality of EL layers each including a single or a plurality of light-emitting layer(s) may be provided in one light-emitting device with a charge-generation layer interposed between the EL layers.

With the microcavity structure, emission intensity with a specific wavelength in the front direction can be increased, whereby power consumption can be reduced. Note that in the case of a light-emitting apparatus which displays images with subpixels of four colors, red, yellow, green, and blue, the light-emitting apparatus can have favorable characteristics because a microcavity structure suitable for wavelengths of the corresponding color is employed in each subpixel, in addition to the effect of an improvement in luminance owing to yellow light emission.

For the light-emitting apparatus in this embodiment, the light-emitting device described in Embodiment 2 is used and thus a light-emitting apparatus having favorable characteristics can be obtained. Specifically, since the light-emitting device described in Embodiment 2 has a high emission efficiency, the light-emitting apparatus with low power consumption can be obtained.

Figure 5A:
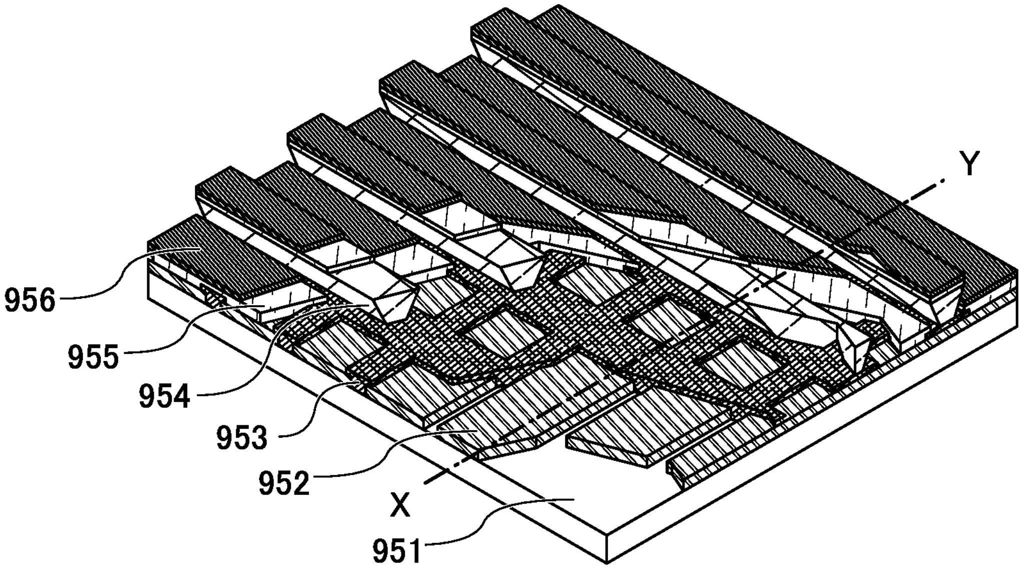
FIG. 5A and FIG. 5B are conceptual diagrams of a passive matrix light-emitting apparatus.
Figure 5B:
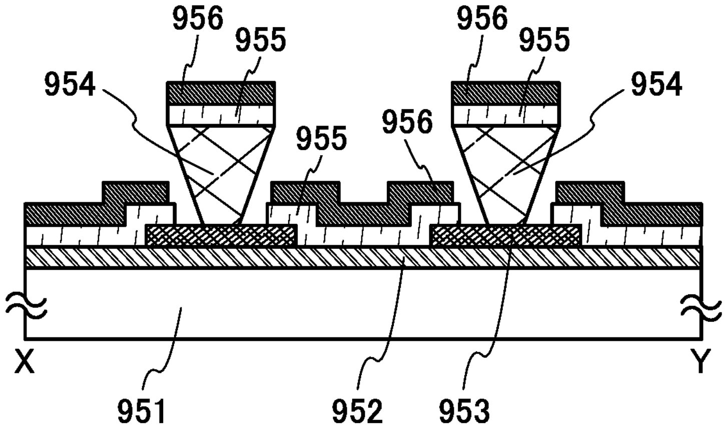

The active matrix light-emitting apparatus is described above, whereas a passive matrix light-emitting apparatus is described below. FIG. 5 illustrates a passive matrix light-emitting apparatus fabricated using the present invention. Note that FIG. 5A is a perspective view illustrating the light-emitting apparatus, and FIG. 5B is a cross-sectional view taken along X-Y in FIG. 5A. In FIG. 5, over a substrate 951, an EL layer 955 is provided between an electrode 952 and an electrode 956. An end portion of the electrode 952 is covered with an insulating layer 953. A partition layer 954 is provided over the insulating layer 953. Sidewalls of the partition layer 954 are aslope such that the distance between one sidewall and the other sidewall is gradually narrowed toward the surface of the substrate. That is, a cross section in the short side direction of the partition layer 954 is a trapezoidal shape, and the lower side (the side facing the same direction as the plane direction of the insulating layer 953 and touching the insulating layer 953) is shorter than the upper side (the side facing the same direction as the plane direction of the insulating layer 953, and not touching the insulating layer 953). By providing the partition layer 954 in this manner, defects of the light-emitting device due to static charge or the like can be prevented. The passive-matrix light-emitting apparatus also uses the light-emitting device described in Embodiment 2; thus, the light-emitting apparatus can have favorable reliability or low power consumption.

Since many minute light-emitting devices arranged in a matrix can each be controlled in the light-emitting apparatus described above, the light-emitting apparatus can be suitably used as a display device for displaying images.

This embodiment can be freely combined with any of the other embodiments.

The structures described in this embodiment can be used in an appropriate combination with the structures described in the other embodiments and the like.

Embodiment 4

Figure 6A:
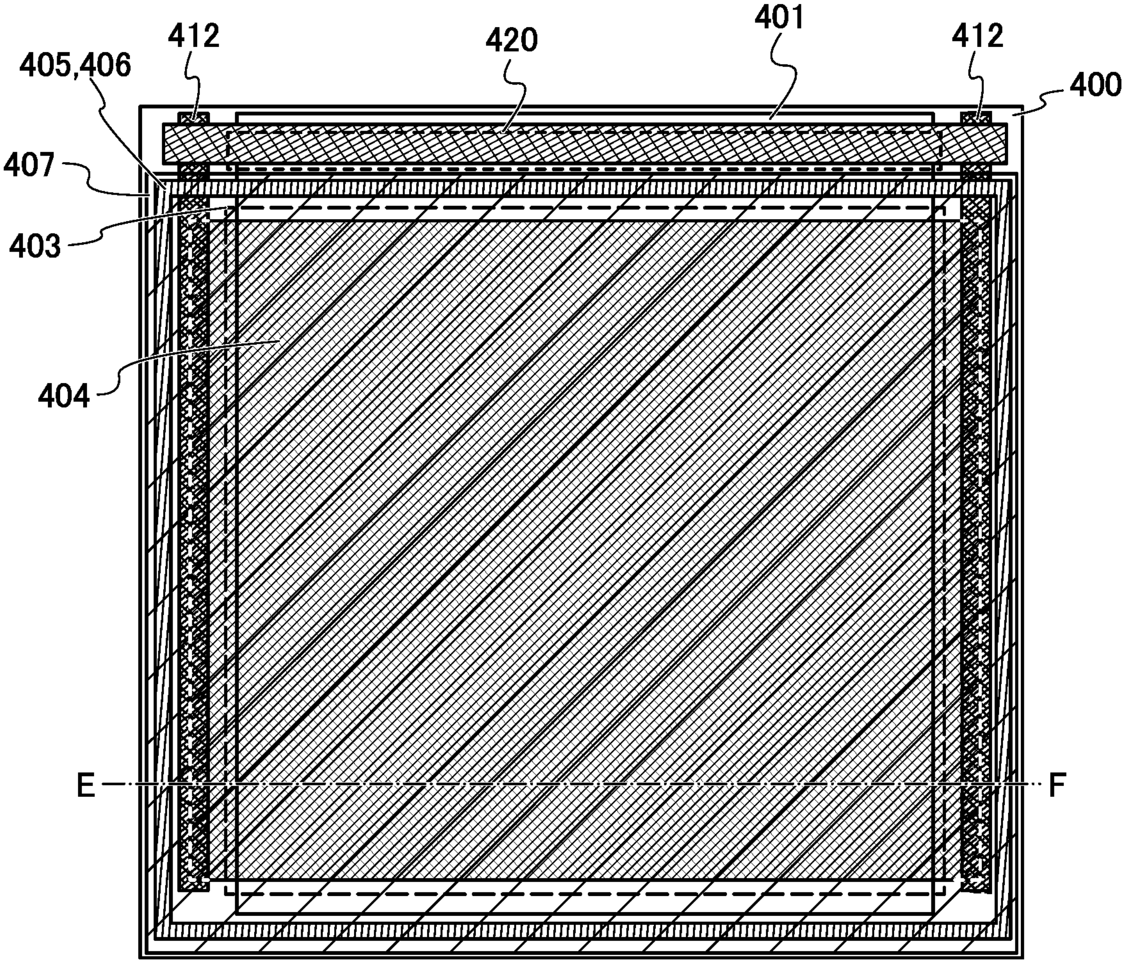
FIG. 6A and FIG. 6B are diagrams illustrating a lighting device.
Figure 6B:
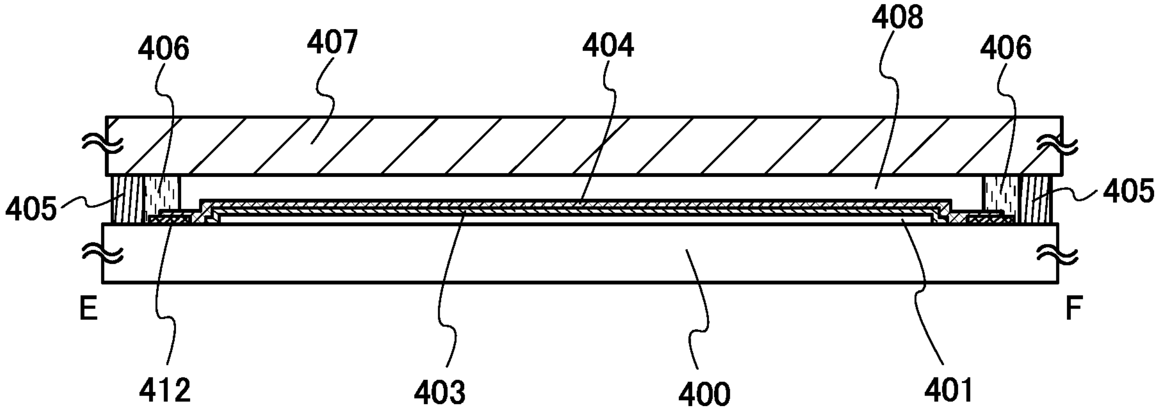

In this embodiment, an example in which the light-emitting device described in Embodiment 2 is used for a lighting device will be described with reference to FIG. 6. FIG. 6A is a top view of the lighting device, and FIG. 6B is a cross-sectional view taken along E-F in FIG. 6A.

In the lighting device in this embodiment, a first electrode 401 is formed over a substrate 400 which is a support and has a light-transmitting property. The first electrode 401 corresponds to the first electrode 181 in Embodiment 2. In the case where light emission is extracted from the first electrode 401 side, the first electrode 401 is formed with a material having a light-transmitting property.

A pad 412 for supplying a voltage to a second electrode 404 is formed over the substrate 400.

An EL layer 403 is formed over the first electrode 401. The EL layer 403 has a structure corresponding to the structure of the EL layer 183, or the structure in which the first light-emitting unit 511, the second light-emitting unit 512, and the charge-generation layer 513 are combined, in Embodiment 2, for example. Note that for these structures, the corresponding description can be referred to.

The second electrode 404 is formed to cover the EL layer 403. The second electrode 404 corresponds to the second electrode 182 in Embodiment 2. In the case where light-emission is extracted from the first electrode 401 side, the second electrode 404 is formed with a material having high reflectivity. The second electrode 404 is supplied with a voltage when connected to the pad 412.

As described above, the lighting device described in this embodiment includes a light-emitting device including the first electrode 401, the EL layer 403, and the second electrode 404. Since the light-emitting device is a light-emitting device with a high emission efficiency, the lighting device in this embodiment can be a lighting device with low power consumption.

The substrate 400 over which the light-emitting device having the above structure is formed is fixed to a sealing substrate 407 with a sealant 405 and a sealant 406 and sealing is performed, whereby the lighting device is completed. It is possible to use only either the sealant 405 or the sealant 406. In addition, the inner sealant 406 (not illustrated in FIG. 6A) can be mixed with a desiccant, which enables moisture to be adsorbed, resulting in improved reliability.

When parts of the pad 412 and the first electrode 401 are provided to extend to the outside of the sealant 405 and the sealant 406, those can serve as external input terminals. An IC chip 420 mounted with a converter or the like may be provided over the external input terminals.

The lighting device described in this embodiment uses the light-emitting device described in Embodiment 2 as an EL element; thus, the light-emitting apparatus can have low power consumption.

The structures described in this embodiment can be used in an appropriate combination with the structures described in the other embodiments and the like.

Embodiment 5

In this embodiment, examples of electronic devices each partly including the light-emitting device described in Embodiment 2 are described. The light-emitting device described in Embodiment 2 is a light-emitting device with a high emission efficiency and low power consumption. As a result, the electronic devices described in this embodiment can be electronic devices each including a light-emitting portion with low power consumption.

Examples of electronic devices to which the light-emitting device is applied include television devices (also referred to as TV or television receivers), monitors for computers and the like, digital cameras, digital video cameras, digital photo frames, mobile phones (also referred to as portable telephones or portable telephone devices), portable game machines, portable information terminals, audio playback devices, and large game machines such as pachinko machines. Specific examples of these electronic devices are shown below.

Figure 7A:
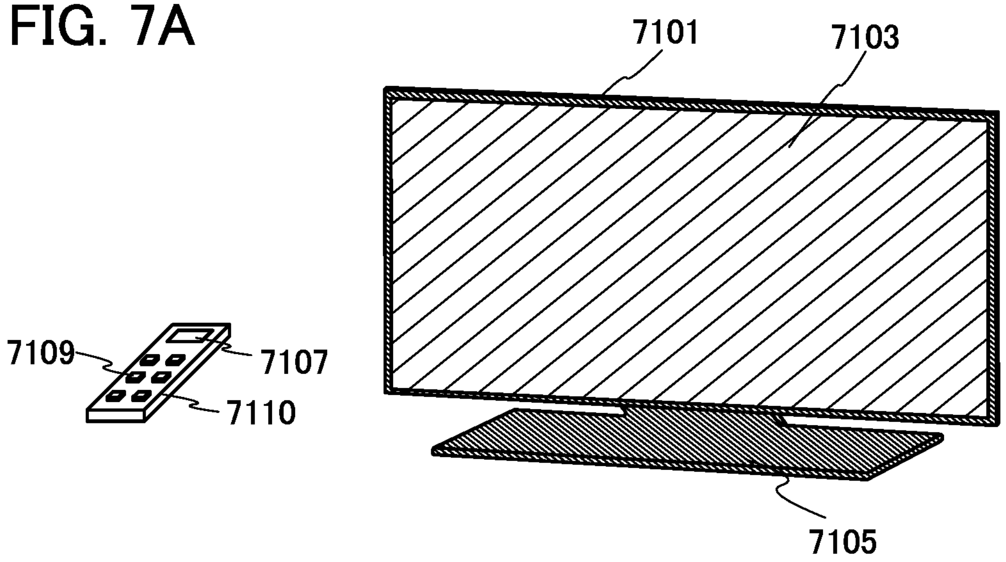
Figure 7A:
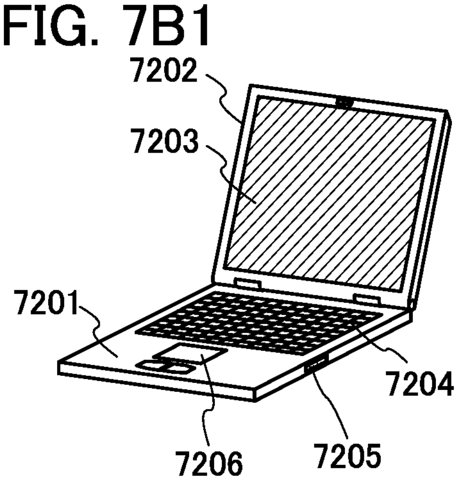
Figure 7A:
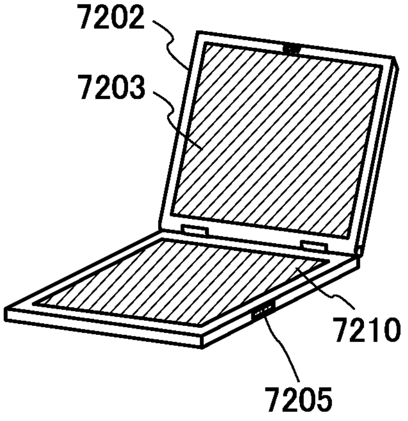

FIG. 7A shows an example of a television device. In the television device, a display portion 7103 is incorporated in a housing 7101. Here, a structure in which the housing 7101 is supported by a stand 7105 is shown. Images can be displayed on the display portion 7103, and the light-emitting devices described in Embodiment 2 are arranged in a matrix in the display portion 7103.

The television device can be operated with an operation switch of the housing 7101 or a separate remote controller 7110. With operation keys 7109 of the remote controller 7110, channels and volume of the television device can be operated and images displayed on the display portion 7103 can be operated. Furthermore, a structure may be employed in which the remote controller 7110 is provided with a display portion 7107 for displaying data output from the remote controller 7110.

Note that the television device has a structure in which a receiver, a modem, and the like are provided. With the use of the receiver, a general television broadcast can be received, and moreover, when the television device is connected to a communication network with or without a wire via the modem, one-way (from a sender to a receiver) or two-way (between a sender and a receiver or between receivers) data communication can be performed.

FIG. 7B1 is a computer which includes a main body 7201, a housing 7202, a display portion 7203, a keyboard 7204, an external connection port 7205, a pointing device 7206, and the like. Note that this computer is fabricated using the light-emitting devices described in Embodiment 2 arranged in a matrix in the display portion 7203. The computer in FIG. 7B1 may be such a mode as illustrated in FIG. 7B2. The computer in FIG. 7B2 is provided with a second display portion 7210 instead of the keyboard 7204 and the pointing device 7206. The second display portion 7210 is of a touch-panel type, and input can be performed by operating display for input displayed on the second display portion 7210 with a finger or a dedicated pen. The second display portion 7210 can also display images other than the display for input. The display portion 7203 may also be a touch panel. Connecting the two screens with a hinge can prevent troubles such as a crack in or damage to the screens caused when the computer is stored or carried.

Figure 7C:
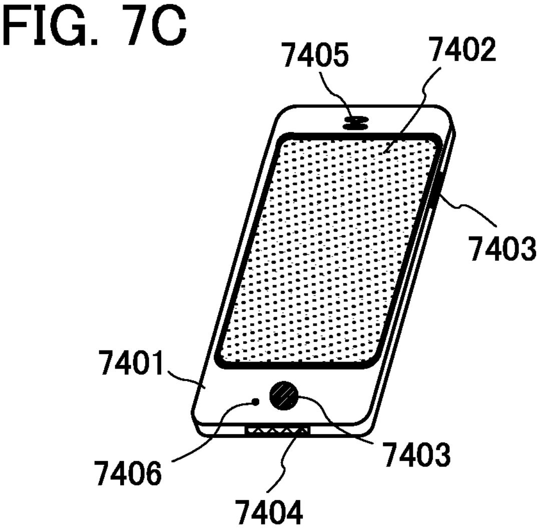

FIG. 7C shows an example of a portable terminal. The portable terminal includes operation buttons 7403, an external connection port 7404, a speaker 7405, a microphone 7406, and the like in addition to a display portion 7402 incorporated in a housing 7401. Note that the portable terminal includes the display portion 7402 which is fabricated by arranging the light-emitting devices described in Embodiment 2 in a matrix.

The portable terminal illustrated in FIG. 7C may have a structure in which data can be input by touching the display portion 7402 with a finger or the like. In this case, operations such as making a call and creating an e-mail can be performed by touching the display portion 7402 with a finger or the like.

The display portion 7402 has mainly three screen modes. The first one is a display mode mainly for displaying images, and the second one is an input mode mainly for inputting data such as text. The third one is a display+input mode in which two modes of the display mode and the input mode are combined.

For example, in the case of making a call or creating an e-mail, a text input mode mainly for inputting text is selected for the display portion 7402 so that an operation of inputting text displayed on the screen may be performed. In this case, it is preferable to display a keyboard or number buttons on almost the entire screen of the display portion 7402.

When a sensing device including a sensor for sensing inclination, such as a gyroscope sensor or an acceleration sensor, is provided inside the portable terminal, screen display of the display portion 7402 can be automatically changed by determining the orientation of the portable terminal (vertically or horizontally).

The screen modes are changed by touching the display portion 7402 or operating the operation buttons 7403 of the housing 7401. Alternatively, the screen modes can be changed depending on the kind of image displayed on the display portion 7402. For example, when a signal of an image displayed on the display portion is moving image data, the screen mode is changed to the display mode, and when the signal is text data, the screen mode is changed to the input mode.

Moreover, in the input mode, when input by the touch operation of the display portion 7402 is not performed for a certain period while a signal sensed by an optical sensor in the display portion 7402 is sensed, the screen mode may be controlled so as to be changed from the input mode to the display mode.

The display portion 7402 can also function as an image sensor. For example, an image of a palm print, a fingerprint, or the like is taken when the display portion 7402 is touched with the palm or the finger, whereby personal authentication can be performed. Furthermore, by using a backlight which emits near-infrared light or a sensing light source which emits near-infrared light in the display portion, an image of a finger vein, a palm vein, or the like can be taken.

Figure 8A:
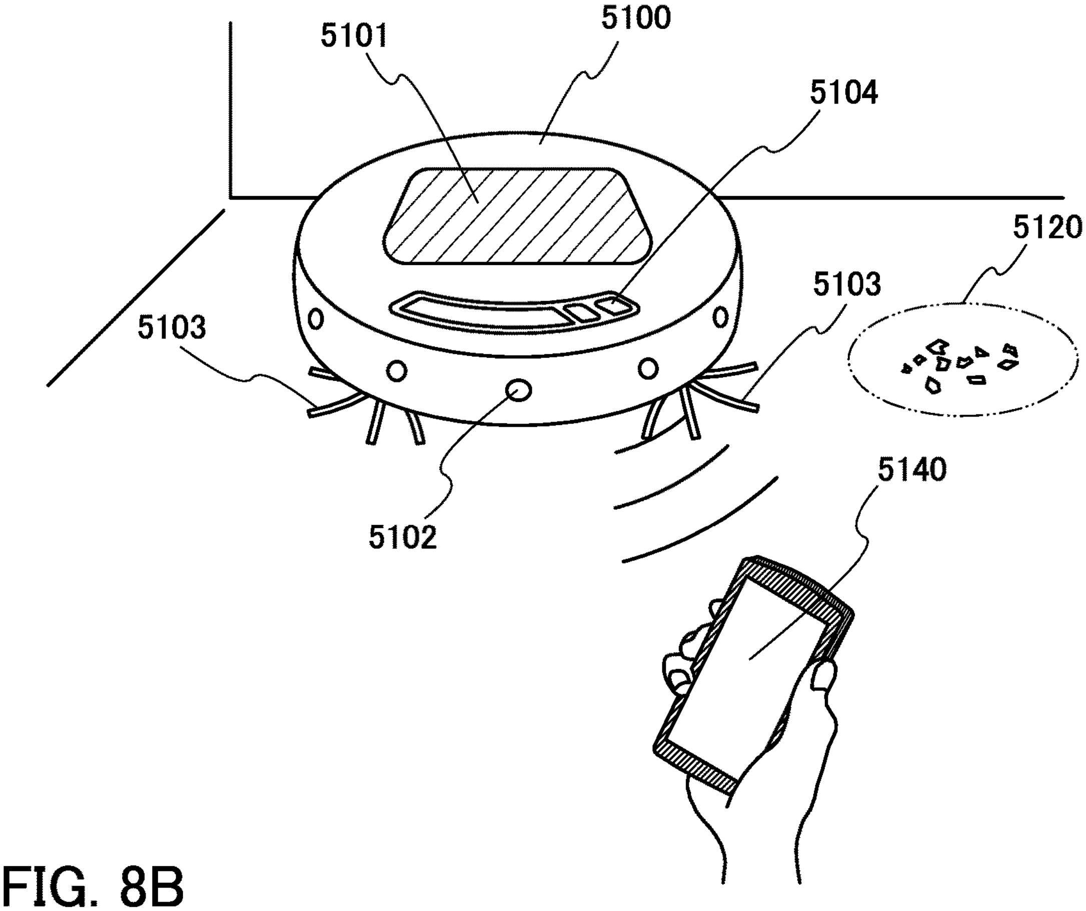
FIG. 8A, FIG. 8B, and FIG. 8C are diagrams illustrating electronic devices.

FIG. 8A is a schematic view showing an example of a cleaning robot.

A cleaning robot 5100 includes a display 5101 placed on its top surface, a plurality of cameras 5102 placed on its side surface, a brush 5103, and operation buttons 5104. Although not illustrated, the bottom surface of the cleaning robot 5100 is provided with a tire, an inlet, and the like. Furthermore, the cleaning robot 5100 includes various sensors such as an infrared sensor, an ultrasonic sensor, an acceleration sensor, a piezoelectric sensor, an optical sensor, and a gyroscope sensor. In addition, the cleaning robot 5100 has a wireless communication means.

The cleaning robot 5100 is self-propelled, detects dust 5120, and sucks up the dust through the inlet provided on the bottom surface.

The cleaning robot 5100 can judge whether there is an obstacle such as a wall, furniture, or a step by analyzing images taken by the cameras 5102. When an object that is likely to be caught in the brush 5103, such as a wire, is detected by image analysis, the rotation of the brush 5103 can be stopped.

The display 5101 can display the remaining capacity of a battery, the amount of vacuumed dust, and the like. The display 5101 may display a path on which the cleaning robot 5100 has run. The display 5101 may be a touch panel, and the operation buttons 5104 may be provided on the display 5101.

The cleaning robot 5100 can communicate with a portable electronic device 5140 such as a smartphone. The portable electronic device 5140 can display images taken by the cameras 5102. Accordingly, an owner of the cleaning robot 5100 can monitor the room even from the outside. The display on the display 5101 can be checked by the portable electronic device such as a smartphone.

The light-emitting apparatus of one embodiment of the present invention can be used for the display 5101.

Figure 8B:
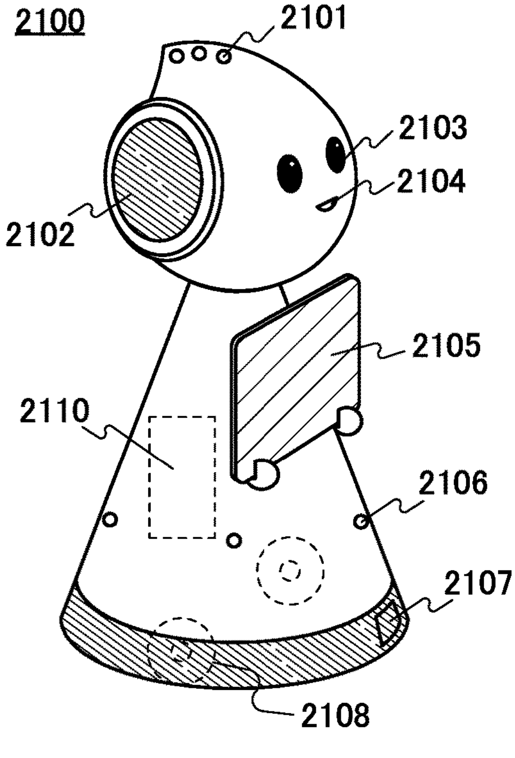

A robot 2100 illustrated in FIG. 8B includes an arithmetic device 2110, an illuminance sensor 2101, a microphone 2102, an upper camera 2103, a speaker 2104, a display 2105, a lower camera 2106, an obstacle sensor 2107, and a moving mechanism 2108.

The microphone 2102 has a function of detecting a speaking voice of a user, an environmental sound, and the like. The speaker 2104 also has a function of outputting sound. The robot 2100 can communicate with a user using the microphone 2102 and the speaker 2104.

The display 2105 has a function of displaying various kinds of information. The robot 2100 can display information desired by a user on the display 2105. The display 2105 may be provided with a touch panel. Moreover, the display 2105 may be a detachable information terminal, in which case charging and data communication can be performed when the display 2105 is set at the home position of the robot 2100.

The upper camera 2103 and the lower camera 2106 each have a function of taking an image of the surroundings of the robot 2100. The obstacle sensor 2107 can detect the presence of an obstacle in the direction where the robot 2100 advances with the moving mechanism 2108. The robot 2100 can move safely by recognizing the surroundings with the upper camera 2103, the lower camera 2106, and the obstacle sensor 2107. The light-emitting apparatus of one embodiment of the present invention can be used for the display 2105.

Figure 8C:
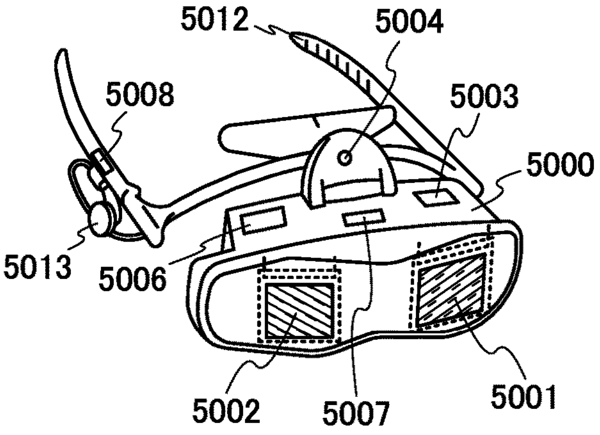

FIG. 8C shows an example of a goggle-type display. The goggle-type display includes, for example, a housing 5000, a display portion 5001, a speaker 5003, an LED lamp 5004, a connection terminal 5006, a sensor 5007 (a sensor having a function of measuring force, displacement, position, speed, acceleration, angular velocity, rotational frequency, distance, light, liquid, magnetism, temperature, a chemical substance, sound, time, hardness, an electric field, current, voltage, power, radiation, flow rate, humidity, gradient, oscillation, odor, or infrared ray), a microphone 5008, a display portion 5002, a support 5012, and an earphone 5013.

The light-emitting apparatus of one embodiment of the present invention can be used for the display portion 5001 and the display portion 5002.

Figure 9:
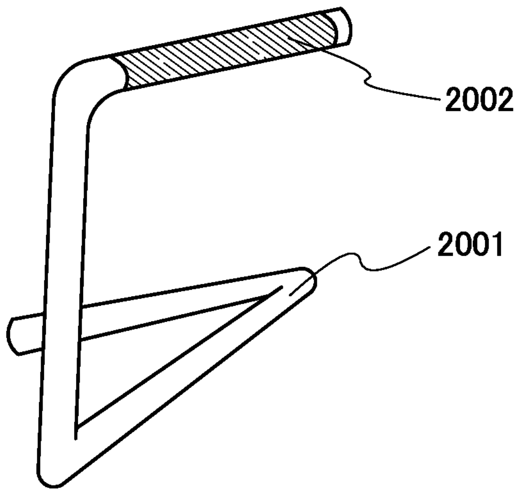
FIG. 9 is a diagram illustrating a lighting device.

FIG. 9 shows an example in which the light-emitting device described in Embodiment 2 is used for a table lamp which is a lighting device. The table lamp illustrated in FIG. 9 includes a housing 2001 and a light source 2002, and the lighting device described in Embodiment 3 may be used for the light source 2002.

Figure 10:
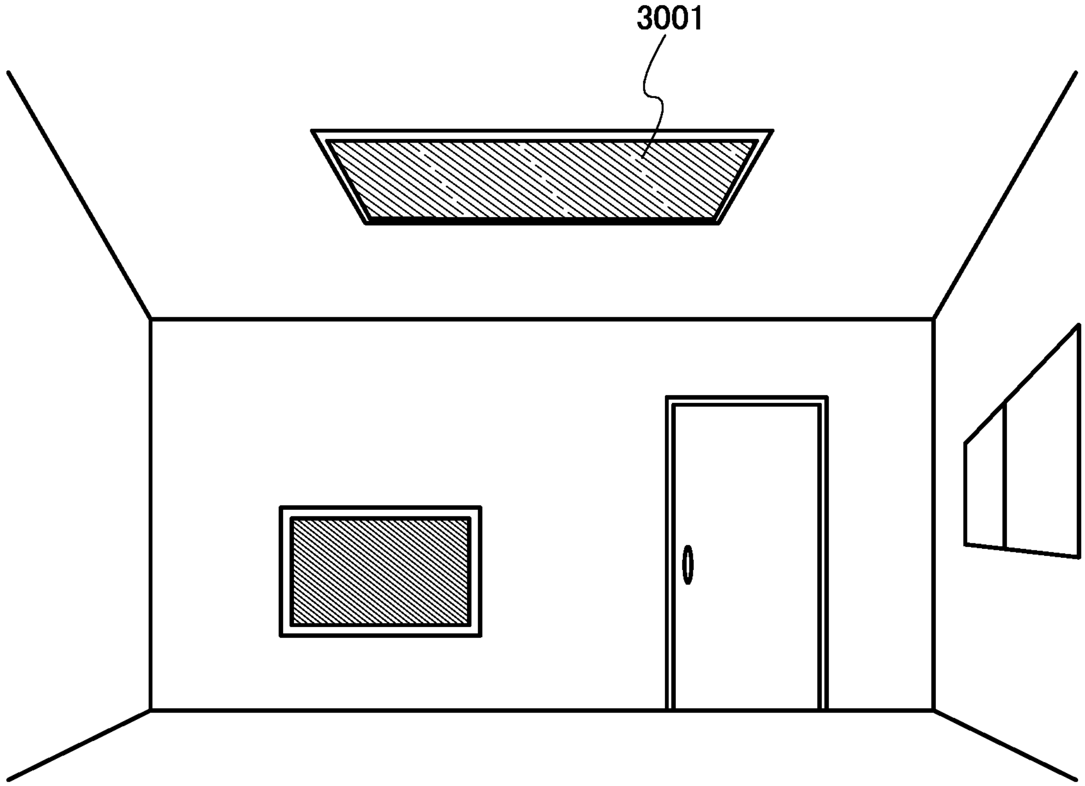
FIG. 10 is a diagram illustrating a lighting device.

FIG. 10 shows an example in which the light-emitting device described in Embodiment 2 is used for an indoor lighting device 3001. Since the light-emitting device described in Embodiment 2 is a light-emitting device with a high emission efficiency, the lighting device can have low power consumption. Furthermore, the light-emitting device described in Embodiment 2 can have a larger area, and thus can be used for a large-area lighting device. Furthermore, the light-emitting device described in Embodiment 2 is thin, and thus can be used for a lighting device having a reduced thickness.

Figure 11:
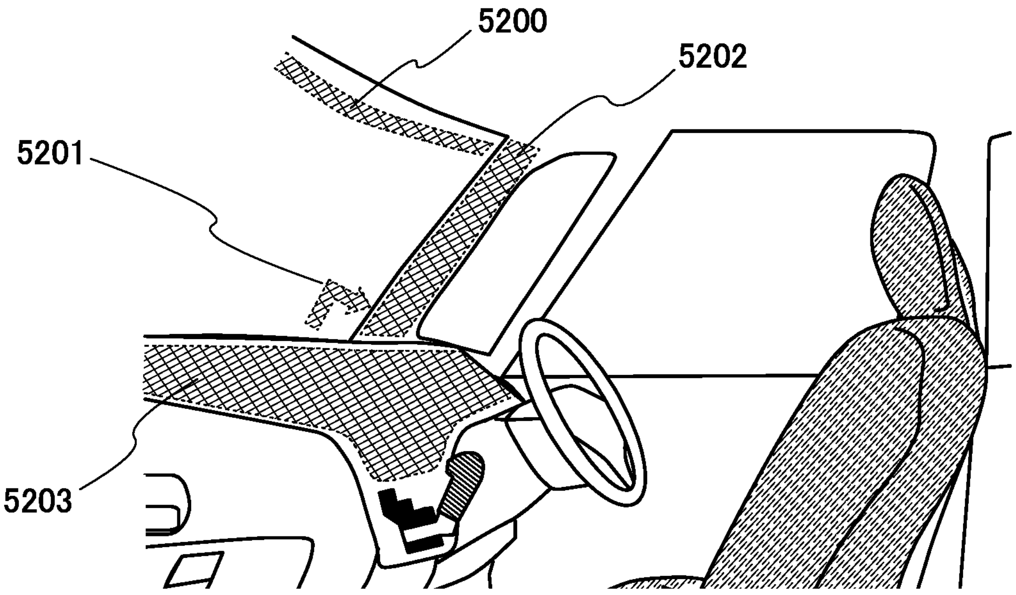
FIG. 11 is a diagram illustrating in-vehicle display devices and lighting devices.

The light-emitting device described in Embodiment 2 can also be incorporated in an automobile windshield and an automobile dashboard. FIG. 11 illustrates one mode in which the light-emitting device described in Embodiment 2 is used for a windshield and a dashboard of an automobile. A display region 5200 to a display region 5203 are each display provided using the light-emitting device described in Embodiment 2.

The display region 5200 and the display region 5201 are display devices provided in the automobile windshield, in which the light-emitting devices described in Embodiment 2 are incorporated. When the light-emitting devices described in Embodiment 2 are fabricated using electrodes having light-transmitting properties as a first electrode and a second electrode, what is called see-through display devices, through which the opposite side can be seen, can be obtained. See-through display can be provided without hindering the vision even when being provided in the automobile windshield. Note that in the case where a driving transistor or the like is provided, a transistor having a light-transmitting property, such as an organic transistor using an organic semiconductor material or a transistor using an oxide semiconductor, is preferably used.

The display region 5202 is a display device provided in a pillar portion, in which the light-emitting devices described in Embodiment 2 are incorporated. The display region 5202 can compensate for the view hindered by the pillar by displaying an image taken by an imaging means provided on the car body. Similarly, the display region 5203 provided in the dashboard portion can compensate for the view hindered by the car body by displaying an image taken by an imaging means provided on the outside of the automobile. Thus, blind areas can be compensated for and the safety can be enhanced. Showing an image so as to compensate for the area that cannot be seen makes it possible to confirm safety more naturally and comfortably.

The display region 5203 can provide a variety of kinds of information such as navigation data, speed, the number of engine revolutions, mileage, and a fuel level. The content and layout of the display can be changed as appropriate according to the user's preference. Note that such information can also be displayed on the display region 5200 to the display region 5202. The display region 5200 to the display region 5203 can also be used as lighting devices.

Figure 12A:
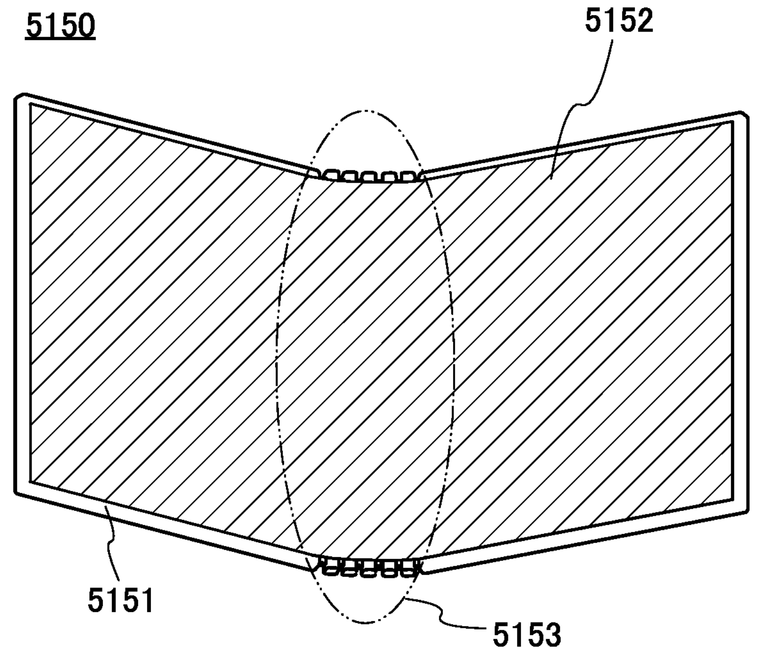
FIG. 12A and FIG. 12B are diagrams illustrating an electronic device.
Figure 12B:
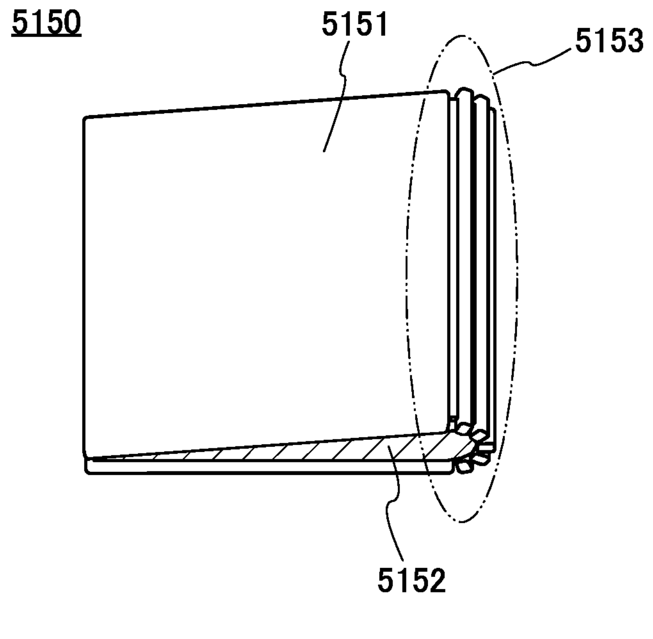

FIG. 12A and FIG. 12B illustrate a foldable portable information terminal 5150. The foldable portable information terminal 5150 includes a housing 5151, a display region 5152, and a bend portion 5153. FIG. 12A illustrates the portable information terminal 5150 that is opened. FIG. 12B illustrates the portable information terminal that is folded. The portable information terminal 5150 is compact in size and has excellent portability when folded, despite its large display region 5152.

The display region 5152 can be folded in half with the bend portion 5153. The bend portion 5153 includes a flexible member and a plurality of supporting members, and when the display region is folded, the flexible member expands and the bend portion 5153 has a radius of curvature of 2 mm or more, preferably 3 mm or more.

Note that the display region 5152 may be a touch panel (an input/output device) including a touch sensor (an input device). The light-emitting apparatus of one embodiment of the present invention can be used for the display region 5152.

Figure 13A:
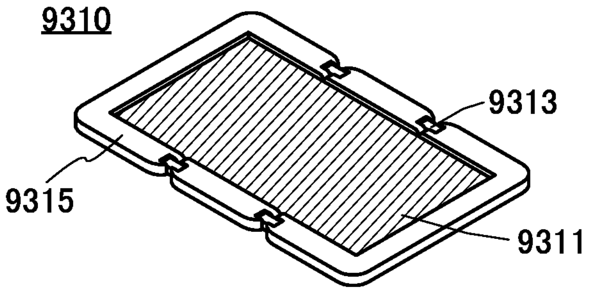
FIG. 13A, FIG. 13B, and FIG. 13C are diagrams illustrating an electronic device.
Figure 13B:
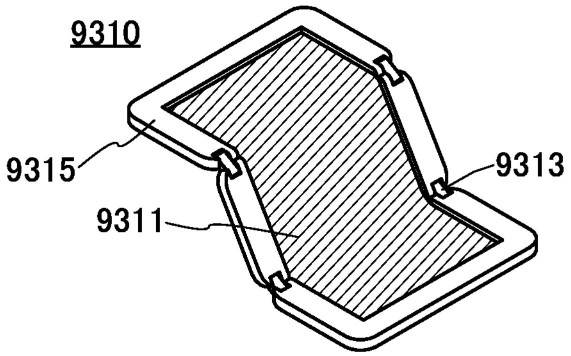
Figure 13C:
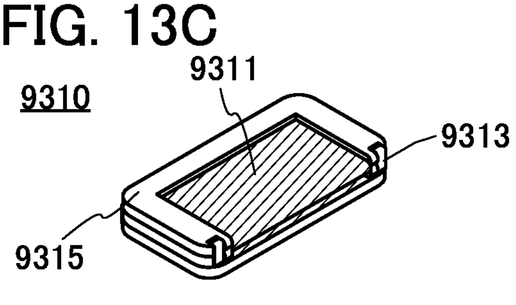

FIG. 13A to FIG. 13C illustrate a foldable portable information terminal 9310. FIG. 13A illustrates the portable information terminal 9310 that is opened. FIG. 13B illustrates the portable information terminal 9310 that is in the state of being changed from one of an opened state and a folded state to the other. FIG. 13C illustrates the portable information terminal 9310 that is folded. The portable information terminal 9310 is excellent in portability when folded, and is excellent in display browsability when opened because of a seamless large display region.

A display panel 9311 is supported by three housings 9315 joined together by hinges 9313. Note that the display panel 9311 may be a touch panel (an input/output device) including a touch sensor (an input device). By folding the display panel 9311 at the hinges 9313 between two housings 9315, the portable information terminal 9310 can be reversibly changed in shape from the opened state to the folded state. A light-emitting apparatus of one embodiment of the present invention can be used for the display panel 9311.

Note that the structures described in this embodiment can be combined with the structures described in any of Embodiment 1 to Embodiment 4 as appropriate.

As described above, the application range of the light-emitting apparatus including the light-emitting device described in Embodiment 2 is so wide that this light-emitting apparatus can be applied to electronic devices in a variety of fields. With the use of the light-emitting device described in Embodiment 2, an electronic device with low power consumption can be obtained.

The structures described in this embodiment can be used in an appropriate combination with the structures described in the other embodiments and the like.

Example 1

Synthesis Example 1

Described in this example is a method for synthesizing bis{4,6-dimethyl-2-[5-(4-cyano-2-methylphenyl)-3-methyl-2-pyrazinyl-κN]phenyl-κC}(3,7-diethyl-4,6-nonanedionato-$\kappa^2$O,O')iridium(III) (abbreviation: [Ir(dmmppr-mCP)$_2$(debm)]), which is the organometallic complex of one embodiment of the present invention represented by Structural Formula (100) in Embodiment 1. The structure of [Ir(dmmppr-mCP)$_2$(debm)] is shown below.

[Chemical Formula 31]

(100)

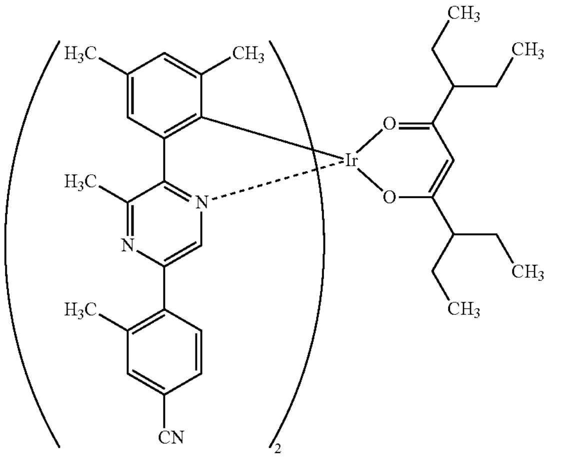

[Ir(dmmppr-mCP)$_2$(debm)]

Step 1: Synthesis of 5-chloro-2-(3,5-dimethylphenyl)-3-methylpyrazine

Into a 100-mL round-bottom flask were put 4.6 g (22 mmol) of 2-bromo-5-chloro-3-methylpyrazine, 3.3 g (22 mmol) of 3,5-dimethylphenylboronic acid, 9.3 g (44 mmol) of tripotassium phosphate, 50 mL of acetonitrile, and 5 mL of water, and the air in the flask was replaced with argon. Then, 0.90 g (1.1 mmol) of [1,1'-bis(diphenylphosphino)ferrocene]palladium(II) dichloride dichloromethane adduct was added, and the mixture was subjected to irradiation with microwaves (2.45 GHz, 100 W) for two hours to cause a reaction.

After the reaction, the obtained reaction mixture was subjected to extraction with ethyl acetate. After that, purification by silica column chromatography was performed. A developing solvent of hexane:dichloromethane=10:1 was used, the proportion of dichloromethane was gradually increased, and finally, a developing solvent of hexane: dichloromethane=2:1 was used. The obtained fraction was concentrated to give 2.3 g of a white solid in a yield of 45%. By nuclear magnetic resonance (NMR) spectroscopy, the obtained white solid was identified as 5-chloro-2-(3,5-dimethylphenyl)-3-methylpyrazine. The synthesis scheme in Step 1 is shown in Formula (a-1) below.

[Chemical Formula 32]

(a-1)

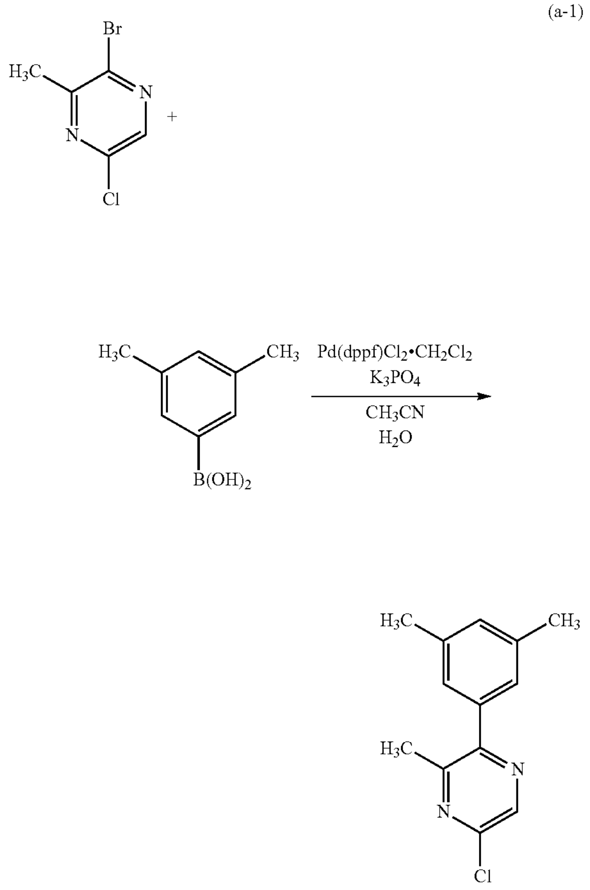

Step 2: Synthesis of 5-(4-cyano-2-methylphenyl)-2-(3,5-dimethylphenyl)-3-methylpyrazine (abbreviation: Hdmmppr-mCP)

Into a 200-mL three-neck flask were put 1.2 g (5.2 mmol) of 5-chloro-2-(3,5-dimethylphenyl)-3-methylpyrazine synthesized in Step 1, 1.0 g (6.2 mmol) of 4-cyano-2-methylphenylboronic acid, 3.3 g (16 mmol) of tripotassium phosphate, 45 mL of toluene, and 5 mL of water, and the air in the flask was replaced with nitrogen. This mixture was degassed by being stirred while the pressure in the flask was reduced. After degassing, 48 mg (0.052 mmol) of tris (dibenzylideneacetone)dipalladium(0) and 100 mg (0.21 mmol) of tris(2,6-dimethoxyphenyl)phosphine were added, and the mixture was stirred under a nitrogen stream at 110° C. for 12 hours. The obtained reaction mixture was subjected to extraction with toluene. After that, purification by silica column chromatography was performed. A developing solvent of hexane:ethyl acetate=10:1 was used first, and then a developing solvent of hexane:ethyl acetate=5:1 was used. The obtained fraction was concentrated to give a solid. Hexane was added to the obtained solid, which was then subjected to suction filtration to give 0.70 g of a white solid in a yield of 41%. The obtained white solid was identified as Hdmmppr-mCP by nuclear magnetic resonance (NMR) spectroscopy. The synthesis scheme in Step 2 is shown in Formula (a-2) below.

[Chemical Formula 33]

(a-2)

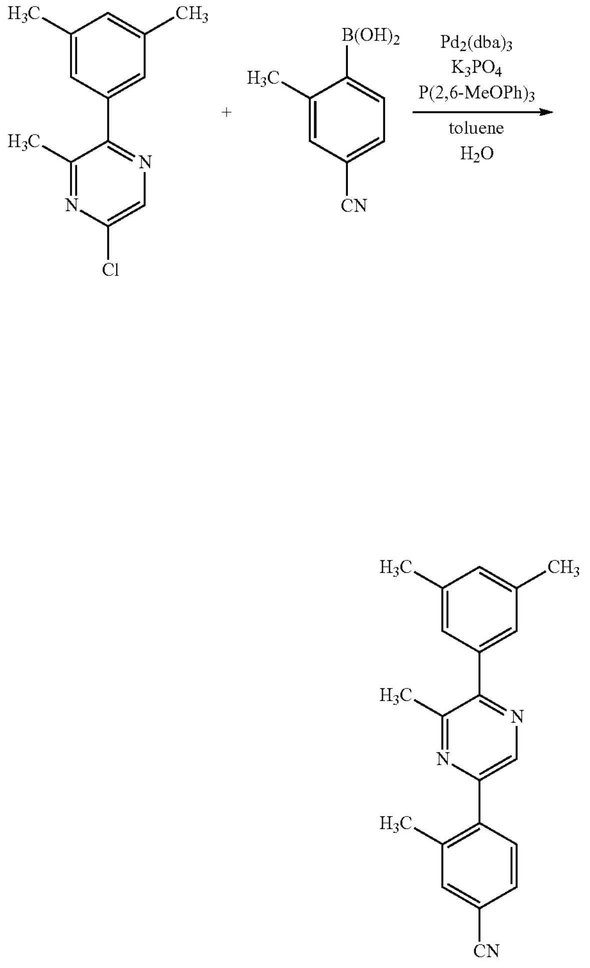

Step 3: Synthesis of di-μ-chloro-tetrakis{4,6-dimethyl-2-[5-(4-cyano-2-methylphenyl)-3-methyl-2-pyrazinyl-κN]phenyl-κC}diiridium(III) (abbreviation: [Ir(dmmppr-mCP)$_2$Cl]$_2$)

Into a 100-mL round-bottom flask were put 0.66 g (2.1 mmol) of Hdmmppr-mCP synthesized in Step 2, 0.31 g (1.0 mmol) of iridium chloride hydrate, 15 mL of 2-ethoxyethanol, and 5 mL of water, and the air in the flask was replaced with argon. This reaction container was subjected to irradiation with microwaves (2.45 GHz, 100 W) for one hour to cause a reaction. After the reaction, the reaction solution, to which ethanol was added, was subjected to suction filtration to give 0.39 g of a red solid in a yield of 44%. The synthesis scheme in Step 3 is shown in Formula (a-3) below.

[Chemical Formula 34]

(a-3)

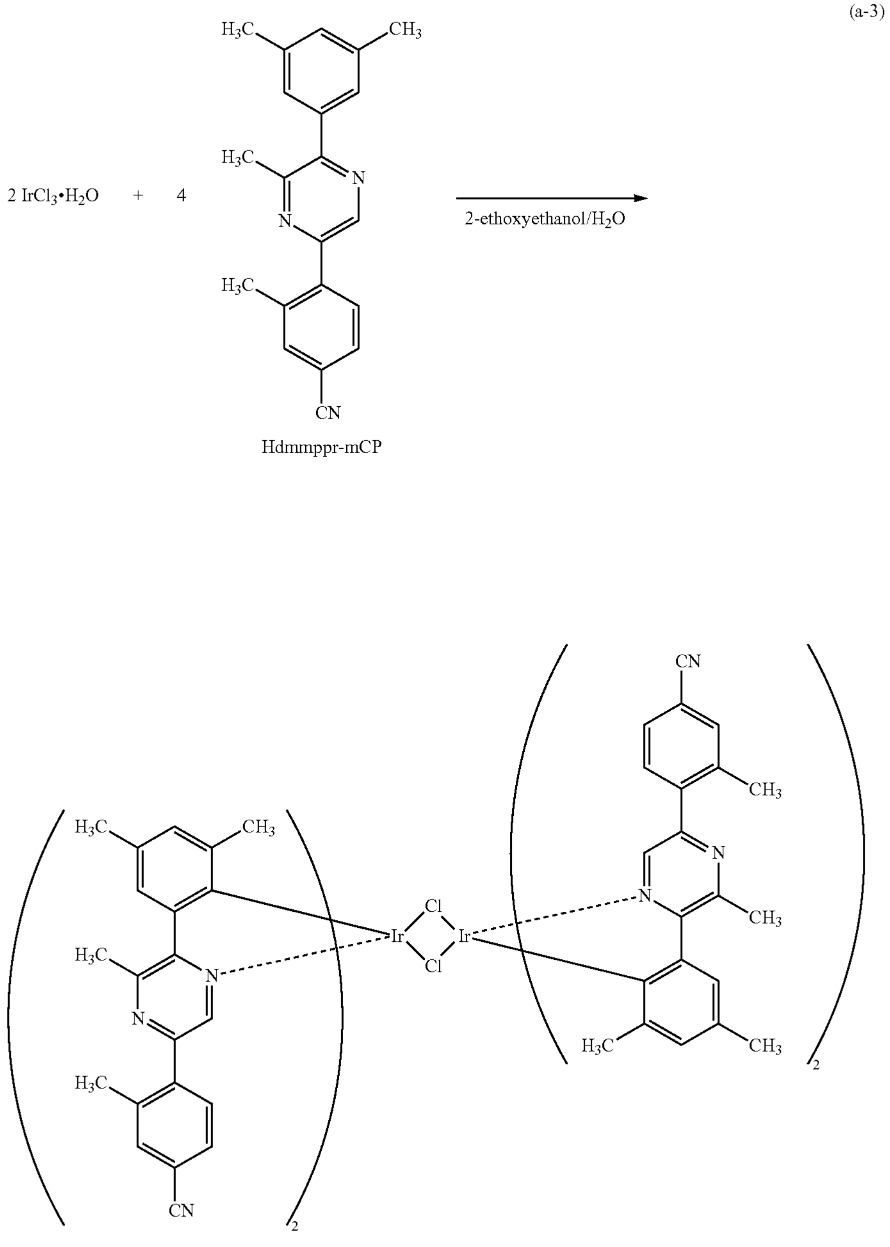

Hdmmppr-mCP $[Ir(dmmppr\text{-}mCP)_2Cl]_2$

Step 4: Synthesis of $[Ir(dmmppr\text{-}mCP)_2(debm)]$

Into a 100-mL round-bottom flask were put 20 mL of 2-ethoxyethanol, 0.39 g (0.23 mmol) of $[Ir(dmmppr\text{-}mCP)_2Cl]_2$, 0.15 g (0.69 mmol) of 3,7-diethylnonane-4,6-dione, and 0.24 g (2.3 mmol) of sodium carbonate, and the air in the flask was replaced with argon. This reaction container was subjected to irradiation with microwaves (2.45 GHz, 120 W) for two hours to cause a reaction.

The obtained reaction mixture was filtered, and the obtained filtrate was concentrated. After that, purification by silica column chromatography was performed. A developing solvent of hexane:dichloromethane=1:1 was used first, and then dichloromethane was used. The obtained fraction was concentrated to give a red solid. The obtained red solid was recrystallized with dichloromethane/ethanol to give 0.19 g of a red solid in a yield of 40%. By a train sublimation method, 0.17 g of the obtained red solid was purified by sublimation. The purification by sublimation was performed by heating at 270° C. under a pressure of 2.6 Pa with an argon flow rate of 10.6 mL/min for 22 hours. After the purification by sublimation, 0.12 g of a red solid was obtained at a collection rate of 68%. The synthesis scheme of Step 4 is shown in Formula (a-4) below.

[Chemical Formula 35]

(a-4)

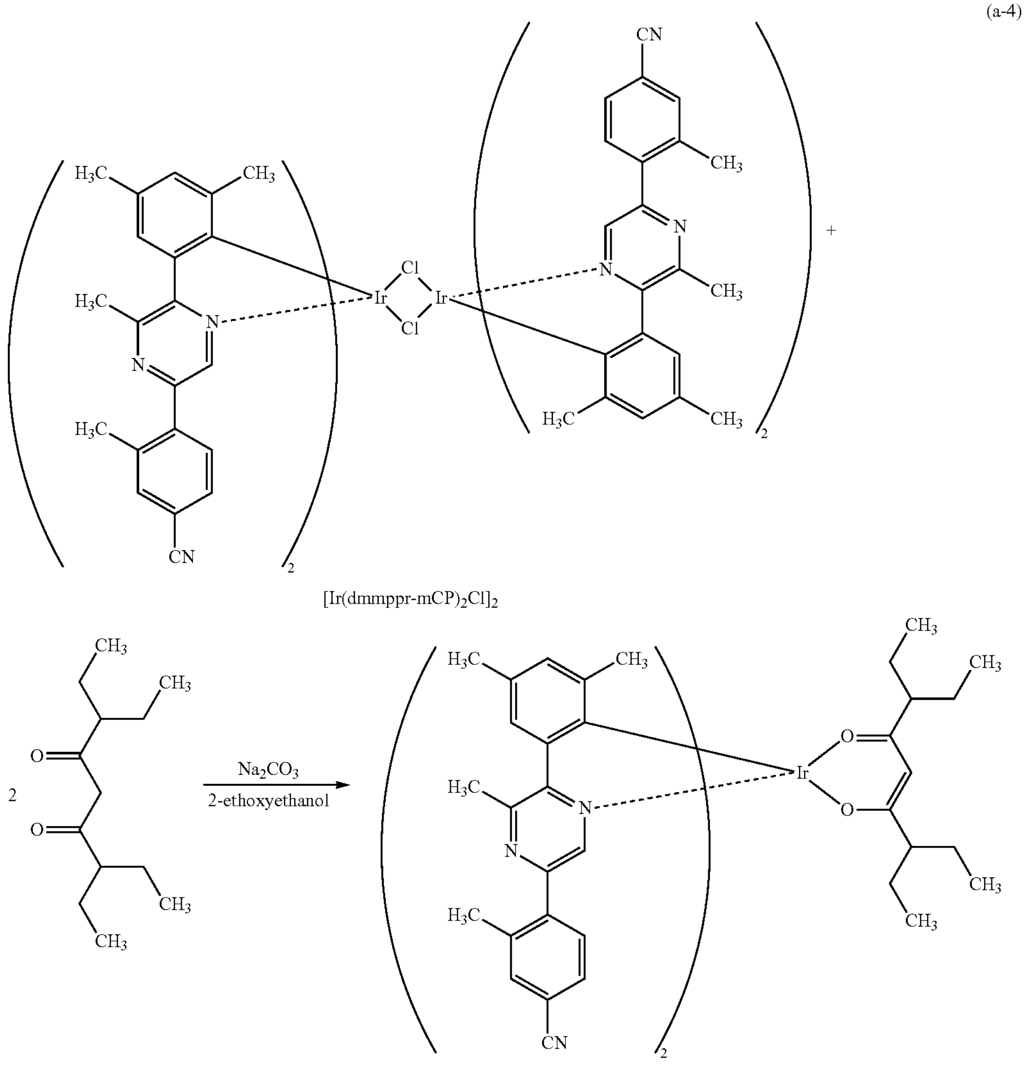

$[Ir(dmmppr\text{-}mCP)_2Cl]_2$ $[Ir(dmmppr\text{-}mCP)_2(debm)]$
(100)

Figure 14:
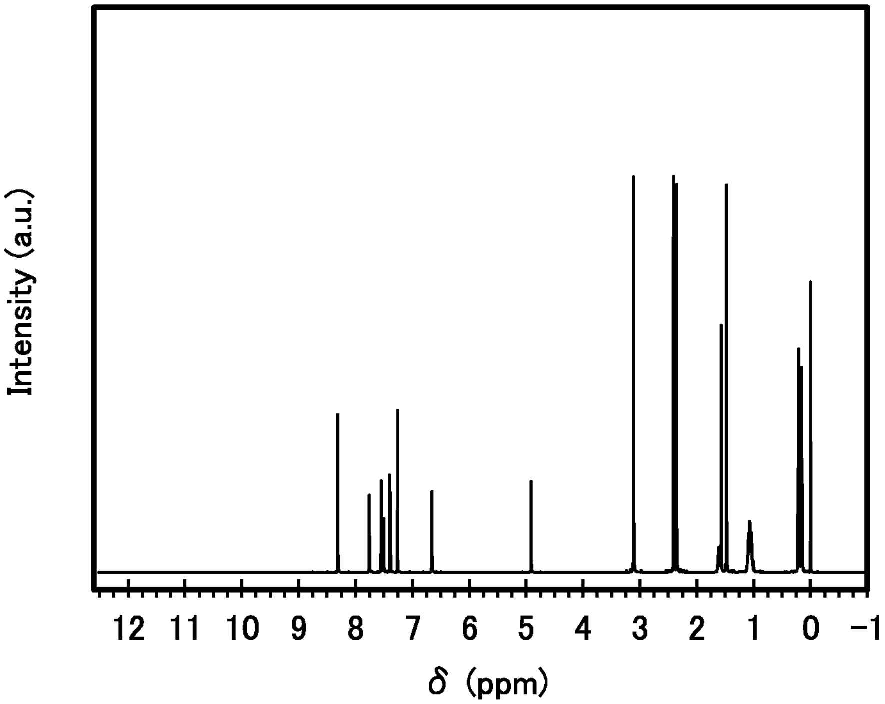
FIG. 14 is a 1H NMR chart of [Ir(dmmppr-mCP)$_2$(debm)].

Analysis results by nuclear magnetic resonance spectroscopy ($^1$H-NMR) of the red solid obtained in Step 4 above are shown below. FIG. 14 is a $^1$H-NMR chart. These reveal that the organometallic complex $[Ir(dmmppr\text{-}mCP)_2(debm)]$ represented by Structural Formula (100) above was obtained in this synthesis example.

$^1$H-NMR. δ ($CDCl_3$): 0.14-0.23 (m, 12H), 1.11-1.00 (m, 8H), 1.48 (s, 6H), 1.57-1.64 (m, 2H), 2.36 (s, 6H), 2.41 (s, 6H), 3.11 (s, 6H), 4.91 (s, 1H), 6.66 (s, 2H), 7.39 (d, 2H), 7.51 (d, 2H), 7.56 (s, 2H), 7.76 (s, 2H), 8.31 (s, 2H).

Figure 15:
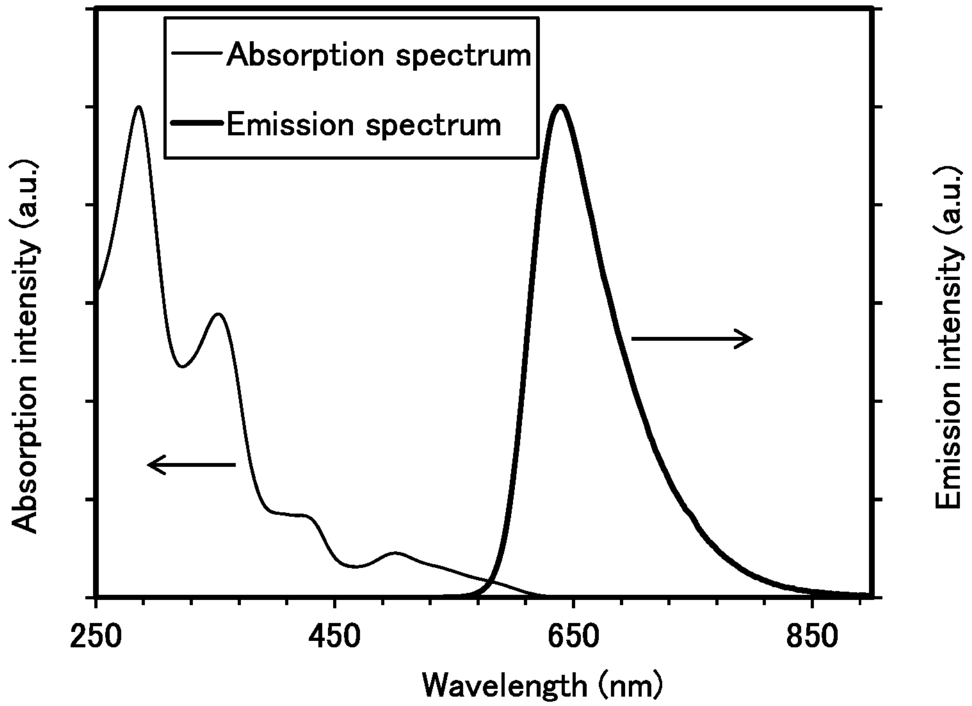
FIG. 15 shows an absorption spectrum and an emission spectrum of [Ir(dmmppr-mCP)$_2$(debm)] in a solution.

Next, an ultraviolet-visible absorption spectrum (hereinafter, simply referred to as an "absorption spectrum") and an emission spectrum of a dichloromethane solution of $[Ir(dmmppr\text{-}mCP)_2(debm)]$ were measured. The measurement of the absorption spectrum was conducted at room temperature, for which an ultraviolet-visible spectrophotometer (V550 type manufactured by JASCO Corporation) was used and the dichloromethane solution (0.0115 mmol/L) was put into a quartz cell. The measurement of the emission spectrum was conducted at room temperature, for which an absolute PL quantum yield measurement system (C11347-01 manufactured by Hamamatsu Photonics K.K.) was used and the deoxidized dichloromethane solution (0.0115 mmol/L) was put and sealed in a quartz cell under a nitrogen atmosphere in a glove box (LABstar M13 (1250/780) manufactured by Bright Co., Ltd.). FIG. 15 shows obtained measurement results of the absorption spectrum and the emission spectrum. The horizontal axis represents wavelength and the vertical axes represent absorption intensity and emission intensity.

In FIG. 15, two solid lines are shown; a thin line represents the absorption spectrum, and a thick line represents the emission spectrum. The absorption spectrum shown in FIG. 15 is the result obtained in such a way that the absorption spectrum measured by putting only dichloromethane in a quartz cell was subtracted from the absorption spectrum measured by putting the dichloromethane solution (0.0115 mmol/L) in a quartz cell.

As shown in FIG. 15, the organometallic complex [Ir(dmmppr-mCP)$_2$(debm)] has an emission peak at 639 nm, and red light emission was observed from the dichloromethane solution.

Example 2

Synthesis Example 2

Described in this example is a method for synthesizing bis{4-t-butyl-6-methyl-2-[5-(4-cyano-2-methylphenyl)-3-methyl-2-pyrazinyl-κN]phenyl-κC}(3, 7-diethyl-4,6-nonanedionato-κ$^2$O,O')iridium(III) (abbreviation: [Ir(tBummppr-mCP)$_2$(debm)]), which is the organometallic complex of one embodiment of the present invention represented by Structural Formula (101) in Embodiment 1. The structure of [Ir(tBummppr-mCP)$_2$(debm)] is shown below.

[Chemical Formula 36]

(101)

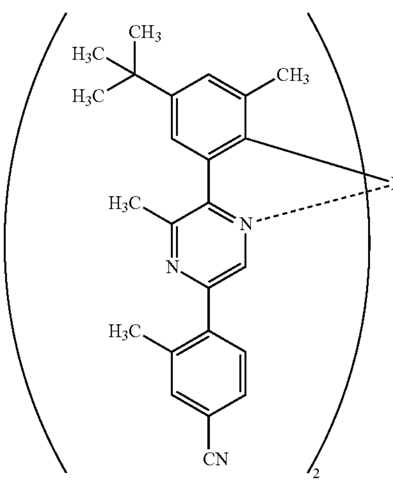

[Ir(tBummppr-mCP)$_2$(debm)]

Step 1: Synthesis of 5-chloro-2-(3-t-butyl-5-methylphenyl)-3-methylpyrazine

Into a 100-mL round-bottom flask were put 2.5 g (12 mmol) of 2-bromo-5-chloro-3-methylpyrazine, 2.3 g (12 mmol) of 3-t-butyl-5-methylphenylboronic acid, 5.1 g (24 mmol) of tripotassium phosphate, 0.90 g (1.1 mmol) of [1,1'-bis(diphenylphosphino)ferrocene]palladium(II) dichloride dichloromethane adduct, 50 mL of acetonitrile, and 5 mL of water, and the air in the flask was replaced with argon. Then, the mixture was subjected to irradiation with microwaves (2.45 GHz, 100 W) for two hours to cause a reaction. After the reaction, the obtained reaction mixture was subjected to extraction with ethyl acetate. After that, purification by silica column chromatography was performed. A developing solvent of hexane:dichloromethane=10:1 was used first, the proportion of dichloromethane was gradually increased, and finally, dichloromethane was used as a developing solvent. The obtained fraction was concentrated to give 3.1 g of a white solid in a yield of 94%. By nuclear magnetic resonance (NMR) spectroscopy, the obtained white solid was identified as 5-chloro-2-(3-t-butyl-5-methylphenyl)-3-methylpyrazine. The synthesis scheme in Step 1 is shown in Formula (b-1) below.

[Chemical Formula 37]

(b-1)

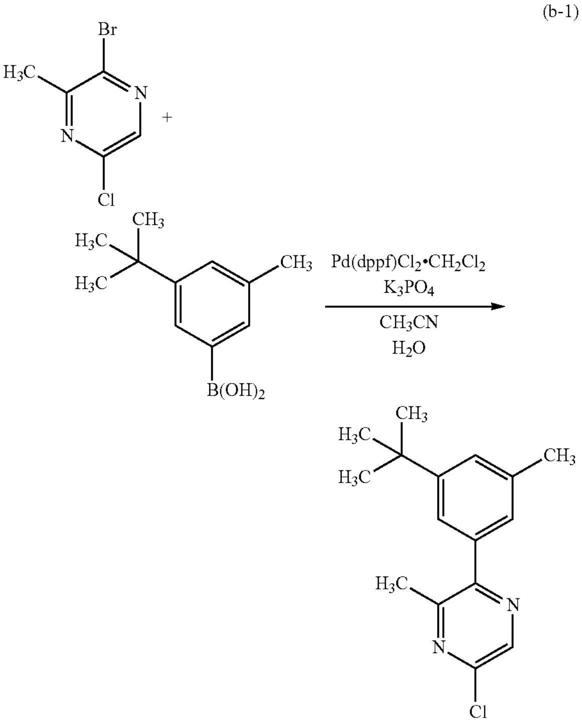

Step 2: Synthesis of 5-(4-cyano-2-methylphenyl)-2-(3-t-butyl-5-methylphenyl)-3-methylpyrazine Into a 300-mL three-neck flask were put 1.5 g (5.5 mmol) of 5-chloro-2-(3-t-butyl-5-methylphenyl)-3-methylpyrazine synthesized in Step 1, 1.1 g (6.6 mmol) of 4-cyano-2-methylphenylboronic acid, 3.5 g (16 mmol) of tripotassium phosphate, 49 mL of toluene, and 5 mL of water, and the air in the flask was replaced with nitrogen. This mixture was degassed by being stirred while the pressure in the flask was reduced. After degassing, 0.050 g (0.054 mmol) of tris(dibenzylideneacetone)dipalladium(0) and 0.098 g (0.22 mmol) of tris(2,6-dimethoxyphenyl)phosphine were added, and the mixture was stirred under a nitrogen stream at 110° C. for one hour. Furthermore, 0.051 g (0.056 mmol) of tris(dibenzylideneacetone)dipalladium(0) and 0.096 g (0.22 mmol) of tris(2,6-dimethoxyphenyl)phosphine were added, and the mixture was stirred under a nitrogen stream at 110° C. for eight hours. Moreover, 0.050 g (0.055 mmol) of tris(dibenzylideneacetone)dipalladium(0) and 0.097 g (0.22 mmol) of tris(2,6-dimethoxyphenyl)phosphine were added, and the mixture was stirred under a nitrogen stream at 110° C. for eight hours. The obtained reaction mixture was subjected to extraction with toluene. After that, purification by silica column chromatography was performed. A developing solvent of hexane:ethyl acetate=5:1 was used. The obtained fraction was concentrated to give a solid. Hexane was added to the obtained solid, which was then subjected to suction filtration to give 1.00 g of a white solid in a yield of 51%. The obtained white solid was identified as 5-(4-cyano-2-methylphenyl)-2-(3-t-butyl-5-methylphenyl)-3-methylpyrazine by nuclear magnetic resonance (NMR) spectroscopy. The synthesis scheme in Step 2 is shown in Formula (b-2) below.

[Chemical Formula 38]

(b-2)

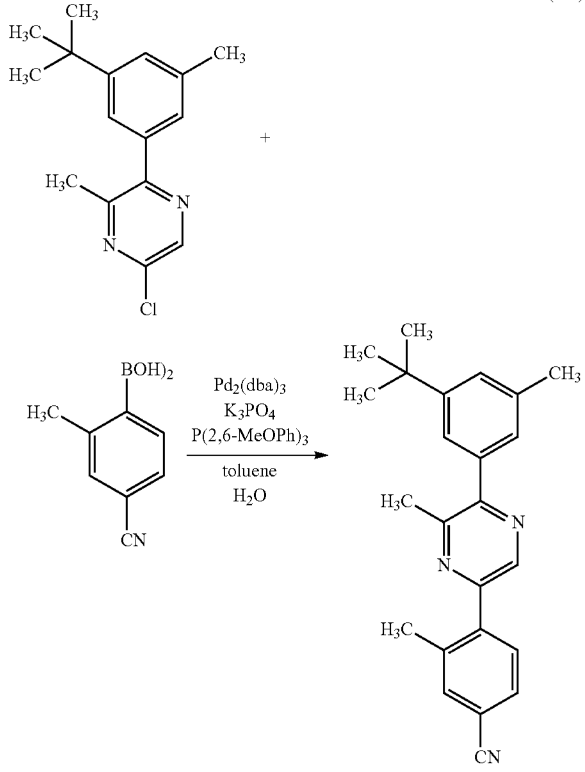

Step 3: Synthesis of bis{4-t-butyl-6-methyl-2-[5-(4-cyano-2-methylphenyl)-3-methyl-2-pyrazinyl-κN]phenyl-κC}(3, 7-diethyl-4,6-nonanedionato-κ$^2$O,O')iridium(III) (abbreviation: [Ir(tBummppr-mCP)$_2$(debm)])

Into a 100-mL round-bottom flask were put 1.26 g (3.55 mmol) of 5-(4-cyano-2-methylphenyl)-2-(3-t-butyl-5-methylphenyl)-3-methylpyrazine (abbreviation: HtBummppr-mCP) synthesized in Step 2, 0.61 g (1.74 mmol) of iridium chloride hydrate, 12 mL of 2-ethoxyethanol, and 4 mL of water, and the air in the flask was replaced with argon. This reaction container was subjected to irradiation with microwaves (2.45 GHz, 100 W) for one hour to cause a reaction. The obtained reaction mixture was put into a 300-mL three-neck flask and concentrated to give a red solid, to which 22 mL of N,N-dimethylformamide, 0.80 g (3.7 mmol) of 3,7-diethylnonane-4,6-dione, and 0.93 g (8.7 mmol) of sodium carbonate were added. The air in the flask was replaced with nitrogen, and this mixture was degassed by being stirred while the pressure in the flask was reduced. The reaction container was subjected to stirring under a nitrogen stream at 153° C. for four hours. The obtained reaction mixture was concentrated and then filtered, and the obtained filtrate was concentrated. After that, purification by silica column chromatography was performed. A developing solvent of hexane:dichloromethane=3:1 was used. The obtained fraction was concentrated to give a red solid. The obtained red solid was recrystallized with dichloromethane/methanol to give 0.73 g of a red solid in a yield of 38%. By a train sublimation method, 0.71 g of the obtained red solid was purified by sublimation. The purification by sublimation was performed by heating at 250° C. under a pressure of 2.3 Pa with an argon flow rate of 10.0 mL/min for 21 hours. After the purification by sublimation, 0.36 g of a red solid was obtained at a collection rate of 51%. The synthesis scheme in Step 3 is shown in Formula (b-3) below.

[Chemical Formula 39]

(b-3)

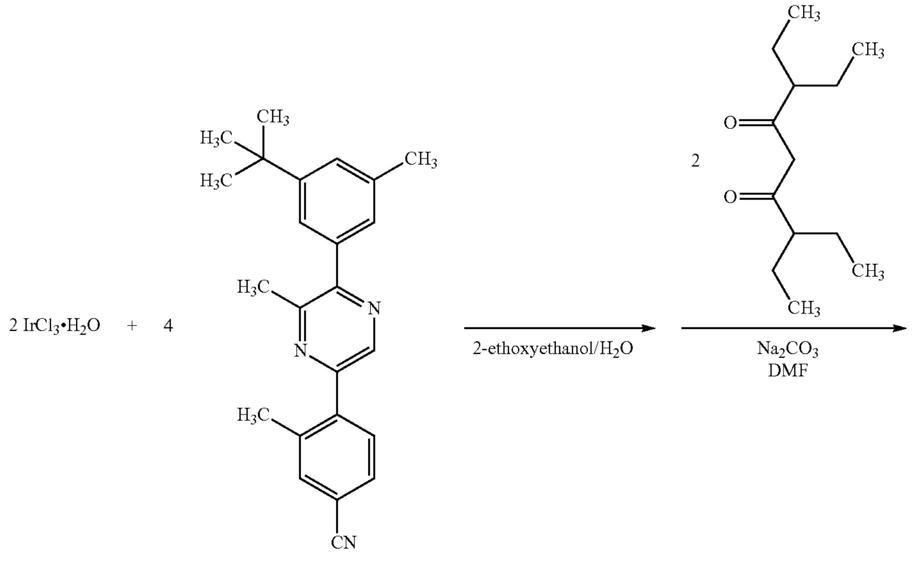

HtBummppr-mCP

-continued

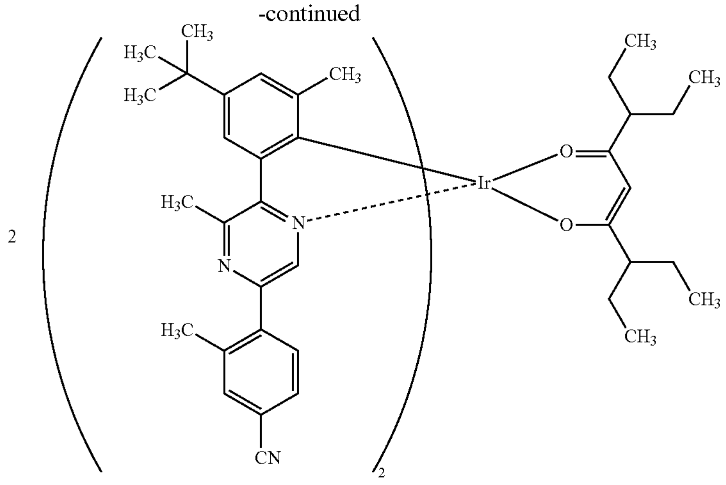

[Ir(tBummppr-mCP)$_2$(debm)]

Figure 16:
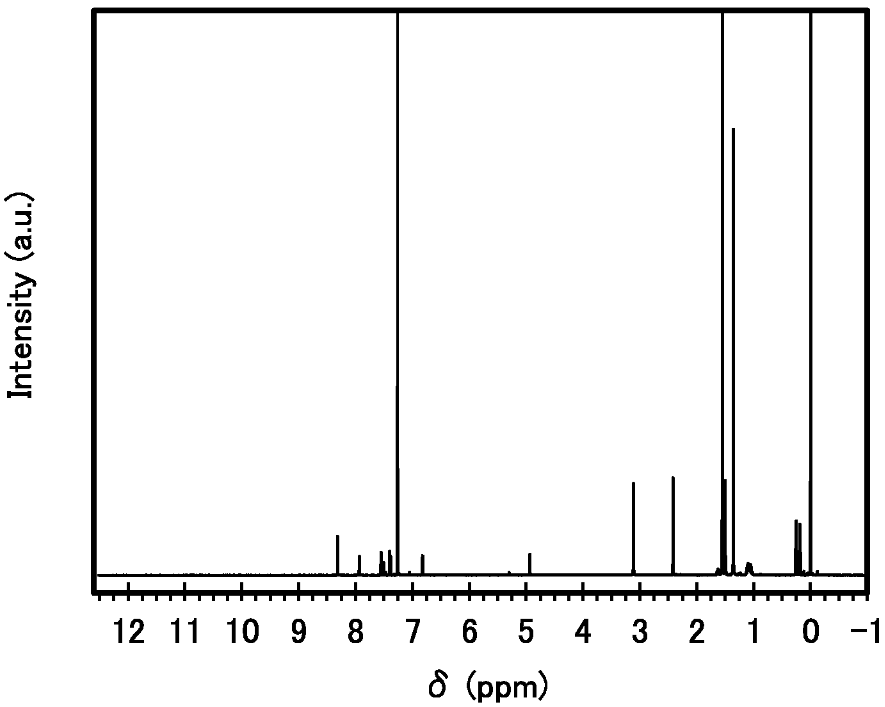
FIG. 16 is a 1H NMR chart of [Ir(tBummppr-mCP)$_2$(debm)].

Note that protons ($^1$H) of the red solid obtained in Step 3 above were measured by nuclear magnetic resonance (NMR) spectroscopy. The obtained values are shown below. FIG. 16 is a $^1$H-NMR chart. These reveal that the organometallic complex [Ir(tBummppr-mCP)$_2$(debm)] represented by Structural Formula (101) above was obtained in this synthesis example.

$^1$H-NMR. δ ($CDCl_3$): 0.19 (t, 6H), 0.25 (t, 6H), 1.04-1.12 (m, 8H), 1.35 (s, 18H), 1.50 (s, 6H), 1.61-1.65 (m, 2H), 2.42 (s, 6H), 3.11 (s, 6H), 4.93 (s, 1H), 6.82 (d, 2H), 7.39 (d, 2H), 7.51 (d, 2H), 7.55 (s, 2H), 7.93 (d, 2H), 8.32 (s, 2H).

Figure 17:
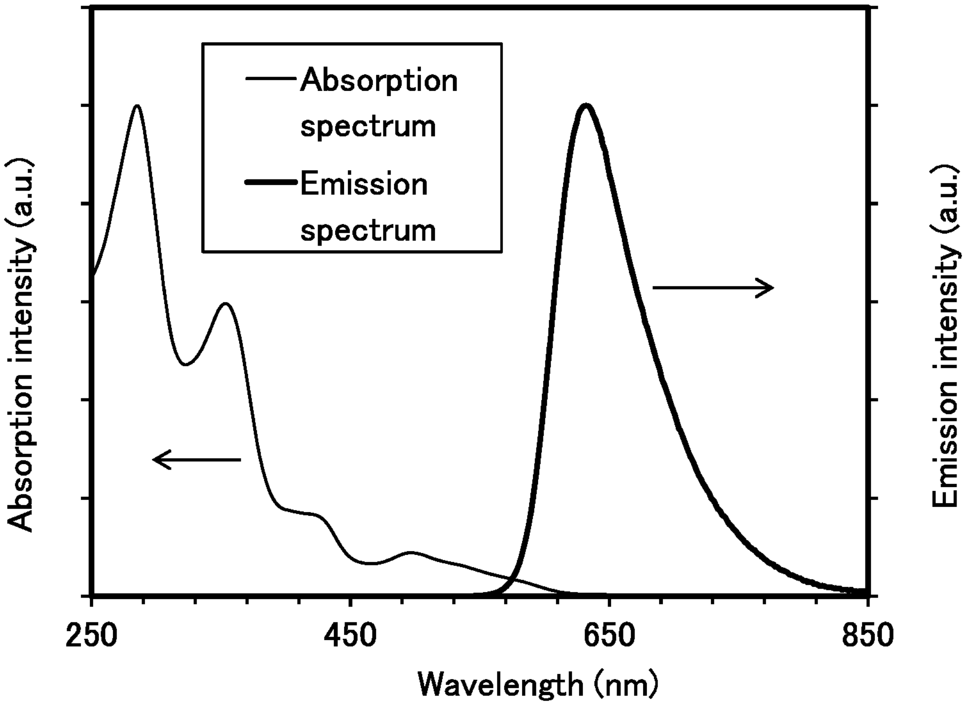
FIG. 17 shows an absorption spectrum and an emission spectrum of [Ir(tBummppr-mCP)$_2$(debm)] in a solution.

Next, an ultraviolet-visible absorption spectrum (hereinafter, simply referred to as an "absorption spectrum") and an emission spectrum of a dichloromethane solution of [Ir (tBummppr-mCP)$_2$(debm)] were measured. The measurement of the absorption spectrum was conducted at room temperature, for which an ultraviolet-visible spectrophotometer (V550 type manufactured by JASCO Corporation) was used and the dichloromethane solution (0.0110 mmol/L) was put into a quartz cell. The measurement of the emission spectrum was conducted at room temperature, for which an absolute PL quantum yield measurement system (C11347-01 manufactured by Hamamatsu Photonics K.K.) was used and the deoxidized dichloromethane solution (0.0110 mmol/L) was put and sealed in a quartz cell under a nitrogen atmosphere in a glove box (LABstar M13 (1250/780) manufactured by Bright Co., Ltd.). FIG. 17 shows obtained measurement results of the absorption spectrum and the emission spectrum. The horizontal axis represents wavelength and the vertical axes represent absorption intensity and emission intensity. The absorption spectrum shown in FIG. 17 is the result obtained in such a way that the absorption spectrum measured by putting only dichloromethane in a quartz cell was subtracted from the absorption spectrum measured by putting the dichloromethane solution (0.0110 mmol/L) in a quartz cell.

As shown in FIG. 17, the iridium complex [Ir(tBummppr-mCP)$_2$(debm)] has an emission peak at 632 nm, and red light emission was observed from the dichloromethane solution.

Example 3

Figure 18:
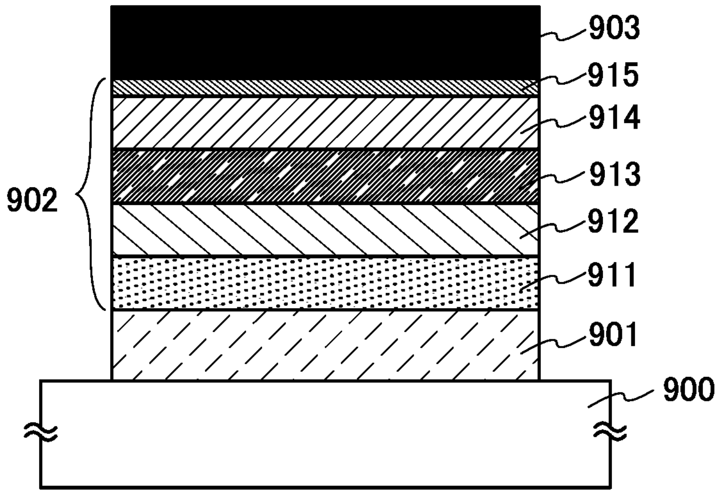
FIG. 18 is a diagram illustrating a light-emitting device.

In this example, a light-emitting device 1, a light-emitting device 2, a light-emitting device 3, and a light-emitting device 4 were fabricated using [Ir(dmmppr-mCP)$_2$(debm)] (Structural Formula (100)), which is the organometallic complex of one embodiment of the present invention. Note that the fabrication of the light-emitting devices is described with reference to FIG. 18. Chemical formulae of materials used in this example are shown below.

[Chemical Formula 40]

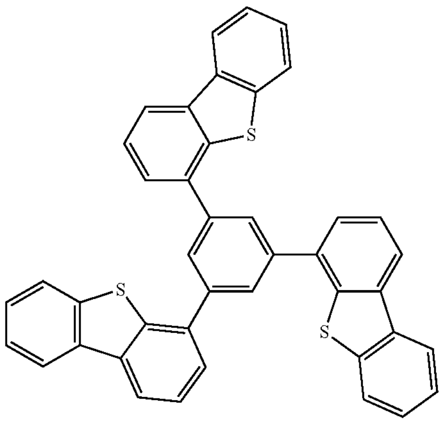

DBT3P-II

-continued

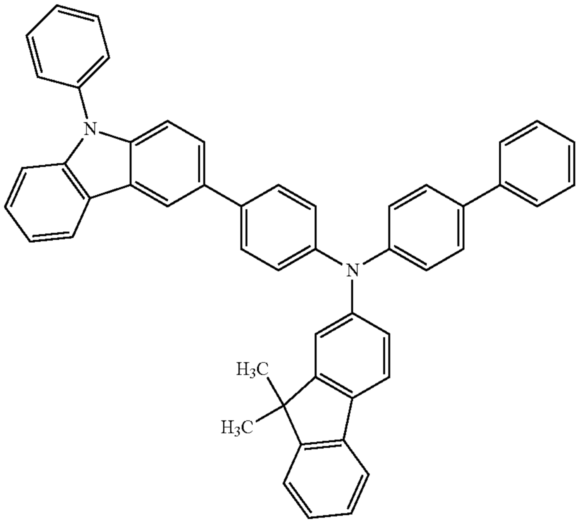

PCBBiF (100)

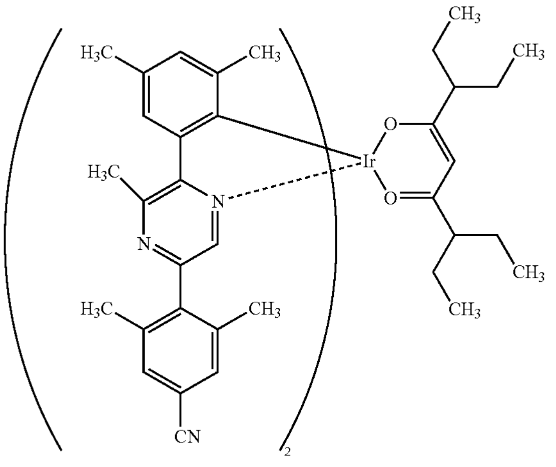

[Ir(dmmppr-mCP)$_2$(debm)]

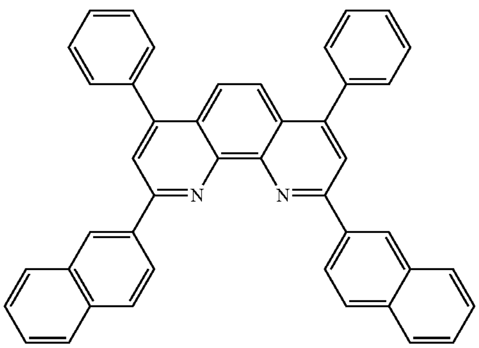

NBphen

-continued

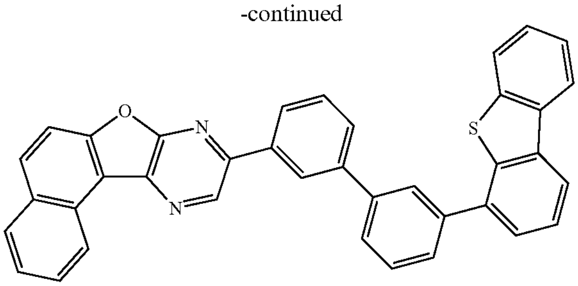

9mDBtBPNfpr

<<Fabrication of Light-Emitting Device 1, Light-Emitting Device 2, Light-Emitting Device 3, and Light-Emitting Device 4>>

First, indium tin oxide (ITO) containing silicon oxide was deposited over a glass substrate 900 by a sputtering method, so that a first electrode 901 functioning as an anode was formed. Note that the thickness was 70 nm and the area of the electrode was 2 mm×2 mm.

Next, in pretreatment for forming the light-emitting device over the substrate 900, a surface of the substrate was washed with water and baked at 200° C. for one hour, and then UV ozone treatment was performed for 370 seconds.

After that, the substrate was transferred into a vacuum evaporation apparatus in which the pressure was reduced to about $1\times10^{-4}$ Pa, vacuum baking at 170° C. for 30 minutes was performed in a heating chamber in the vacuum evaporation apparatus, and then the substrate 900 was naturally cooled down for about 30 minutes.

Next, the substrate 900 was fixed to a holder provided in the vacuum evaporation apparatus so that a surface of the substrate 900 over which the first electrode 901 was formed faced downward. In this example, a case is described in which a hole-injection layer 911, a hole-transport layer 912, a light-emitting layer 913, an electron-transport layer 914, and an electron-injection layer 915 which are included in an EL layer 902 are sequentially formed by a vacuum evaporation method.

The hole-injection layer 911 was formed over the first electrode 901 in such a manner that the pressure in the vacuum evaporation apparatus was reduced to $1\times10^{-4}$ Pa, and then N-(1,1'-biphenyl-4-yl)-N-[4-(9-phenyl-9H-carbazol-3-yl)phenyl]-9,9-dimethyl-9H-fluoren-2-amine (abbreviation: PCBBiF) and an electron acceptor material (OCHD-001) were deposited by co-evaporation in PCBBiF:OCHD-001=1:0.1 (mass ratio). The thickness was set to 10 nm. Note that co-evaporation is an evaporation method in which a plurality of different substances are concurrently vaporized from different evaporation sources.

Next, PCBBiF was deposited by evaporation to a thickness of 90 nm, whereby the hole-transport layer 912 was formed.

Next, the light-emitting layer 913 was formed over the hole-transport layer 912.

In the case of the light-emitting device 1, 9-[3'-(dibenzothiophen-4-yl)biphenyl-3-yl]naphtho[1',2':4,5]furo[2,3-b]pyrazine (abbreviation: 9mDBTBPNfpr), PCBBiF, and [Ir(dmmppr-mCP)$_2$(debm)] were deposited by co-evaporation in 9mDBTBPNfpr:PCBBiF:[Ir(dmmppr-mCP)$_2$(debm)]=0.7:0.3:0.03 (mass ratio) to a thickness of 40 nm. In the case of the light-emitting device 2, 9mDBTBPNfpr, PCBBiF, and [Ir(dmmppr-mCP)$_2$(debm)] were deposited by co-evaporation in 9mDBTBPNfpr:PCBBiF:[Ir(dmmppr-mCP)$_2$(debm)]=0.7:0.3:0.05 (mass ratio) to a thickness of 40 nm. In the case of the light-emitting device 3, 9mDBTBPNfpr, PCBBiF, and [Ir(dmmppr-mCP)$_2$(debm)] were deposited by co-evaporation in 9mDBTBPNfpr:PCBBiF:[Ir(dmmppr-mCP)$_2$(debm)]=0.7:0.3:0.1 (mass ratio) to a thickness of 40 nm. In the case of the light-emitting device 4, 9mDBTBPNfpr, PCBBiF, and [Ir(dmmppr-mCP)$_2$(debm)] were deposited by co-evaporation in 9mDBTBPNfpr:PCBBiF:[Ir(dmmppr-mCP)$_2$(debm)]=0.7:0.3:0.15 (mass ratio) to a thickness of 40 nm.

Next, over the light-emitting layer 913, 9mDBTBPNfpr was deposited by evaporation to a thickness of 30 nm, and then NBphen was deposited by evaporation to a thickness of 15 nm, whereby the electron-transport layer 914 was formed.

Furthermore, lithium fluoride was deposited by evaporation to a thickness of 1 nm over the electron-transport layer 914, whereby the electron-injection layer 915 was formed.

Finally, aluminum was deposited by evaporation to a thickness of 200 nm over the electron-injection layer 915, whereby a second electrode 903 functioning as a cathode was formed. Thus, the light-emitting device 1, the light-emitting device 2, the light-emitting device 3, and the light-emitting device 4 were obtained. Note that an evaporation method using resistive heating was employed for all the evaporation steps.

Table 1 shows the element structures of the light-emitting device 1, the light-emitting device 2, the light-emitting device 3, and the light-emitting device 4 obtained in the above manner.

TABLE 1

| | First electrode | Hole-injection layer | Hole-transport layer | Light-emitting layer | Electron-transport layer | | Electron-injection layer | Second electrode |
|---|---|---|---|---|---|---|---|---|
| Light-emitting device 1 | NITO (70 nm) | PCBBiF:OCHD-001 (1:0.1 10 nm) | PCBBiF (90 nm) | * | 9mDBTBPNfpr (30 nm) | NBphen (15 nm) | LiF (1 nm) | Al (200 nm) |
| Light-emitting device 2 | | | | ** | | | | |
| Light-emitting device 3 | | | | *** | | | | |
| Light-emitting device 4 | | | | **** | | | | |

* 9mDBTBPNfpr:PCBBiF:[Ir(dmmppr-mCP)$_2$(debm)] (0.7:0.3:0.03 40 nm)
** 9mDBTBPNfpr:PCBBiF:[Ir(dmmppr-mCP)$_2$(debm)] (0.7:0.3:0.05 40 nm)
*** 9mDBTBPNfpr:PCBBiF:[Ir(dmmppr-mCP)$_2$(debm)] (0.7:0.3:0.1 40 nm)
**** 9mDBTBPNfpr:PCBBiF:[Ir(dmmppr-mCP)$_2$(debm)] (0.7:0.3:0.15 40 nm)

Furthermore, the fabricated light-emitting device 1, light-emitting device 2, light-emitting device 3, and light-emitting device 4 were sealed in a glove box containing a nitrogen atmosphere so as not to be exposed to the air (a sealant was applied to surround the elements, and at the time of sealing, UV treatment was performed and then heat treatment was performed at 80° C. for one hour).

<<Operation Characteristics of Light-Emitting Device 1, Light-Emitting Device 2, Light-Emitting Device 3, and Light-Emitting Device 4>>

Operation characteristics of each of the fabricated light-emitting devices were measured. Note that the measurement was carried out at room temperature (in an atmosphere maintained at 25° C.).

Figure 19:
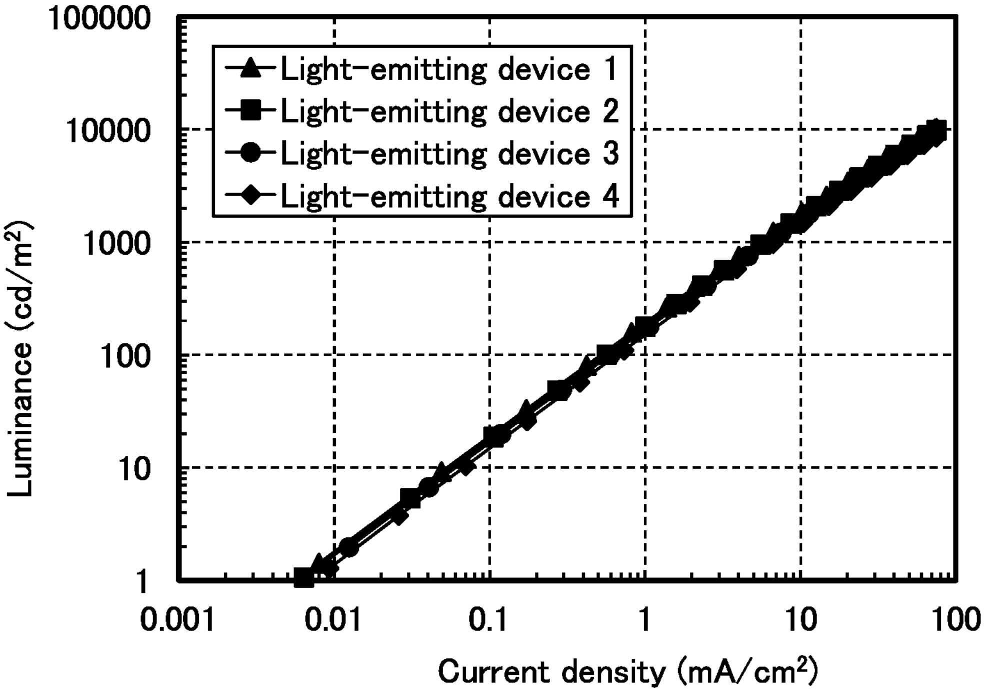
FIG. 19 is a graph showing current density-luminance characteristics of a light-emitting device 1, a light-emitting device 2, a light-emitting device 3, and a light-emitting device 4.
Figure 20:
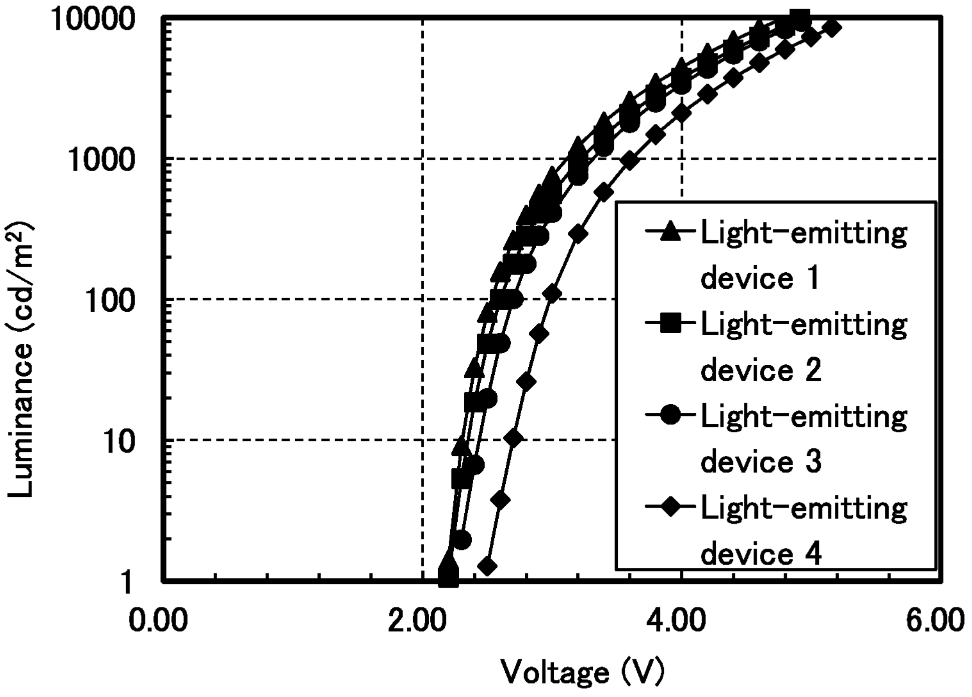
FIG. 20 is a graph showing voltage-luminance characteristics of the light-emitting device 1, the light-emitting device 2, the light-emitting device 3, and the light-emitting device 4.
Figure 21:
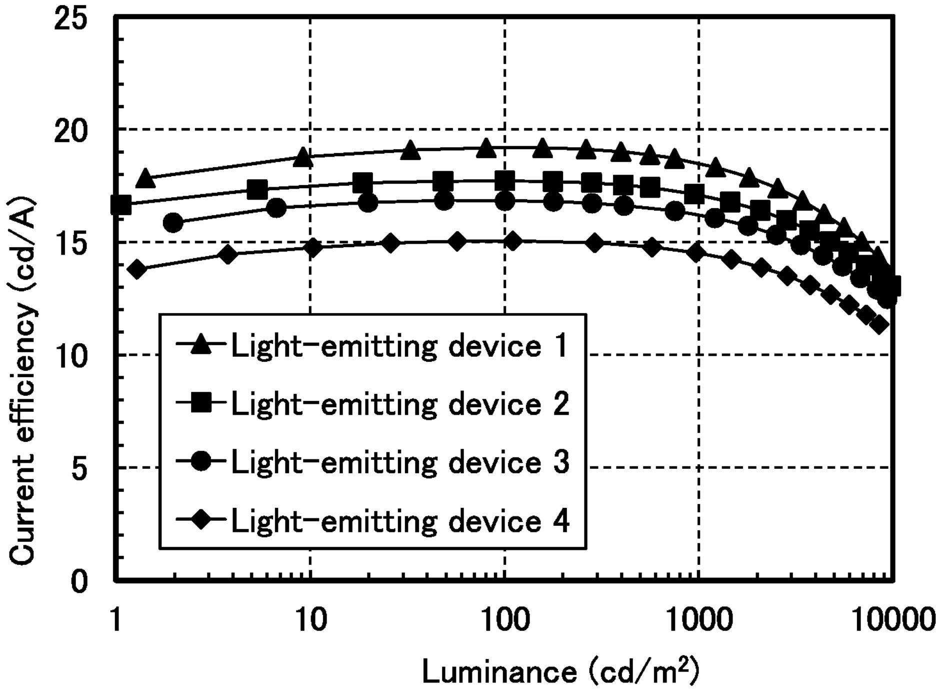
FIG. 21 is a graph showing luminance-current efficiency characteristics of the light-emitting device 1, the light-emitting device 2, the light-emitting device 3, and the light-emitting device 4.
Figure 22:
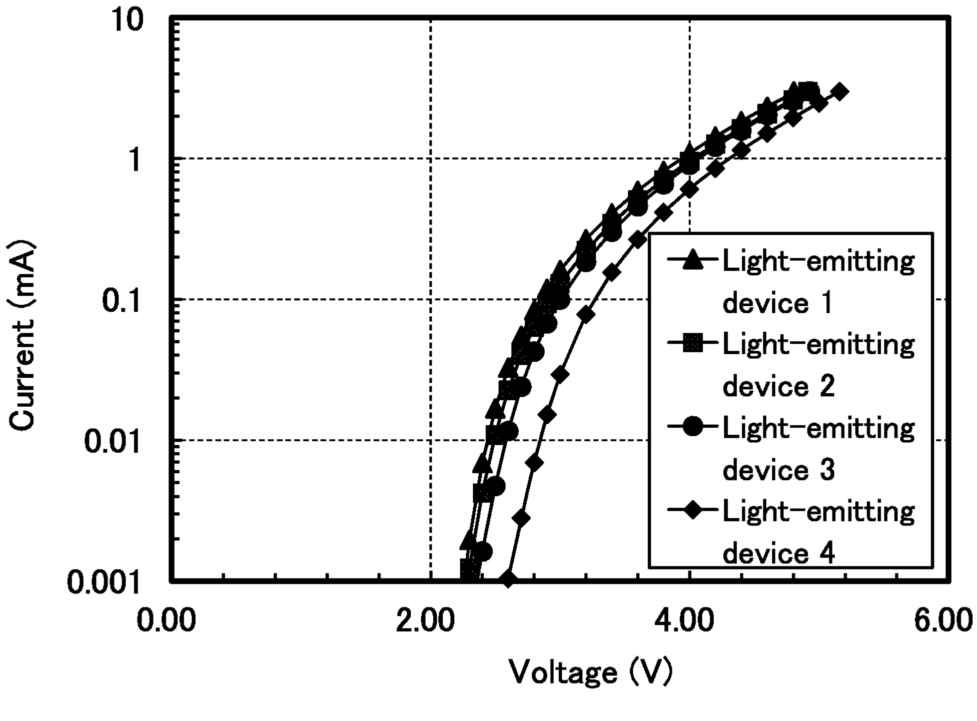
FIG. 22 is a graph showing voltage-current characteristics of the light-emitting device 1, the light-emitting device 2, the light-emitting device 3, and the light-emitting device 4.

FIG. 19 shows current density-luminance characteristics of the light-emitting device 1, the light-emitting device 2, the light-emitting device 3, and the light-emitting device 4, FIG. 20 shows voltage-luminance characteristics thereof, FIG. 21 shows luminance-current efficiency characteristics thereof, and FIG. 22 shows voltage-current characteristics thereof.

Table 2 below shows initial values of main characteristics of the light-emitting device 1, the light-emitting device 2, the light-emitting device 3, and the light-emitting device 4 at around 1000 cd/m$^2$.

TABLE 2

| | Voltage (V) | Current (mA) | Current density (mA/cm$^2$) | Chromaticity (x, y) | Luminance (cd/m$^2$) | Current efficiency (cd/A) | Power efficiency (lm/W) | External quantum efficiency (%) |
|---|---|---|---|---|---|---|---|---|
| Light-emitting device 1 | 3.2 | 0.27 | 6.7 | (0.69, 0.31) | 1200 | 18 | 18 | 26 |

TABLE 2-continued

| | Voltage (V) | Current (mA) | Current density (mA/cm$^2$) | Chromaticity (x, y) | Luminance (cd/m$^2$) | Current efficiency (cd/A) | Power efficiency (lm/W) | External quantum efficiency (%) |
|---|---|---|---|---|---|---|---|---|
| Light-emitting device 2 | 3.2 | 0.22 | 5.6 | (0.69, 0.31) | 950 | 17 | 17 | 27 |
| Light-emitting device 3 | 3.4 | 0.30 | 7.5 | (0.69, 0.31) | 1200 | 16 | 15 | 26 |
| Light-emitting device 4 | 3.6 | 0.27 | 6.7 | (0.70, 0.30) | 970 | 15 | 13 | 25 |

Figure 23:
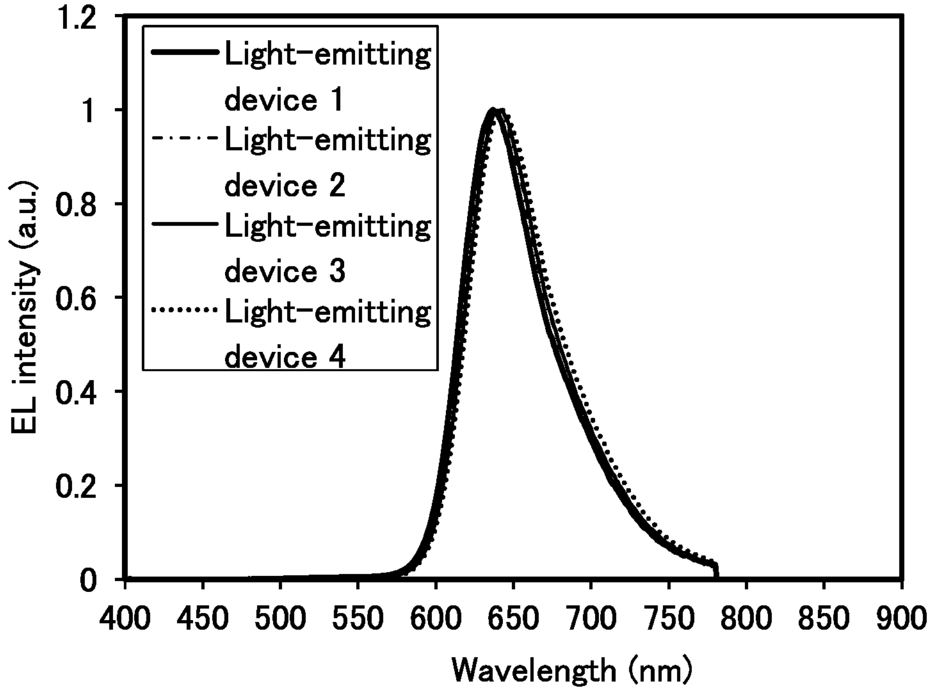
FIG. 23 is a graph showing emission spectra of the light-emitting device 1, the light-emitting device 2, the light-emitting device 3, and the light-emitting device 4.

FIG. 23 shows emission spectra of the light-emitting device 1, the light-emitting device 2, the light-emitting device 3, and the light-emitting device 4 at around 1000 cd/m$^2$. As shown in FIG. 23, it is found that the emission spectra of the light-emitting device 1, the light-emitting device 2, the light-emitting device 3, and the light-emitting device 4 each have a peak at around 642 nm.

Figure 24:
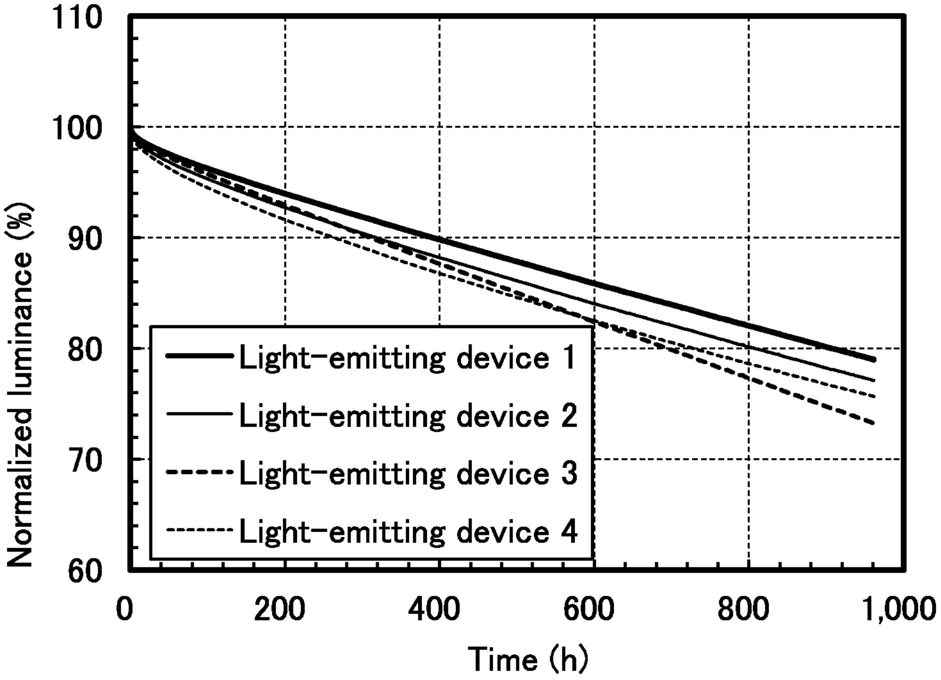
FIG. 24 is a graph showing reliability of the light-emitting device 1, the light-emitting device 2, the light-emitting device 3, and the light-emitting device 4.

Next, a reliability test was performed on the light-emitting device 1, the light-emitting device 2, the light-emitting device 3, and the light-emitting device 4. FIG. 24 shows the results of the reliability test. In FIG. 24, the vertical axis represents normalized luminance (%) with an initial luminance of 100%, and the horizontal axis represents driving time (h) of the element. In the reliability test, the current density was fixed to 75 mA/cm$^2$.

In comparing the light-emitting device 1, the light-emitting device 2, the light-emitting device 3, and the light-emitting device 4, the obtained results show that the light-emitting devices including the organometallic complex [Ir(dmmppr-mCP)$_2$(debm)] of one embodiment of the present invention in the light-emitting layers have higher reliability with a lower concentration of [Ir(dmmppr-mCP)$_2$(debm)]. This is probably because the carrier-trapping property of the dopant is diminished. In a structure including a small amount of a dopant, the dopant has a carrier-trapping property. Longer lifetime was able to be achieved probably because a lower dopant concentration enabled diminishment of the trapping property, a reduction in driving voltage, and relaxation of localization of the carriers in the light-emitting layer, which accordingly resulted in an expansion of the light-emitting region.

Example 4

In this example, a light-emitting device 5 including the organometallic complex [Ir(tBummppr-mCP)$_2$(debm)] (Structural Formula (101)) of one embodiment of the present invention was fabricated and evaluation results of the characteristics of the light-emitting device 5 are described. Note that the light-emitting device 5 was fabricated in a manner substantially similar to that in Example 3. Thus, points different from those in Example 3 are mainly described in this example. Chemical formulae of materials used in this example, which have not shown in Example 3, are shown below.

[Chemical Formula 41]

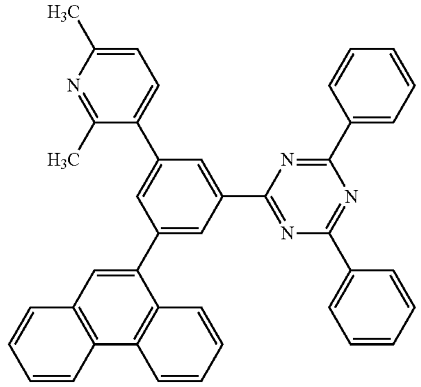

mPn-mDMePyPTzn

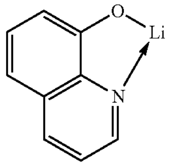

Liq

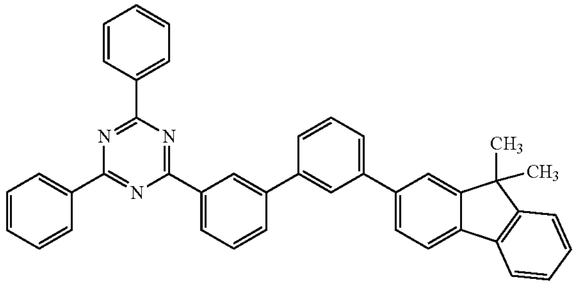

mFBPTzn

<<Fabrication of Light-Emitting Device>>

The light-emitting device 5 is different from the light-emitting devices 1 to 4 in Example 3 in the structures of the hole-injection layer 911, the light-emitting layer 913, and the electron-transport layer 914.

In the light-emitting device 5, PCBBiF and OCHD-001 were deposited by co-evaporation in PCBBiF:OCHD-001=1:0.05 (mass ratio), as the hole-injection layer 911. The thickness was set to 10 nm as in Example 3.

As the light-emitting layer 913, 9mDBTBPNfpr, PCBBiF, and [Ir(tBummppr-mCP)$_2$(debm)] were deposited by co-evaporation in 9mDBTBPNfpr:PCBBiF:[Ir(tBummppr-mCP)$_2$(debm)]=0.7:0.3:0.1 (mass ratio). The thickness was set to 30 nm.

As the electron-transport layer 914, mFBPTzn was deposited by evaporation to a thickness of 10 nm over the light-emitting layer 913, and then 2-[3-(2,6-dimethyl-3-pyridinyl)-5-(9-phenanthrenyl)phenyl]-4,6-diphenyl-1,3,5-triazine (abbreviation: mPn-mDMePyPTzn) and Liq were deposited by co-evaporation in mPn-mDMePyPTzn: Liq=0.5:0.5 (mass ratio) to a thickness of 35 nm.

Table 3 shows the element structure of the light-emitting device 5 fabricated by the above-described method.

TABLE 3

| | First electrode | Hole-injection layer | Hole-transport layer | Light-emitting layer | Electron-transport layer | | Electron-injection layer | Second electrode |
|---|---|---|---|---|---|---|---|---|
| Light-emitting device 5 | NITO (70 nm) | PCBBiF:OCHD-001 (1:0.05 10 nm) | PCBBiF (90 nm) | * | mFBPTzn (10 nm) | mPn-mDMePyPTzn:Liq (0.5:0.5 35 nm) | LiF (1 nm) | Al (200 nm) |

* 9mDBTBPNfpr:PCBBiF:[Ir(tBummppr-mCP)$_2$(debm)] (0.7:0.3:0.1 30 nm)

The fabricated light-emitting device 5 was sealed in a glove box containing a nitrogen atmosphere so as not to be exposed to the air (a sealant was applied to surround the element, and at the time of sealing, UV treatment was performed and then heat treatment was performed at 80° C. for one hour).

<<Operation Characteristics of Light-Emitting Device 5>>

Operation characteristics of the fabricated light-emitting device was measured. Note that the measurement was carried out at room temperature (in an atmosphere maintained at 25° C.).

Figure 25:
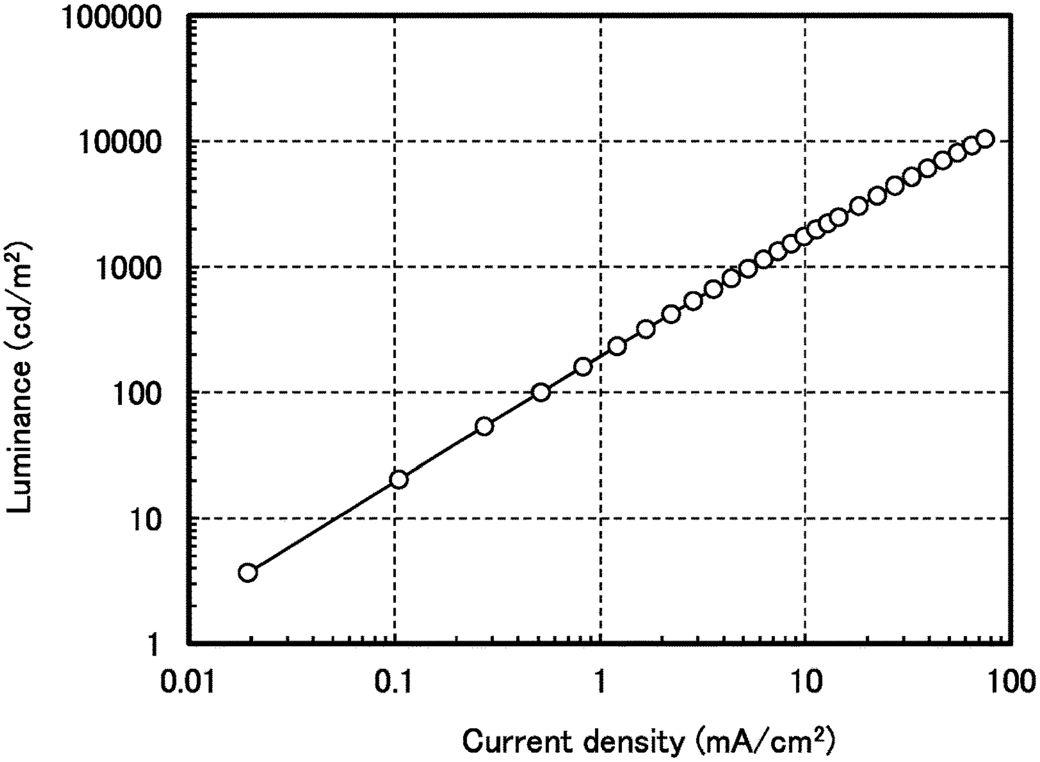
FIG. 25 is a graph showing current density-luminance characteristics of a light-emitting device 5.
Figure 26:
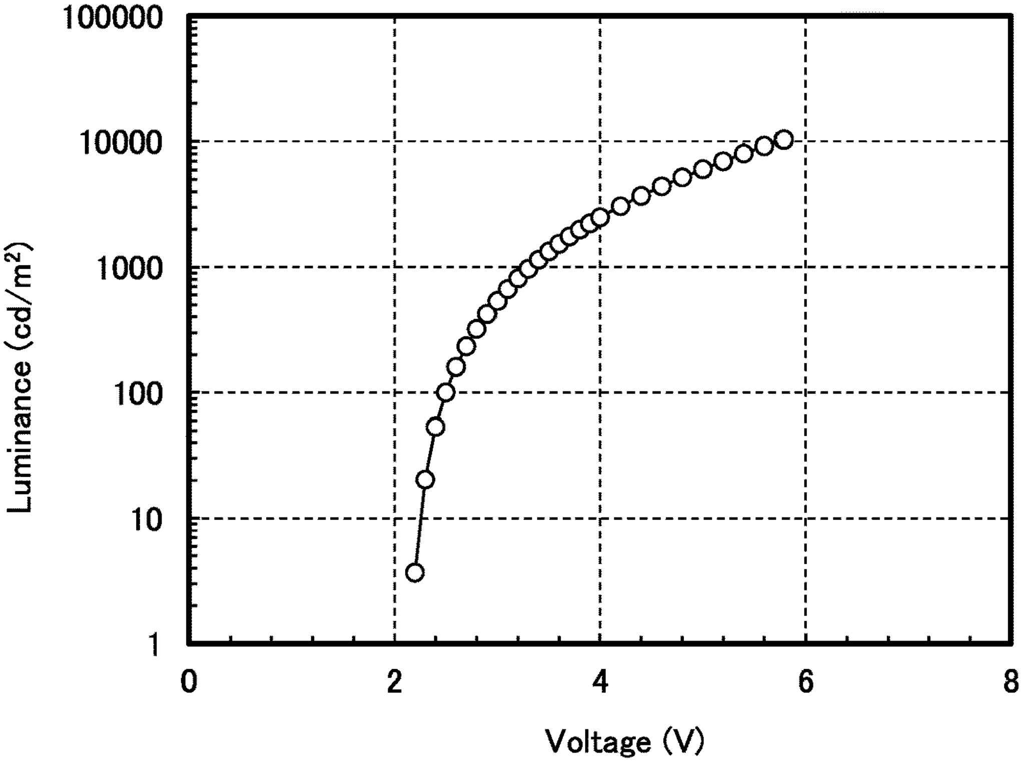
FIG. 26 is a graph showing voltage-luminance characteristics of the light-emitting device 5.
Figure 27:
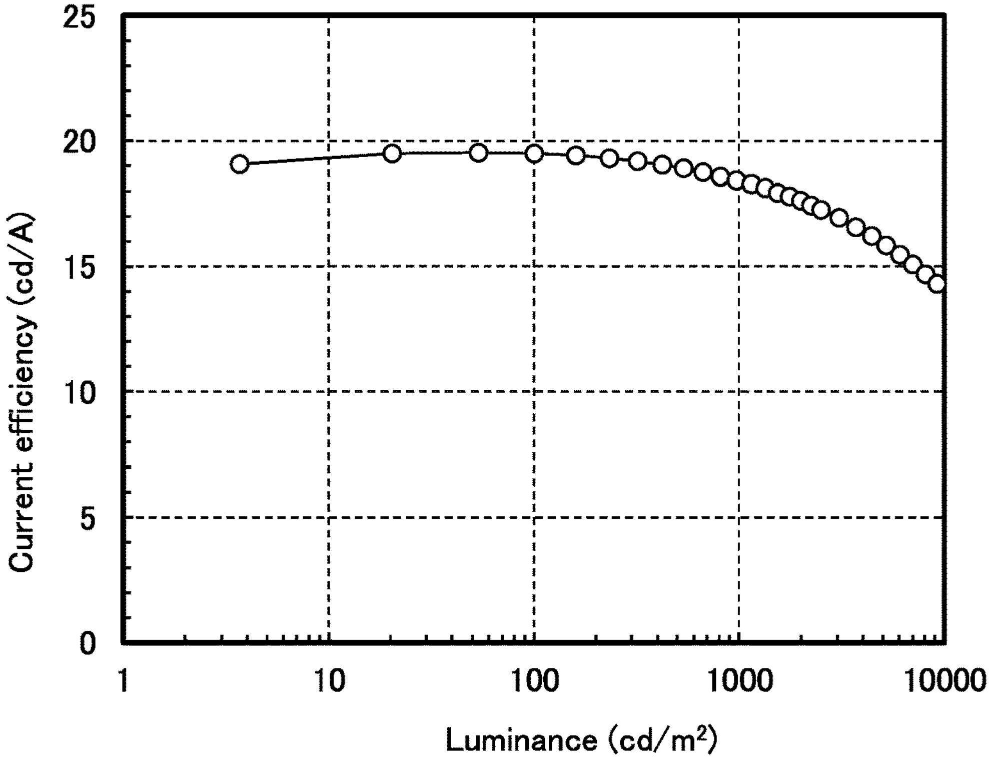
FIG. 27 is a graph showing luminance-current efficiency characteristics of the light-emitting device 5.
Figure 28:
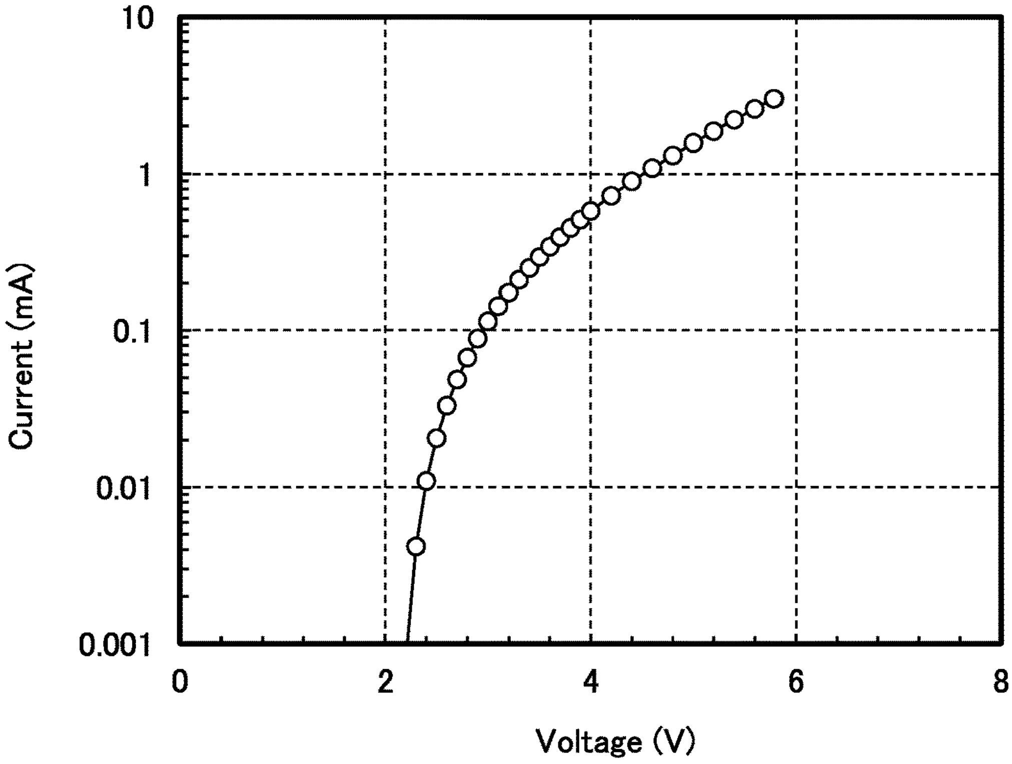
FIG. 28 is a graph showing voltage-current characteristics of the light-emitting device 5.

FIG. 25 shows current density-luminance characteristics of the light-emitting device 5, FIG. 26 shows voltage-luminance characteristics thereof, FIG. 27 shows luminance-current efficiency characteristics thereof, and FIG. 28 shows voltage-current characteristics thereof.

Table 4 below shows initial values of main characteristics of the light-emitting device 5 at around 1000 cd/m$^2$.

TABLE 4

| | Voltage (V) | Current (mA) | Current density (mA/cm$^2$) | Chromaticity (x, y) | Luminance (cd/m$^2$) | Current efficiency (cd/A) | Power efficiency (lm/W) | External quantum efficiency (%) |
|---|---|---|---|---|---|---|---|---|
| Light-emitting device 5 | 3.3 | 0.21 | 5.3 | (0.69, 0.31) | 972 | 18 | 18 | 26 |

Figure 29:
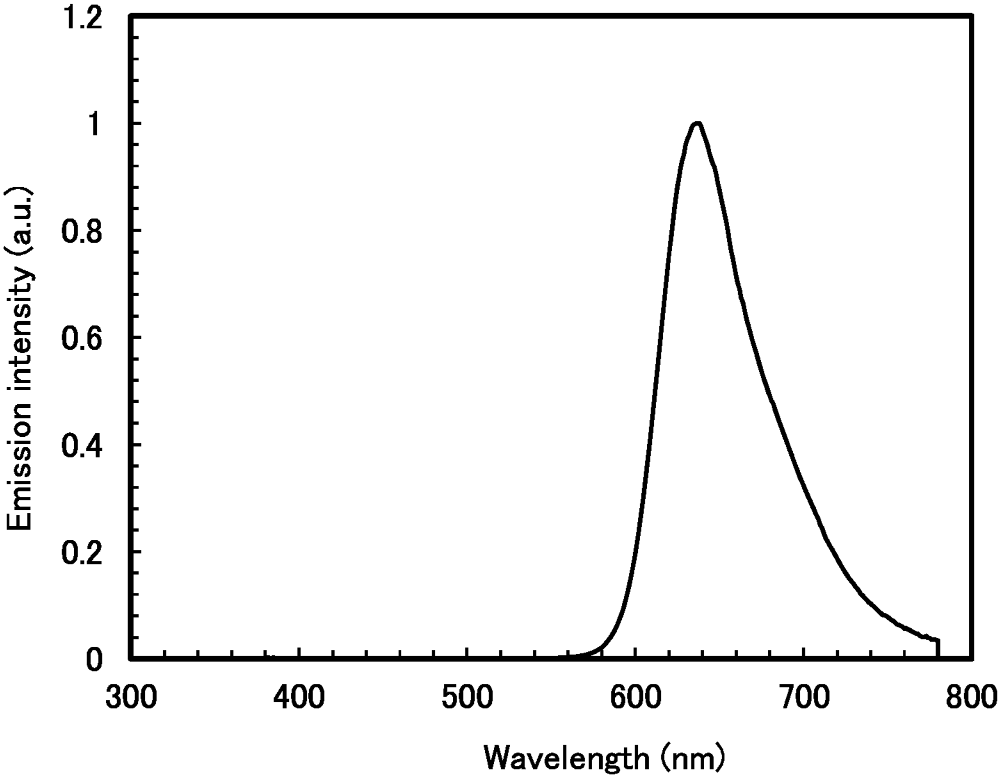
FIG. 29 is a graph showing an emission spectrum of the light-emitting device 5.

FIG. 29 shows an emission spectrum of the light-emitting device 5 at around 1000 cd/m$^2$. As shown in FIG. 29, it is found that the emission spectrum of the light-emitting device 5 has a peak at around 638 nm.

Figure 30:
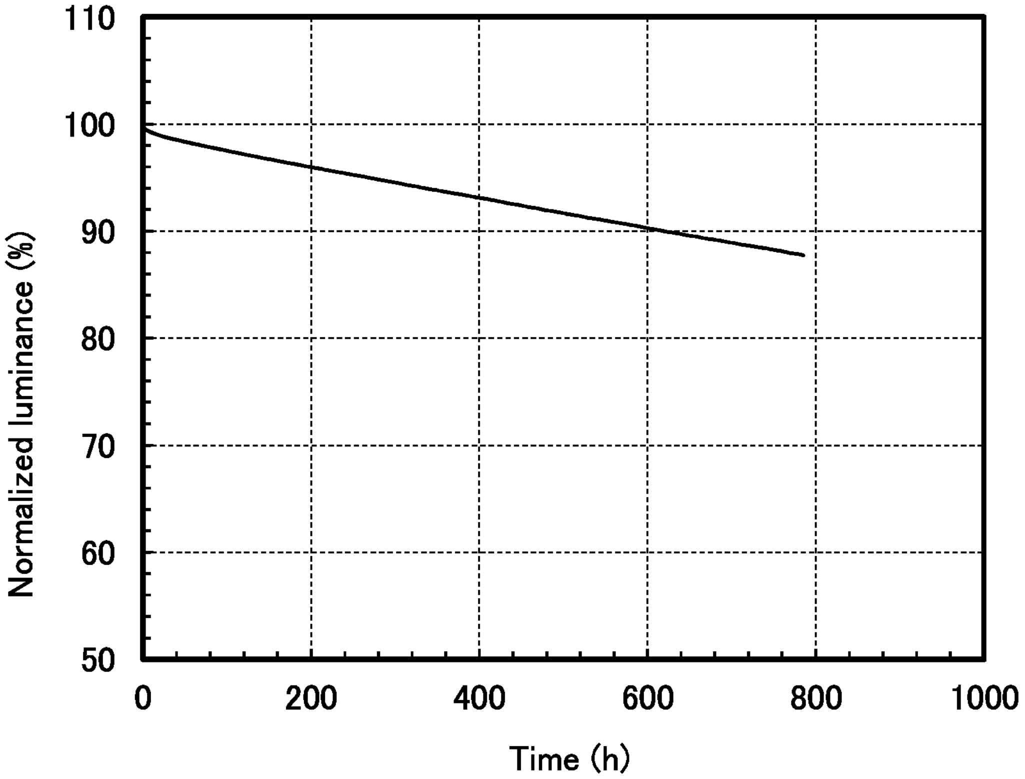
FIG. 30 is a graph showing reliability of the light-emitting device 5.

Next, a reliability test was performed on the light-emitting device 5. FIG. 30 shows the result of the reliability test. In FIG. 30, the vertical axis represents normalized luminance (%) with an initial luminance of 100%, and the horizontal axis represents driving time (h) of the element. In the reliability test, the current density was fixed to 75 mA/cm$^2$.

It is found from FIG. 30 that the light-emitting device 5 has much higher reliability than the light-emitting devices 1 to 4.

REFERENCE NUMERALS

181: first electrode, 182: second electrode, 183: EL layer, 191: hole-injection layer, 192: hole-transport layer, 193: light-emitting layer, 194: electron-transport layer, 195: electron-transport layer, 196: charge-generation layer, 197: P-type layer, 198: electron-relay layer, 199: electron-injection buffer layer, 400: substrate, 401: electrode, 403: EL layer, 404: second electrode, 405: sealant, 406: sealant, 407: sealing substrate, 412: pad, 420: IC chip, 501: anode, 502: cathode, 511: light-emitting unit, 512: light-emitting unit, 513: charge-generation layer, 601: source line driver circuit, 602: pixel portion, 603: gate line driver circuit, 604: sealing substrate, 605: sealant, 607: space, 608: wiring, 610: element substrate, 611: switching FET, 612: current control FET, 613: electrode, 614: insulator, 616: EL layer, 617: second electrode, 618: light-emitting device, 623: FET, 900: substrate, 901: first electrode, 902: EL layer, 903: second electrode, 911: hole-injection layer, 912: hole-transport layer, 913: light-emitting layer, 914: electron-transport layer, 915: electron-injection layer, 951: substrate, 952: electrode, 953: insulating layer, 954: partition layer, 955: EL layer, 956: electrode, 1001: substrate, 1002: base insulating film, 1003: gate insulating film, 1006: gate electrode, 1007: gate electrode, 1008: gate electrode, 1020: interlayer insulating film, 1021: interlayer insulating film, 1022: electrode, 1025: partition, 1028: EL layer, 1029: second electrode, 1031: sealing substrate, 1032: sealant, 1033: base material, 1035: black matrix, 1036: overcoat layer, 1037: interlayer insulating film, 1040: pixel portion, 1041: driver circuit portion, 1042: peripheral portion, 2001: housing, 2002: light source, 2100: robot, 2101: illuminance sensor, 2102: microphone, 2103: upper camera, 2104: speaker, 2105: display, 2106: lower camera, 2107: obstacle sensor, 2108: moving mechanism, 2110: arithmetic device, 3001: lighting device, 5000: housing, 5001: display portion, 5002: display portion, 5003: speaker, 5004: LED lamp, 5006: connection terminal, 5007: sensor, 5008: microphone, 5012: support, 5013: earphone, 5100: cleaning robot, 5101: display, 5102: camera, 5103: brush, 5104: operation button, 5120: dust, 5140: portable electronic device, 5150: portable information terminal, 5151: housing, 5152: display region, 5153: bend portion, 5200: display region, 5201: display region, 5202: display region, 5203: display region, 7101: housing, 7103: display portion, 7105: stand, 7107: display portion, 7109: operation key, 7110: remote controller, 7201: main body, 7202: housing, 7203: display portion, 7204:

keyboard, 7205: external connection port, 7206: pointing device, 7210: display portion, 7401: housing, 7402: display portion, 7403: operation button, 7404: external connection port, 7405: speaker, 7406: microphone, 9310: portable information terminal, 9311: display panel, 9313: hinge, 9315: housing, 1024B: first electrode, 1024G: first electrode, 1024R: first electrode, 1024W: first electrode, 1034B: coloring layer, 1034G: coloring layer, 1034R: coloring layer.

The invention claimed is:

1. An organometallic complex having a structure represented by General Formula (G3):

(G3)

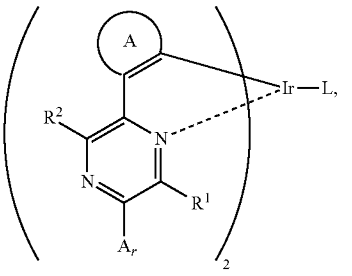

wherein A represents a substituted or unsubstituted aromatic hydrocarbon group having 6 to 25 carbon atoms, wherein $A_r$ represents an aryl group having 6 to 25 carbon atoms and at least one cyano group is bonded to the aryl group as a substituent, wherein each of $R^1$ and $R^2$ independently represents any one of hydrogen, an alkyl group having 1 to 6 carbon atoms, and an alkoxy group having 1 to 6 carbon atoms, and wherein L represents a monoanionic ligand.

2. An organometallic complex having a structure represented by General Formula (G4):

(G4)

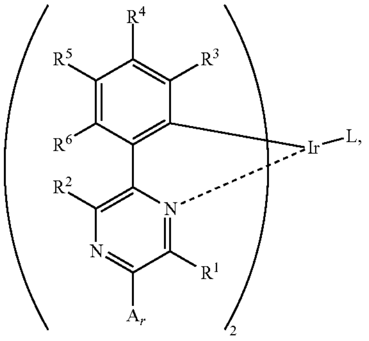

wherein $A_r$ represents an aryl group having 6 to 25 carbon atoms and at least one cyano group is bonded to the aryl group as a substituent, wherein each of $R^1$ and $R^2$ independently represents any one of hydrogen, an alkyl group having 1 to 6 carbon atoms, and an alkoxy group having 1 to 6 carbon atoms, wherein each of $R^3$ to $R^6$ independently represents any one of hydrogen, an alkyl group having 1 to 6 carbon atoms, an alkoxy group having 1 to 6 carbon atoms, a substituted or unsubstituted aryl group having 6 to 12 carbon atoms, a halogen group, and a trifluoromethyl group, and wherein L represents a monoanionic ligand.

3. The organometallic complex according to claim 1, wherein the monoanionic ligand is a monoanionic bidentate chelate ligand having a β-diketone structure, a monoanionic bidentate chelate ligand having a carboxyl group, a monoanionic bidentate chelate ligand having a phenolic hydroxyl group, a monoanionic bidentate chelate ligand in which two ligand elements are both nitrogen, or an aromatic heterocyclic bidentate ligand forming a metal-carbon bond with iridium by cyclometalation.

4. The organometallic complex according to claim 1, wherein the monoanionic ligand is any one of General Formulae (L1) to (L6):

(L1)

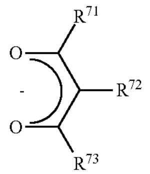

(L2)

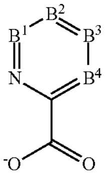

(L3)

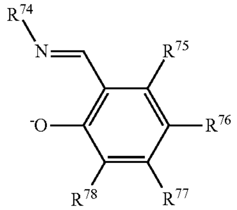

(L4)

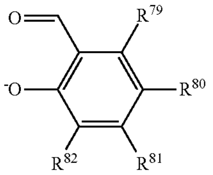

(L5)

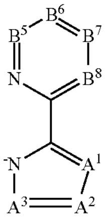

-continued (L6)

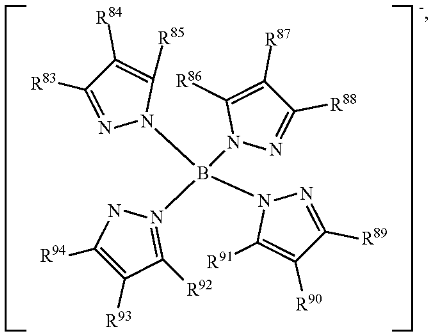

wherein each of $R^{71}$ to $R^{94}$ independently represents any one of hydrogen, a substituted or unsubstituted alkyl group having 1 to 10 carbon atoms, a halogen group, a vinyl group, a substituted or unsubstituted haloalkyl group having 1 to 10 carbon atoms, a substituted or unsubstituted alkoxy group having 1 to 10 carbon atoms, and a substituted or unsubstituted alkylthio group having 1 to 10 carbon atoms, wherein each of $A^1$ to $A^3$ independently represents nitrogen, $sp^2$ hybridized carbon bonded to hydrogen, or $sp^2$ hybridized carbon having a substituent, the substituent being any one of an alkyl group having 1 to 6 carbon atoms, a halogen group, a haloalkyl group having 1 to 6 carbon atoms, and a phenyl group, and wherein each of $B^1$ to $B^8$ independently represents nitrogen, $sp^2$ hybridized carbon bonded to hydrogen, or $sp^2$ hybridized carbon having a substituent, the substituent being any one of an alkyl group having 1 to 6 carbon atoms, a halogen group, a haloalkyl group having 1 to 6 carbon atoms, and a phenyl group.

5. The organometallic complex according to claim 2, wherein the General Formula (G4) is represented by General Formula (G5):

(G5)

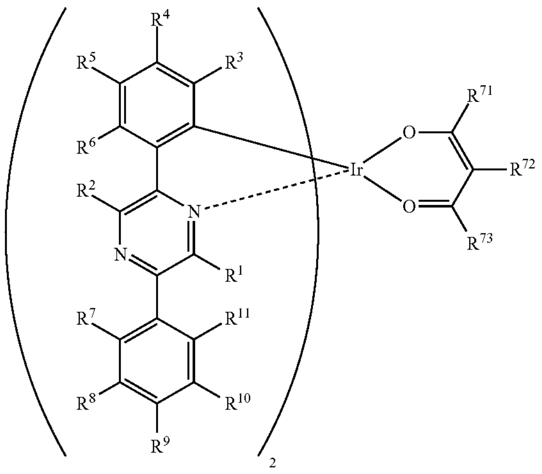

wherein each of $R^7$ to $R^{11}$ independently represents any one of hydrogen, an alkyl group having 1 to 6 carbon atoms, a substituted or unsubstituted aryl group having 6 to 13 carbon atoms, a substituted or unsubstituted heteroaryl group having 3 to 12 carbon atoms, and a cyano group, and at least one of $R^7$ to $R^{11}$ represents a cyano group, and wherein each of $R^{71}$ to $R^{73}$ independently represents any one of hydrogen, an alkyl group having 1 to 10 carbon atoms, a halogen group, a vinyl group, a haloalkyl group having 1 to 10 carbon atoms, an alkoxy group having 1 to 10 carbon atoms, and an alkylthio group having 1 to 10 carbon atoms.

6. The organometallic complex according to claim 2, wherein the General Formula (G4) is represented by General Formula (G6):

(G6)

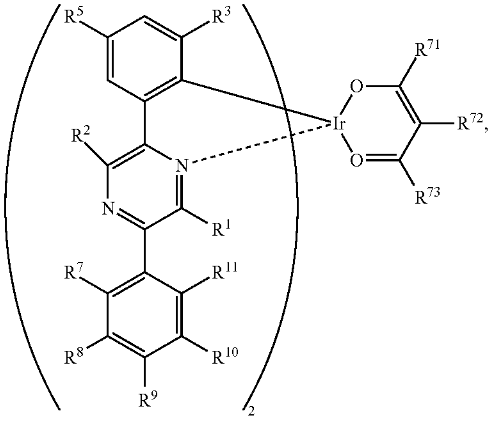

wherein each of $R^3$ and $R^5$ independently represents any one of hydrogen, an alkyl group having 1 to 6 carbon atoms, an alkoxy group having 1 to 6 carbon atoms, an aryl group having 6 to 12 carbon atoms, a halogen group, and a trifluoromethyl group, wherein each of $R^7$ to $R^{11}$ independently represents any one of hydrogen, an alkyl group having 1 to 6 carbon atoms, a substituted or unsubstituted aryl group having 6 to 13 carbon atoms, a substituted or unsubstituted heteroaryl group having 3 to 12 carbon atoms, and a cyano group, and at least one of $R^7$ to $R^{11}$ represents a cyano group, and wherein each of $R^{71}$ to $R^{73}$ independently represents any one of hydrogen, an alkyl group having 1 to 10 carbon atoms, a halogen group, a vinyl group, a haloalkyl group having 1 to 10 carbon atoms, an alkoxy group having 1 to 10 carbon atoms, and an alkylthio group having 1 to 10 carbon atoms.

7. The organometallic complex according to claim 5, wherein the General Formula (G5) is represented by General Formula (G7):

(G7)
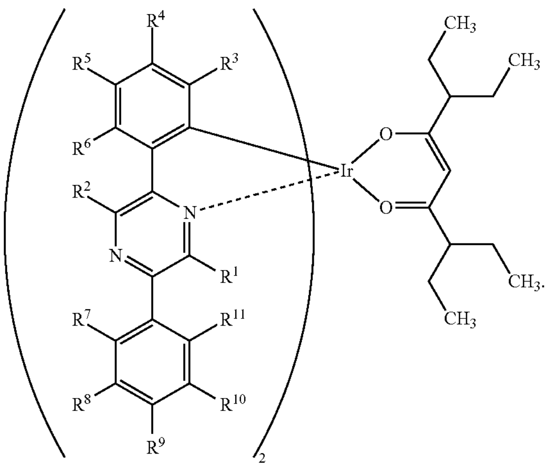
8. The organometallic complex according to claim 6, wherein the General Formula (G6) is represented by General Formula (G8):
(G8)
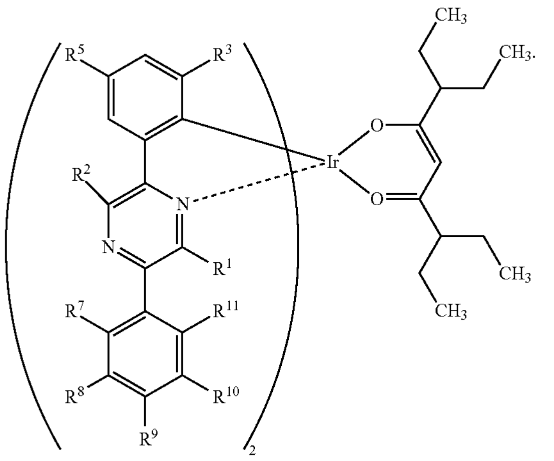
9. An organometallic complex represented by Structural Formula (100) or Structural Formula (101):
(100)
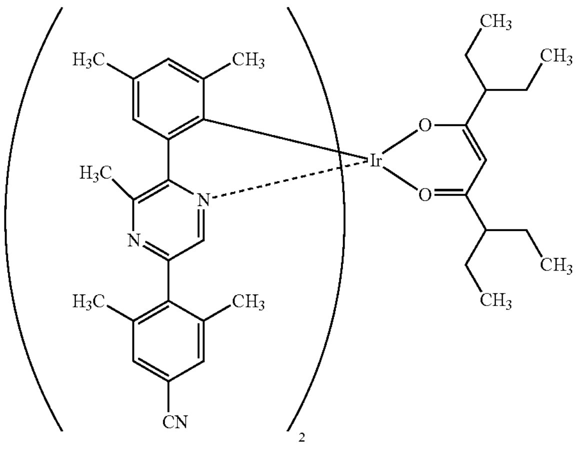
(101)
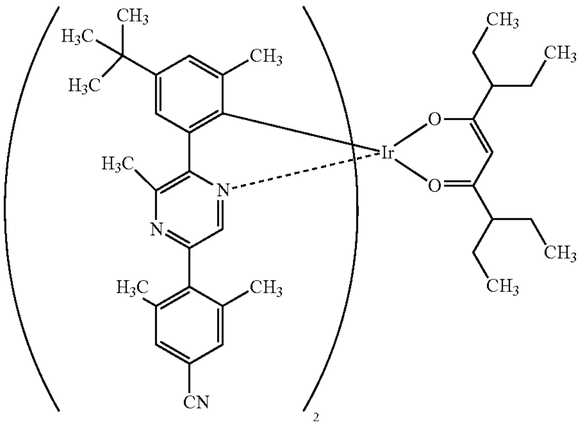
(100)
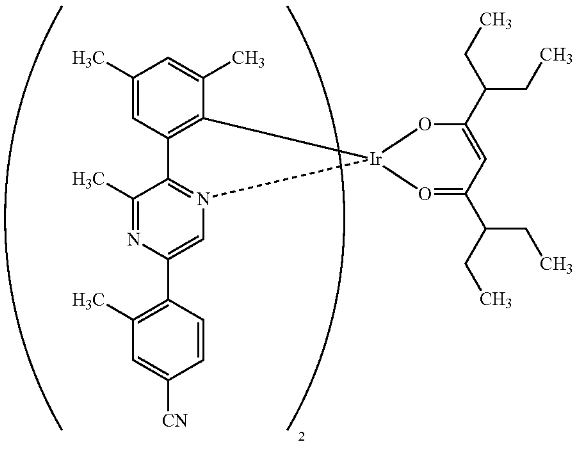
[Ir(dmmppr-mCP)$_2$(debm)]

-continued (101)

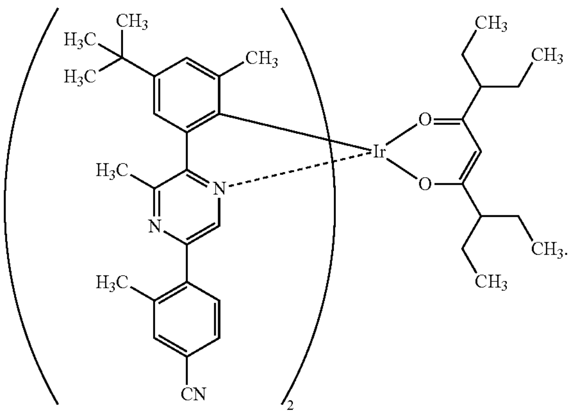

[Ir(tBummppr-mCP)$_2$(debm)]

10. The organometallic complex according to claim 2, wherein the monoanionic ligand is a monoanionic bidentate chelate ligand having a β-diketone structure, a monoanionic bidentate chelate ligand having a carboxyl group, a monoanionic bidentate chelate ligand having a phenolic hydroxyl group, a monoanionic bidentate chelate ligand in which two ligand elements are both nitrogen, or an aromatic heterocyclic bidentate ligand forming a metal-carbon bond with iridium by cyclometalation.

11. The organometallic complex according to claim 2, wherein the monoanionic ligand is any one of General Formulae (L1) to (L6):

(L1)

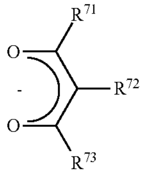

(L2)

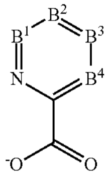

(L3)

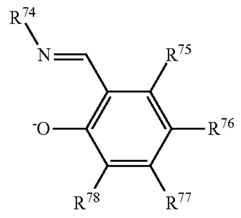

(L4)

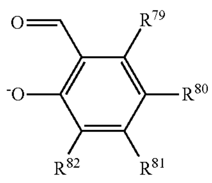

-continued (L5)

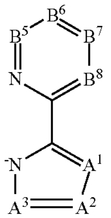

(L6)

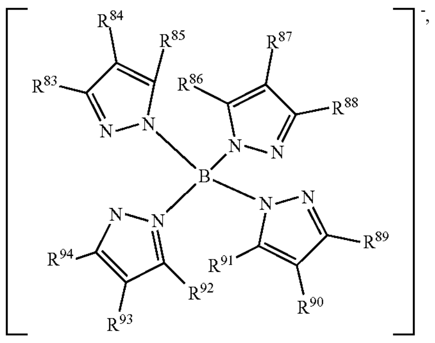

wherein each of $R^{71}$ to $R^{94}$ independently represents any one of hydrogen, a substituted or unsubstituted alkyl group having 1 to 10 carbon atoms, a halogen group, a vinyl group, a substituted or unsubstituted haloalkyl group having 1 to 10 carbon atoms, a substituted or unsubstituted alkoxy group having 1 to 10 carbon atoms, and a substituted or unsubstituted alkylthio group having 1 to 10 carbon atoms, wherein each of $A^1$ to $A^3$ independently represents nitrogen, $sp^2$ hybridized carbon bonded to hydrogen, or $sp^2$ hybridized carbon having a substituent, the substituent being any one of an alkyl group having 1 to 6 carbon atoms, a halogen group, a haloalkyl group having 1 to 6 carbon atoms, and a phenyl group, and wherein each of $B^1$ to $B^8$ independently represents nitrogen, $sp^2$ hybridized carbon bonded to hydrogen, or $sp^2$ hybridized carbon having a substituent, the substituent being any one of an alkyl group having 1 to 6 carbon atoms, a halogen group, a haloalkyl group having 1 to 6 carbon atoms, and a phenyl group.

12. A light-emitting device comprising the organometallic complex according to claim 1.

13. A light-emitting device comprising an EL layer between a pair of electrodes, wherein the EL layer comprises the organometallic complex according to claim 1.

14. A light-emitting device comprising an EL layer between a pair of electrodes, wherein the EL layer comprises a light-emitting layer, and wherein the light-emitting layer comprises the organometallic complex according to claim 1.

15. A light-emitting device comprising the organometallic complex according to claim 2.

16. A light-emitting device comprising an EL layer between a pair of electrodes, wherein the EL layer comprises the organometallic complex according to claim 2.

17. A light-emitting device comprising an EL layer between a pair of electrodes, wherein the EL layer comprises a light-emitting layer, and wherein the light-emitting layer comprises the organometallic complex according to claim 2.

* * * * *